United States Patent [19]
Yamauchi

[11] Patent Number: 5,812,445
[45] Date of Patent: Sep. 22, 1998

[54] LOW VOLTAGE, LOW POWER OPERABLE STATIC RANDOM ACCESS MEMORY DEVICE

[75] Inventor: Hiroyuki Yamauchi, Osaka, Japan

[73] Assignee: Matsushita Electric Industrial Co.,Ltd., Osaka, Japan

[21] Appl. No.: 825,063

[22] Filed: Mar. 27, 1997

Related U.S. Application Data

[62] Division of Ser. No. 684,068, Jul. 19, 1996, Pat. No. 5,680,356.

[30]    Foreign Application Priority Data

Jul. 20, 1995   [JP]   Japan .................................... 7-184058

[51] Int. Cl.$^6$ ...................................................... G11C 7/00
[52] U.S. Cl. .......................... 365/154; 365/156; 365/190
[58] Field of Search ..................................... 365/154, 156, 365/63, 52, 174, 190

[56]    References Cited

U.S. PATENT DOCUMENTS 4,779,226  10/1988  Haraszti ................................... 365/156
4,779,231  10/1988  Holzapfel et al. ....................... 365/156

*Primary Examiner*—Vu A. Le
*Attorney, Agent, or Firm*—McDermott, Will & Emery

[57]    ABSTRACT

A memory cell is formed by flip-flop connection of a load transistor pair of a first load transistor and a second load transistor and a drive transistor pair of a first drive transistor and a second drive transistor. A first switch which is controlled by a wordline and a second switch which is activated only at the time of the write operation are connected in series to a first memory node. The second switch is serially coupled between the first memory node and the first drive transistor. An electric current is injected from a sense amplifier into a bitline pair selected at the time of the read operation, to detect an impedance which varies with the signal potential at the first memory node.

29 Claims, 33 Drawing Sheets

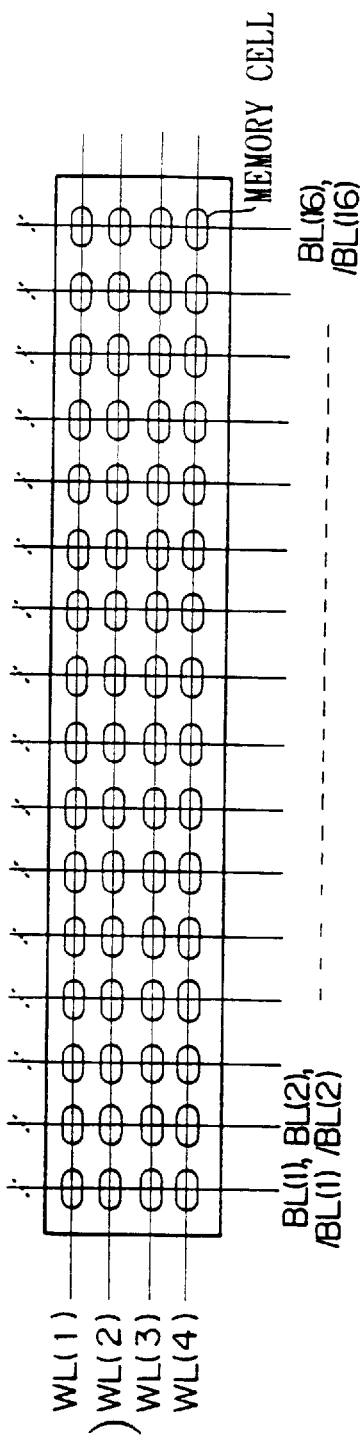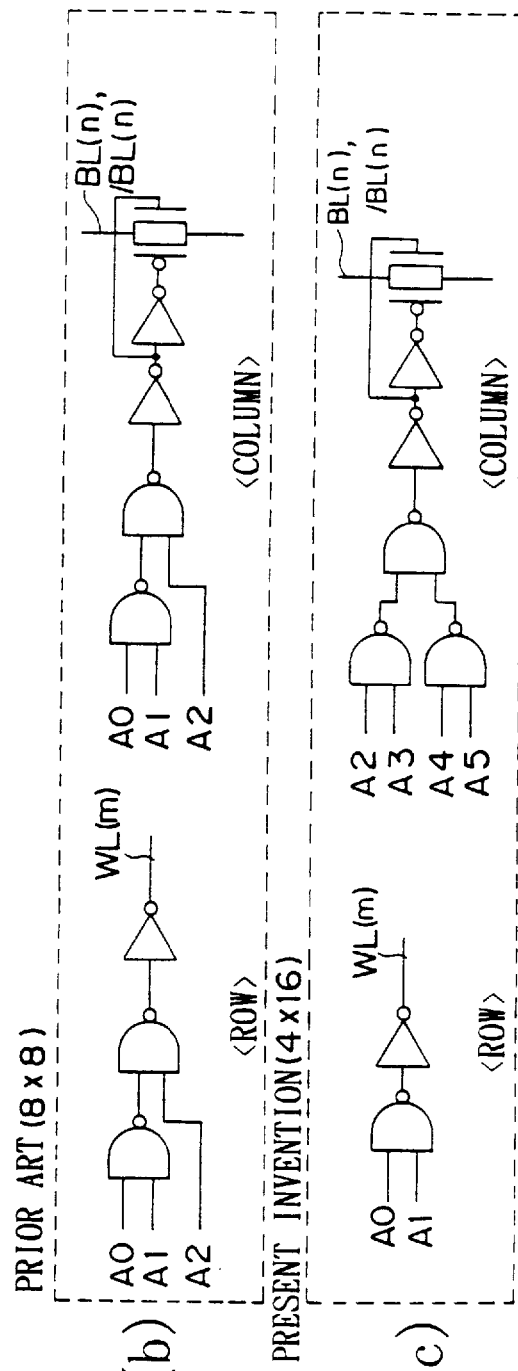
FIG. 4(a)
FIG. 4(b) PRIOR ART (8×8)
FIG. 4(c) PRESENT INVENTION (4×16)

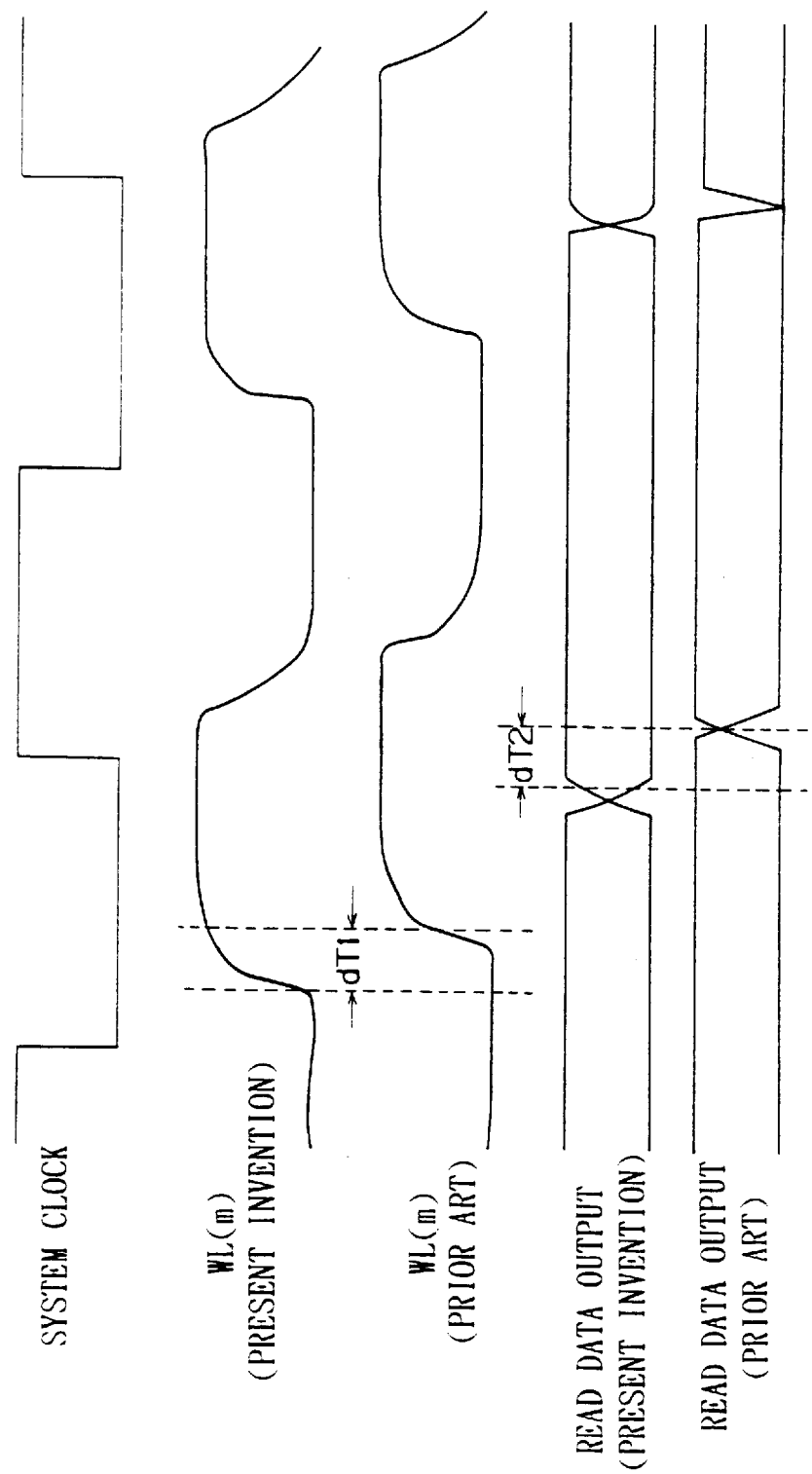

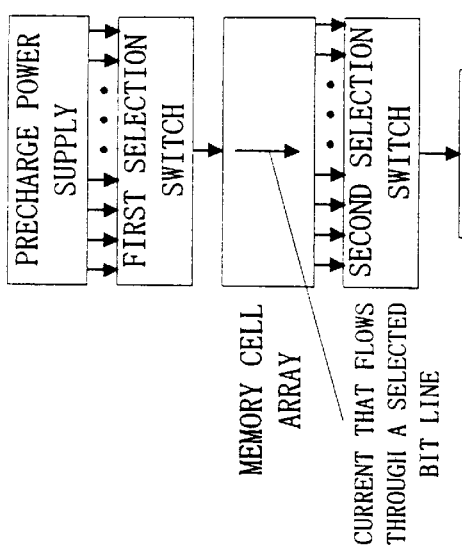
FIG. 32 (c) PRIOR ART
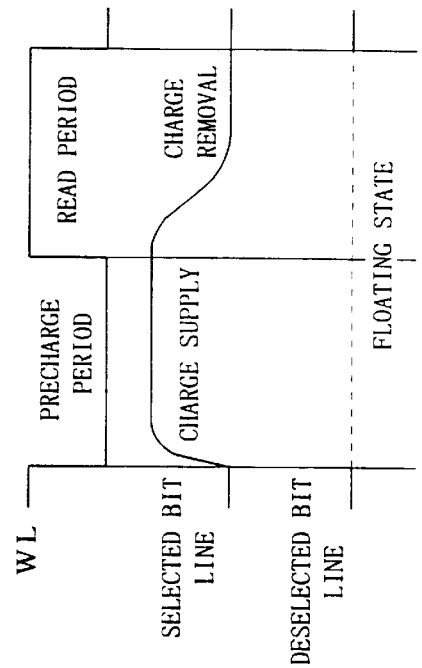
FIG. 32 (d) PRIOR ART
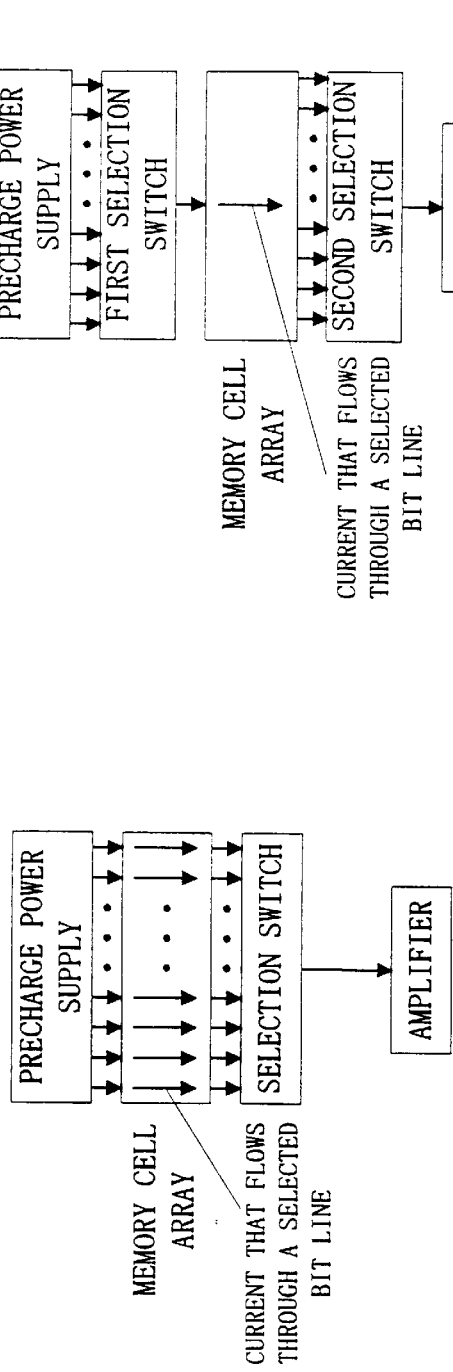
FIG. 32 (a) PRIOR ART
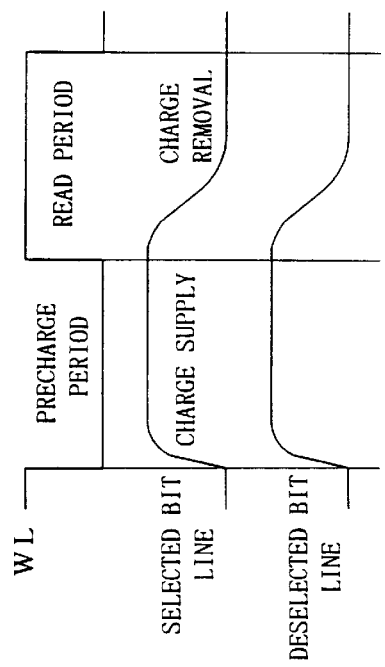
FIG. 32 (b) PRIOR ART

LOW VOLTAGE, LOW POWER OPERABLE STATIC RANDOM ACCESS MEMORY DEVICE

This is a divisional of application Ser. No. 08/684,068, filed Jul. 19, 1996, U.S. Pat. No. 5,680,356.

BACKGROUND OF THE INVENTION

This invention generally relates to semiconductor integrated circuit devices (SICD's). It pertains more specifically to a low-voltage, low-power operable SICD such as SRAM (static random access memory).

In recent years, the density of SICD has been increased and the storage capacity of SICD has been expanded. SICD (e.g., SRAM), which is capable of being driven by low voltage and capable of functioning at high speed, has been in great demand.

Referring now to FIG. 31, a commonly-used SICD is described below.

FIG. 31 is a diagram depicting a commonly-used SRAM cell. P1 is a first load transistor of a first inverter. P2 is a second load transistor of a second inverter. N1 is a first drive transistor for driving the first inverter. N2 is a second drive transistor for driving the second inverter. V1 is a first memory node for holding a signal potential of the SRAM cell. V2 is a second memory node for holding a signal potential complementary to the signal potential held by the first memory node V1. WL is a wordline for activating memory cells in a selected row of the memory cell array. BL is a bitline for controlling the reading and writing of memory cells in a selected column of the memory cell array. /BL is a complementary bitline. The complementary bitline /BL exhibits a potential complementary to that of the bitline BL in a write mode of operation. The complementary bitline /BL is identical in potential with the bitline BL in a read mode of operation, acting as a reference potential to the bitline BL. Vcc is a first power supply for driving the memory cell. Vss is a second power supply which becomes a reference potential for driving the memory cell. N3 is a first switch which enables the reading/writing operation of the first memory node V1 by the bitline BL only when the wordline WL is activated. N4 is a second switch which enables the reading/writing operation of the second memory node V2 by the complementary bitline /BL only when the wordline WL is activated. Ir is a readout current that is produced when the signal potential at the first memory node V1 is read out by the bitline BL. Id is a through current. When the signal potential at V1 is read out, N2 is activated and Id flows from Vcc to Vss. The load transistor pair P1, P2 and the drive transistor pair N1, N2 are flip-flop connected and therefore the potential at V1 and the potential at V2 are always held in reversed fashion. Vcc is set to a level of 3 V. Vss is set to a level of 0 V.

The operation of the memory cell is now illustrated. The write operation is first explained. The wordline WL is selected and its potential increases. The first and second switches N3 and N4 turn on. Here, a state, in which the potential of Vcc is held, is expressed by "1" and a state, in which the potential of Vss is held, is expressed by "0". If a "1" is written into the first memory node V1 and a "0" is written into the second memory node V2, then the bitline BL is charged to the potential of Vcc while the complementary /BL is charged to the potential of Vss. At this point, the potential at the first memory node V1 gradually approaches the potential of Vcc (i.e., the potential of the bitline BL which is charged to Vcc through the first switch N3). At the same time, the potential at the gate electrode of the second drive transistor N2, which is identical with the potential at the first memory node V1, gradually increases and, when it exceeds the threshold voltage, the second drive transistor N2 is made active. As a result, the potential at the second memory node V2 gradually approaches the potential of Vss.

The potential at the second memory node V2 approaches Vss and, when it becomes lower than the threshold voltage of the first drive transistor N1, the first drive transistor N1 turns off. The potential at the first memory node V1 finally becomes the potential of Vcc and is held.

When a "0" is written into the first memory node V1 and a "1" is written into the second memory node V2, the bitline BL is charged to the potential of Vss and the complementary bitline /BL is charged to the potential of Vcc. In this case, the potential at the second memory node V2 becomes the potential of the complementary bitline /BL (i.e., Vcc) and is held.

The read operation is now described. The wordline WL is selected and its potential is increased. The first and second switches N3 and N4 turn on. A bitline pair BL, /BL is selected and is precharged to a potential level near Vcc and, as a result, their potential is increased.

Suppose a situation in which a "0" is held at the first memory node V1 and a "1" is held at the second memory node V2. The first drive transistor N1 is activated because the potential at the second memory node V2 is high and, as a result, the readout current Ir flows from the bitline BL to Vss through the first switch N3. The potential of the bitline BL becomes lower than the initial potential of Vcc.

The second drive transistor N2 is deactivated because the potential at the first memory node V1 is low and, as a result, no readout current Ir flows through the complementary bitline /BL. Therefore, the potential of the complementary bitline /BL remains the same as the initial potential of Vcc. Data, which has been held, is read out by the detection of a potential difference between the bitline BL and the complementary bitline /BL.

In a situation in which a "1" is held at the first memory node V1 and a "0" is held at the second memory node V2, the readout current Ir flows through the complementary bitline /BL and the potential of the complementary bitline /BL becomes lower than the initial potential of Vcc. An opposite potential difference to the aforesaid potential difference is produced between BL and /BL. Data, which is a reversion of the aforesaid data, is read out.

The above-described conventional memory cell, however, presents the following two major drawbacks.

The first problem is that the through current Id occurs between Vcc and Vss in a read mode of operation. For example, suppose that the first memory node V1 holds a "0" and the second memory node V2 holds a "1". In this case, as described above, the wordline WL is made active. When the bitline BL precharged to a potential level near Vcc and the first memory node V1 retaining the potential of Vss are connected together, the potential at the first memory node V1 is increased greatly by attraction of the potential of the bitline BL with great capacitance (i.e., Vcc). As a result, the potential at the gate electrode of the second drive transistor N2 coupled to the first memory node V1 exceeds the threshold voltage, whereupon the second drive transistor N2, which has been in the state of off, now becomes active. The through current Id starts flowing. This through current Id is a factor of increasing the power consumption.

In addition, due to the flow of the through current Id, the potential of Vcc, held at the second memory node V2, drops.

This potential drop causes the potential at the gate electrode of the first drive transistor N1 coupled to the second memory node V2 to drop. The potential of the bitline BL is abruptly decreased and the read current Ir is diminished. The value of the read current Ir approaches a noise current value, therefore producing the problem that the read operation becomes unstable. This problem is a major obstacle to achieving low-voltage driving, since as Vcc is held low it becomes more and more difficult to secure noise margins.

The second problem is that after the read operation precharging is required in order to bring a potential difference, produced between BL and /BL which are coupled to all memory cells in the same row which are coupled to WL1, back to the initial state. Especially, a great number of memory cells are connected in parallel in SRAM and ROM and therefore the amount of electric power needed for precharging them is increased.

SUMMARY OF THE INVENTION

Bearing in mind the above-described problems associated with the prior art techniques, the present invention was made. The present invention provides the following advantages. Power consumption, needed for precharge processing in SRAM and ROM devices involving a great number of parallel bits, is eliminated. No through current flowing through the memory cell occurs. An improved, low-power low-voltage operable SICD can be provided by means of minor amplitude transmission and by means of reuse of electric charges.

This invention eliminates the need for electric power used in precharge processing, by means of arrangement that a bitline pair is at the ground potential. To prevent a through current, electric current for the detection of impedance is injected to a memory cell selected in read mode, and a memory node having an opposite potential to the gate electrode potential of a drive transistor for driving the memory cell and a bitline are disconnected. Additionally, the source line potential of the memory cell is held higher than the ground potential according to the write data, in write mode.

The present invention provides a semiconductor integrated circuit device which comprises:

(a) an array of memory cells in which respective data are stored and which are arranged in a matrix with rows and columns;

(b) a row decoder which selects, based on a row address, a row of memory cells of the matrix; and (c) a column circuit which selects, based on a column address, a column of memory cells of the matrix;

the column circuit comprising:

detection current injection means for injecting, in a read mode of operation of reading data from a memory cell of the memory cell array selected by the row and column addresses, a data signal potential detection current into the selected memory cell, to detect a signal potential of the data stored in the selected memory cell.

In the above-described SICD, the detection current injection means supplies, in a read mode of operation, an electric current to a selected memory cell for the detection of memory cell impedance. This enables the judgement of data of the selected memory cell according to the value of the detected memory cell impedance. Fast read operations can be achieved.

Additionally, no signal potential charge flows out of activated memory cells in a row during the read period. This eliminates the need for precharge processing thereby reducing the amount of power used.

It is preferred that in the above-described SICD the detection current injection means is formed by a sense amplifier for injecting, in a read mode of operation of reading data from a selected memory cell of the memory cell array, an impedance detection current into the selected memory cell, to detect an impedance. Such arrangement ensures that the signal potential of the selected memory cell is detected as an impedance difference and that the read operation is executed at high speed.

It is preferred that in the above-described SICD the sense amplifier removes impedance detection current injected into a selected memory cell after the selected memory cell is read. The current, injected into the selected memory cell, is removed, which makes it possible to bring the potential of the memory cell back to the pre-read state. This guarantees the next read operation.

It is preferred in the above-described SICD that:

(a) the sense amplifier is formed by establishing a flip-flop connection between a first inverter circuit and a second inverter circuit;

the first inverter circuit comprising:

a first transistor of a first transistor pair of a first conductivity type and a first transistor of a second transistor pair of a second conductivity type;

the second inverter circuit comprising:

a second transistor of the first transistor pair of the first conductivity type and a second transistor of the second transistor pair of the second conductivity type;

(b) source electrodes of the first transistor pair of the first conductivity type which form a source electrode pair acts as a pair of input terminals for receiving the data from the selected memory cell;

(c) a common contact point of source electrodes of the second transistor pair of the second conductivity type which form a source electrode pair is coupled to a power supply through a third transistor of the second conductivity type which is controlled by a given activation signal;

(d) output terminals of the first and second inverter circuits which form an output terminal pair are connected, through a third and a fourth transistor of the first conductivity type, to the power supply; and (e) in the read mode, the third transistor of the second conductivity type is not activated simultaneously with the third and fourth transistors of the first conductivity type.

As a result of such arrangement, a potential difference for the detection of a difference in impedance between the input terminals is produced during the period that the sense amplifier activation signal is in the on state. The flip-flop circuit is activated to amplify a detected potential difference and injected charges can be discharged during the period that the activation signal is in the off state. By activating the third transistor of the second conductivity type, it becomes possible to inject an electric current for impedance detection into a selected memory cell. Additionally, by activating both the third and fourth transistors of the first conductivity type, it becomes possible to convert a detected impedance difference to a potential difference and to remove the injected current.

It is preferred in the above-described SICD that:

(a) the memory cell array has a first and a second control line for controlling memory cells in the columns of the memory cell array; and (b) the column circuit comprises:
   a bitline control circuit for applying, in a read mode of operation of reading data from a memory cell of the memory cells in the columns of the memory cell array, a first potential to the first control line and to the second control line, and for applying, in a write mode of operation of writing data into a memory cell of the memory cells in the columns of the memory cell array, either the first potential or a second potential to the first control line and applying a third potential to the second control line.

As a result of such arrangement, in a read mode of operation of reading data from a selected memory cell, the first and second control lines can be at the ground potential because the first potential is applied to the first and second control lines. Additionally, in a write mode of operation of writing data into a selected memory cell, either a low data potential or a high data potential can be applied to the first control line while at the same time a control potential for write control can be applied to the second control line because of the provision of the bitline control circuit capable of applying the third potential to the second control line. As a result, since during the write period either the high data potential or low data potential can be applied to the first control line and the write control potential can be applied to the second control line, this ensures that a signal potential is written into the memory node.

It is preferred in the above-described SICD wherein the memory cell is formed by establishing a flip-flop connection among a first load transistor coupled to a first power supply, a second load transistor which forms a pair with the first load transistor, a first drive transistor coupled to a second power supply and a second drive transistor which forms a pair with the first drive transistor that:

the memory cell further includes:
   (a) a first memory node which is coupled to the first load transistor and which holds a signal potential;
   (b) a second memory node which is coupled to the second load transistor and which holds a signal potential in complementary relationship with the signal potential held by the first memory node;
   (c) a first switch transistor which is serially coupled between the first memory node and the first control line and which is controlled by a third control line wherein one of source/drain electrodes of the first switch transistor is coupled to the first control line; and
   (d) a second switch transistor which is controlled by the second control line wherein one of source/drain electrodes of the second switch transistor is coupled to the first memory node and the other of the source/drain electrodes of the second switch transistor is coupled to the other of the source/drain electrodes of the first switch transistor wherein the second switch transistor is serially coupled between the first memory node and the first drive transistor.

Since the second switch transistor is serially coupled between the first memory node and the first drive transistor, this establishes disconnection between the first memory node and the first control line. Such arrangement not only permits the precharge potential to be at the ground potential but also prevents the potential at the first memory node from increasing even when the first control line is activated in a read mode of operation. As a result, no current flows through the memory cell thereby accomplishing low-voltage driving.

It is preferred in the above-described SICD that the second switch transistor is lower in threshold voltage than the first drive transistor, the second drive transistor and the first switch transistor. This arrangement eliminates the need for the provision of higher potential in relation to the third potential that is applied to the second control line thereby resulting in further reducing the power consumption.

It is preferred in the above-described SICD that the second load transistor is smaller in size than the first load transistor and the second drive transistor. This -arrangement increases the operation rate of the second load transistor therefore speeding up the writing of high data into the first memory node. The access time can be reduced accordingly.

It is preferred in the above-described SICD that the memory cell is coupled, in parallel with the second drive transistor, between the second memory node and the second power supply and that the memory cell further includes a third switch transistor which is controlled by the potential at a contact point of the first switch transistor and the second switch transistor. This arrangement causes the third switch transistor to start functioning earlier than the second drive transistor which is controlled by the first memory node. The second memory node promptly approaches the reference potential thereby reducing the access time.

It is preferred in the above-described SICD that the first power supply is voltage-reduced by means of a voltage reduction circuit. As a result of such an arrangement, the potential that is applied to memory cells becomes lower than the first power supply potential (i.e., the normal power supply potential) and therefore the power used by memory cell can be reduced. Additionally, the source line potential is relatively increased and the signal potential latch capability of the drive transistors drops. This increases the write operation rate.

It is preferred in the above-described SICD that the voltage reduction circuit is a memory cell made up of transistors in conductivity-type opposition to corresponding transistors forming the memory cell of the memory cell array. As a result of such arrangement, memory cells of opposite conductivity types are connected in series. Application of the first power supply potential (i.e., the normal power supply potential) makes it possible to drive these serially-coupled memory cells with stability. Power consumption per memory cell can be reduced.

It is preferred in the above-described SICD that the number of memory cells of the memory cell array coupled to the third control line is greater than the number of memory cells of the memory cell array coupled to the first and second control lines. As a result of such arrangement, the number of memory cells that are coupled to the third control line is increased and the number of memory cells that are coupled to the first and second control lines (the control line pair) is decreased. The number of third control lines is reduced thereby speeding up the decoding of row addresses. Fast operations can be achieved.

It is preferred in the above-described SICD that the memory cell is formed by establishing a flip-flop connection among a first load transistor coupled to a first power supply, a second load transistor which forms a pair with the first load transistor, a first drive transistor coupled to a second power supply and a second drive transistor which forms a pair with the first drive transistor, the memory cell further including:
   (a) a first memory node which is coupled to the first load transistor and which holds a signal potential;
   (b) a second memory node which is coupled to the second load transistor and which holds a signal potential in complementary relationship with the signal potential held by the first memory node;

(c) a first switch transistor which is serially coupled between the second memory node and the first control line and which is controlled by a third control line wherein one of source/drain electrodes of the first switch transistor is coupled to the first control line;

(d) a second switch transistor which is controlled by the second control line wherein one of source/drain electrodes of the second switch transistor is coupled to the second memory node and the other of the source/drain electrodes of the second switch transistor is coupled to the other of the source/drain electrodes of the first switch transistor; and (e) a third switch transistor which is serially coupled between the first switch transistor and the second power supply and which is controlled by the first memory node.

As a result of such arrangement, the first memory node is disconnected from the first control line so that the precharge potential can be at the ground potential. Additionally, even when the first control line is made active in a read mode of operation, the potential at the first memory node will not increase. No current flows through the memory cell thereby accomplishing lower-voltage driving.

In addition to the above, the switch transistors are not connected together in the inverter thereby increasing the noise margin by an amount saved by such arrangement.

It is preferred in the above-described SICD that the first load transistor is smaller in size than the second load transistor. This arrangement increases the operation rate of the first load transistor therefore speeding up the writing of high data into the second memory node. The access time can be reduced accordingly.

It is preferred in the above-described SICD that the memory cell is coupled, in parallel with the first drive transistor, between the first memory node and the second power supply and that the memory cell further includes a fourth switch transistor which is controlled by the potential at a contact point of the first switch transistor and the second switch transistor. This arrangement causes the fourth switch transistor to start functioning earlier than the first drive transistor which is controlled by the second memory node. As a result, the fourth switch transistor that is coupled to the first memory node which is a non-target node in write mode starts functioning earlier than the first drive transistor and the first memory node promptly approaches the reference potential. The access time can be reduced.

It is preferred in the above-described SICD that the first power supply is voltage-reduced by means of a voltage reduction circuit. As a result of such an arrangement, the potential that is applied to the memory cell becomes lower than the first power supply potential (i.e., the normal power supply potential) and therefore the power used by memory cell can be reduced. Additionally, the source line potential is relatively increased and the signal potential latch capability of the drive transistors drops. This increases the write operation rate.

It is preferred in the above-described SICD that the voltage reduction circuit is a memory cell made up of transistors in conductivity-type opposition to corresponding transistors forming the memory cell of the memory cell array. As a result of such arrangement, memory cells of opposite conductivity types are connected in series. Application of the first power supply potential (i.e., the normal power supply potential) makes it possible to drive these serially-coupled memory cells with stability. Power consumption per memory cell can be reduced.

It is preferred in the above-described SICD that the number of memory cells of the memory cell array coupled to the third control line is greater than the number of memory cells of the memory cell array coupled to the first and second control lines. As a result of such arrangement, the number of memory cells that are coupled to the third control line is increased and the number of memory cells that are coupled to the first and second control lines (the control line pair) is decreased. The number of third control lines is reduced thereby speeding up the decoding of row addresses. Fast operations can be achieved.

The present invention provides a semiconductor integrated circuit device (SICD) comprising:

(a) an array of memory cells arranged in a matrix with rows and columns;

the memory cell including a transistor pair of a first and a second transistor with respective gate electrodes and respective drain electrode cross-coupled;

(b) source potential variation means for changing the source electrode potential of one of the transistor pair that is in a higher ON state in relation to the other of the transistor pair, to decrease the absolute value of the gate-source voltage difference of the transistor in the higher ON state.

In accordance with the above-described SICD, one of the transistor pair, which is in a higher ON state in relation to the other of the transistor pair, enters a higher OFF state in relation to the other transistor. As a result, the signal potential latch capability drops and the balance in signal potential between the memory nodes is broken quickly. Fast write operations can be executed.

It is preferred in the above-described SICD that the transistor pair share a source electrode. Because of this arrangement, the potential at the source electrode can be varied easily.

It is preferred in the above-described SICD that the transistor pair have separate source electrodes. Because of this arrangement, the signal potential latch capability can be reduced depending upon the write data.

It is preferred in the above-described SICD that the source potential variation means changes the source electrode potential of one of the transistor pair that is in a higher OFF state in relation to the other of the transistor pair, to increase the absolute value of the gate-source voltage difference of the transistor in the higher OFF state. Because of this arrangement, one of the transistor pair, which is in a higher OFF state in relation to the other of the transistor pair, enters a higher ON state in relation to the other transistor. As a result, the signal potential latch capability drops and the balance in signal potential between the memory nodes is broken quickly. Fast write operations can be executed.

It is preferred in the above-described SICD that:

(a) the first transistor of the memory cell is a first drive transistor with a drain electrode coupled to a first memory node and the second transistor of the memory cell is a second drive transistor with a drain electrode coupled to a second memory node in complementary relationship with the first memory node;

(b) the memory cell comprises a first load transistor and a second load transistor in which gate electrodes and source electrodes of the first and second transistors are cross-coupled;

one of source/drain electrodes of the first load transistor being coupled to a first power supply;

the other of the source/drain electrodes of the first load transistor being coupled to the first memory node;

one of source/drain electrodes of the second load transistor being couple to the first power supply;

the other of the source/drain electrodes of the second load transistor being coupled to the second memory node;

(c) the source potential variation means is a ground line control circuit;

the source potential variation means applying a ground line control potential to a third power supply and applying the potential of the second power supply to a fourth power supply when writing an opposite signal potential to that of the source/drain electrode of the first drive transistor into the first memory node;

the source potential variation means applying the potential of the second power supply to the third power supply and applying the ground line control potential to the fourth power supply when writing a signal potential identical with that of the source/drain electrode of the first drive transistor into the first memory node.

The source potential variation means is formed by a ground line control circuit. At the time of writing into the first memory node a signal potential opposite to that of the source/drain electrode of the first drive transistor, the ground line control line potential is applied to the third power supply and the second power supply potential is applied to the fourth power supply. On the other hand, at the time of writing into the first memory node a signal potential identical with that of the source/drain electrode of the first drive transistor, the second power supply potential is applied to the third power supply and the ground line control potential is applied to the fourth power supply. This arrangement ensures that the signal potential latch capability of the first and second memory nodes is decreased.

It is preferred in the above-described SICD that:

(a) the memory cell array has a first control line and a second control line for controlling memory cells in the columns of the memory cell array;

(b) a first potential is applied to the first control line and to the second control line in a read mode of operation of reading data from a selected memory cell of the matrix; and (c) a bitline control circuit is provided which applies either the first potential or a second potential to the first control line, and applying a third potential to the second control line in a write mode of operation of writing data into a selected memory cell of the memory cell array.

The memory cell array has a first control line and a second control line for controlling memory cells in the columns and the first potential is applied to the first control line and to the second control line in a read mode of operation of reading data from a selected memory cell. As a result of such arrangement, it becomes possible that the first and second control lines are at the ground potential. Because the bitline control circuit is provided which applies, in a write mode of operation, either the first potential or the second potential to the first control line and applies the third potential to the second control line. As a result of such arrangement, the low data potential or high data potential can be applied to the first control line and the write control potential for write control can be applied to the second control line. This makes it possible that during the write period either the high data potential or low data potential can be applied to the first control line and the write control potential can be applied to the second control line. It is ensured that a signal potential is written into the memory node.

It is preferred in the above-described SICD that the memory cell comprises:

(a) a first switch transistor which is serially coupled between the first memory node and the first control line and which is controlled by a third control line wherein one of source/drain electrodes of the first switch transistor is coupled to the first control line; and (b) a second switch transistor which is controlled by the second control line in which one of source/drain electrodes of the second switch transistor is coupled to the first memory node while the other of the source/drain electrodes of the second switch transistor is coupled to the other of the source/drain electrodes of the first switch transistor;

wherein:

the second switch transistor is serially coupled between the first memory node and the first drive transistor.

As a result of such arrangement, the second switch transistor is serially coupled between the first memory node and the first drive transistor and the first memory node is separated from the first control line. Therefore the precharge potential can be at the ground potential. Even if the first control line is made active in a read mode of operation, the potential at the first memory node will not increase. No current flows through the memory cell thereby achieving low-voltage driving.

It is preferred in the above-described SICD that two adjacent memory cells of the memory cell array are connected in common to the third and fourth power supplies. As a result of such arrangement, the adjacent memory cells share the third and fourth power supply lines and, as a result, the number of power supply lines can be reduced. Area for elements on the semiconductor substrate is not sacrificed by power supply lines.

It is preferred in the above-described SICD that the second switch transistor is lower in threshold voltage than the first drive transistor, the second drive transistor and the first switch transistor. This eliminates the need for the provision of potential that is higher than the third potential that is applied to the second control line. The power consumption can further be reduced.

It is preferred in the above-described SICD that the second load transistor is smaller in size than the first load transistor and the second drive transistor. This arrangement increases the operation rate of the second load transistor therefore speeding up the writing of high data into the first memory node. The access time can be reduced accordingly.

It is preferred in the above-described SICD that the second control line is parallel to the third control line and that a power supply line coupled to the fourth power supply and the first control line form a bitline pair of the memory cell for decoding a column address. As a result of such arrangement, for the case of a memory cell array in which the number of memory cells in the columns of the memory cell array is greater than the number of memory cells in the rows of the memory cell array, the number of memory cells coupled to the second control line is reduced. This accordingly reduces the capacitance of the second control line thereby cutting down the amount of electric power used in the write operation.

In addition to the above, a target memory cell to which information is written is limited to a memory cell located at a point where the first and second control lines intersect. This eliminates writing errors.

It is preferred in the above-described SICD that the second control line is shared among a plurality of memory cells in the same column of the memory cell array. This arrangement contributes to reducing the number of second control lines and area for elements on the semiconductor substrate will not be sacrificed by the second control line.

It is preferred in the above-described SICD that the memory cell is coupled, in parallel with the second drive transistor, between the second memory node and the fourth power supply and that the memory cell further includes a third switch transistor which is controlled by the potential at a contact point of the first switch transistor and the second switch transistor. As a result of such arrangement, the third switch transistor coupled to the second memory node that is not subjected to write processing starts functioning earlier than the second drive transistor coupled to the second memory node, whereupon the second memory node promptly approaches the reference potential. The access time can be shortened.

It is preferred in the above-described SICD that the first power supply is voltage-reduced by means of a voltage reduction circuit. As a result of such an arrangement, the potential that is applied to the memory cell becomes lower than the first power supply potential (i.e., the normal power supply potential) and therefore the power used by memory cells can be reduced. Additionally, the source line potential is relatively increased and the signal potential latch capability of the drive transistors drops. This increases the write operation rate.

It is preferred in the above-described SICD that the voltage reduction circuit is a memory cell made up of transistors in conductivity-type opposition to corresponding transistors forming the memory cell of the memory cell array. As a result of such arrangement, memory cells of opposite conductivity types are connected in series. Application of the first power supply potential (i.e., the normal power supply potential) makes it possible to drive these serially-coupled memory cells with stability. Power consumption per memory cell can be reduced.

It is preferred in the above-described SICD that the number of memory cells of the memory cell array coupled to the third control line is greater than the number of memory cells of the memory cell array coupled to the first and second control lines. As a result of such arrangement, the number of memory cells that are coupled to the third control line is increased and the number of memory cells that are coupled to the first and second control lines (the control line pair) is decreased. The number of third control lines is reduced thereby speeding up the decoding of row addresses. Fast operations can be achieved.

It is preferred in the above-described SICD that the memory cell comprises:

(a) a first switch transistor which is serially coupled between the second memory node and the first control line and which is controlled by a third control line wherein one of source/drain electrodes of the first switch transistor is coupled to the first control line;

(b) a second switch transistor which is controlled by the second control line in which one of source/drain electrodes of the second switch transistor is coupled to the second memory node while the other of the source/drain electrodes of the second switch transistor is coupled to the other of the source/drain electrodes of the first switch transistor; and (c) a third switch transistor which is serially coupled between the first switch transistor and the third power supply and which is controlled by the first memory node.

As a result of such arrangement, the first memory node is disconnected from the first control line so that the precharge potential can be at the ground potential. Additionally, even when the first control line is made active in a read mode of operation, the potential at the first memory node will not increase. No current flows through the memory cell thereby accomplishing lower-voltage driving.

In addition to the above, the switch transistors are not connected together in the inverter thereby increasing the noise margin by an amount saved by such arrangement.

It is preferred in the above-described SICD that two adjacent memory cells of the memory cell array are connected in common to the third and fourth power supplies. As a result of such arrangement, the adjacent memory cells share the third and fourth power supply lines and, as a result, the number of power supply lines can be reduced. Area for elements on the semiconductor substrate is not sacrificed by power supply lines.

It is preferred in the above-described SICD that the first load transistor is smaller in size than the second load transistor. This arrangement increases the operation rate of the first load transistor therefore speeding up the writing of high data into the second memory node. The access time can be reduced accordingly.

It is preferred in the above-described SICD that the second control line is parallel to the third control line and that a power supply line coupled to the fourth power supply and the first control line form a bitline pair of the memory cell for decoding a column address. The second control line, which becomes a write control line, is arranged in parallel with the third control line. As a result of such arrangement, for the case of a memory cell array in which the number of memory cells in the columns of the memory cell array is greater than the number of memory cells in the rows of the memory cell array, the number of memory cells coupled to the second control line is reduced. This accordingly reduces the capacitance of the second control line thereby cutting down the amount of electric power used in the write operation.

In addition to the above, a target memory cell to which information is written is limited to a memory cell located at a point where the first and second control lines intersect. This eliminates writing errors.

It is preferred in the above-described SICD that the second control line is shared among a plurality of memory cells in the same column of the memory cell array. This arrangement contributes to reducing the number of second control lines and area for elements on the semiconductor substrate will not be sacrificed by the second control line.

It is preferred in the above-described SICD that the memory cell is coupled, in parallel with the first drive transistor, between the first memory node and the third power supply and that the memory cell further includes a fourth switch transistor which is controlled by the potential at a contact point of the first switch transistor and the second switch transistor.

As a result of such arrangement, the fourth switch transistor starts functioning earlier than the first drive transistor which is controlled by the second memory node. The fourth switch transistor, coupled to the first memory node that is not subjected to write processing, starts functioning earlier than the first drive transistor coupled to the first memory node. Therefore, the first memory node promptly approaches the reference potential. The access time is reduced accordingly.

It is preferred in the above-described SICD that the first power supply is voltage-reduced by means of a voltage reduction circuit. As a result of such an arrangement, the potential that is applied to the memory cell becomes lower than the first power supply potential (i.e., the normal power supply potential) and therefore the power used by memory cell can be reduced. Additionally, the source line potential is relatively increased and the signal potential latch capability of the drive transistors drops. This increases the write operation rate.

It is preferred in the above-described SICD that the voltage reduction circuit is a memory cell made up of transistors in conductivity-type opposition to corresponding transistors forming the memory cell of the memory cell array. As a result of such arrangement, memory cells of opposite conductivity types are connected in series. Application of the first power supply potential (i.e., the normal power supply potential) makes it possible to drive these serially-coupled memory cells with stability. Power consumption per memory cell can be reduced.

It is preferred in the above-described SICD that the number of memory cells of the memory cell array coupled to the third control line is greater than the number of memory cells of the memory cell array coupled to the first and second control lines. As a result of such arrangement, the number of memory cells that are coupled to the third control line is increased and the number of memory cells that are coupled to the first and second control lines (the control line pair) is decreased. The number of third control lines is reduced thereby speeding up the decoding of row addresses. Fast operations can be achieved.

It is preferred in the above-described SICD that:
(a) the memory cell array has a first and a second control line for the control of memory cells in the columns of the matrix, and a third control line for the control of memory cells in the rows of the matrix;
(b) the first transistor of the memory cell is a first drive transistor with a drain electrode coupled to a first memory node and the second transistor of the memory cell is a second drive transistor with a drain electrode coupled to a second memory node in complementary relationship with the first memory node;
(c) the memory cell comprises:
  (i) a first load transistor and a second load transistor in which gate electrodes and source electrodes of the first and second transistors are cross-coupled;
  one of source/drain electrodes of the first load transistor being coupled to a first power supply;
  the other of the source/drain electrodes of the first load transistor being coupled to the first memory node;
  one of source/drain electrodes of the second load transistor being couple to the first power supply;
  the other of the source/drain electrodes of the second load transistor being coupled to the second memory node;
  (ii) a first switch transistor which is serially coupled between the first memory node and the first control line and which is controlled by a third control line wherein one of source/drain electrodes of the first switch transistor is coupled to the first control line;
  (iii) a second switch transistor which is controlled by the second control line in which one of source/drain electrodes of the second switch transistor is coupled to the other of the source/drain electrodes of the first switch transistor;
  (iv) a third switch transistor which is serially coupled between the second memory node and the second control line and which is controlled by the first memory node;
  (v) a fourth switch transistor which is controlled by the first control line;
  one of source/drain electrodes of the fourth switch transistor being coupled to one of source/drain electrodes of the third switch transistor;
  the other of the source/drain electrodes of the fourth switch transistor being coupled to the second control line;

(d) the second switch transistor is serially coupled between the first memory node and the first drive transistor; and
(e) the third switch transistor is serially coupled between the second memory node and the second drive transistor.

As a result of such arrangement, the first memory node is disconnected from the first control line so that the precharge potential can be at the ground potential. Additionally, even when the first control line is made active in a read mode of operation, the potential at the first memory node will not increase. No current flows through the memory cell thereby accomplishing lower-voltage driving.

It is preferred in the above-described SICD that:
the memory cell array has:
first memory cells; and
second memory cells;
wherein:
  the first memory cell and the second memory cell are connected in series;
  the second memory cell is made up of transistors opposite in conductivity type to corresponding transistors forming the first memory cell;
  both the first memory cell and the second memory cell are charged to ½ of the potential of the first power supply.

As a result of such arrangement, memory cells of opposite conductivity types are connected in series. Application of the first power supply potential (i.e., the normal power supply potential) makes it possible to drive these serially-coupled memory cells with stability. Power consumption per memory cell can be reduced.

Additionally, it is designed such that the reference potential is approximately ½ the normal potential. As a result, when the reference potential, which becomes low data, is written into the first memory node, ground potential, which is lower than the reference potential, is applied to the first control line of a memory cell of the first conductivity type while, on the other hand, power supply potential, which is higher than the reference potential, is applied to the first control line of a memory cell of the second conductivity type. This reduces the signal potential latch capability of the first or second memory node, whereupon writing operations are completed quickly and the access time is shortened.

It is preferred in the above-described SICD that the absolute values of the threshold voltage of the first and fourth switch transistors and the first and second drive transistors are lower than the absolute values of the threshold voltage of the first and second load transistors and the second and third switch transistors.

As a result of such arrangement, the operation rate of the first drive transistor, the first switch transistor, the second drive transistor and the fourth switch transistor is increased. In addition to this, it is possible to control stand-by current produced during a period that neither write operation nor read operation is executed. Faster operations can be executed and power consumption is further improved.

It is preferred in the above-described SICD that:
(a) the first, second and third control lines of the memory cell are control lines dedicated to read operation;
(b) the memory cell array has:
  (i) a fourth and a fifth control lines dedicated to write operation for memory cells in the columns of the memory cell array, and a sixth control line dedicated to write operation for memory cells in the rows of the memory cell array;

(ii) a fifth switch transistor which is controlled by the sixth control line;
one of source/drain electrodes of the fifth switch transistor being coupled to the first memory node;
the other of the source/drain electrodes of the fifth switch transistor being coupled to the fourth control line;
(iii) a sixth switch transistor which is controlled by the sixth control line;
one of source/drain electrodes of the sixth switch transistor being coupled to the second memory node;
the other of the source/drain electrodes of the sixth switch transistor being coupled to the fifth control line;
(c) the absolute values of the threshold voltage of the first, and fourth to sixth switch transistors and the first and second drive transistors are lower than the absolute values of the threshold voltage of the first and second load transistors and the second and third switch transistors.

In accordance with such arrangement, in addition to the first to third control lines dedicated to the read operation, (a) the fourth and fifth control lines are provides which dedicate to the write operation with respect to memory cells in the columns of the memory cell array, (b) the six control line is provided which dedicates to the write operation with respect to memory cells in the rows of the memory cell array, (c) the fifth switch transistor is provided which is coupled to the first memory node and (d) the sixth switch transistor is provided which is coupled to the second memory node. This makes it possible to simultaneously execute read and write operations.

Additionally, the operation rate of the first drive transistor, the first switch transistor, the second drive transistor and the fourth switch transistor is increased at the time of the read operation. On the other hand, the operation rate of the fifth and sixth switch transistors is increased at the time of the write operation. The absolute values of the threshold voltage of the first and second load transistors and the second and third switch transistors are greater than the absolute values of the threshold voltage of the other transistors, thereby making it possible to control stand-by current produced during a period that neither write operation nor read operation is executed. Faster operations can be executed and power consumption is further improved.

BRIEF DESCRIPTION OF THE DRAWINGS

FIG. 4(a) is a schematic of a memory cell array in accordance with the sixth modification of the first embodiment (the fifth modification of the second embodiment, the ninth modification of the third embodiment, the eighth modification of the fourth embodiment) of the present invention, FIG. 4(b) shows a circuit diagram of an array of gates for decoding wordlines and bitlines of a conventional technique and FIG. 4(c) shows a circuit diagram of an array of gates for decoding wordlines and bitlines of the present invention.

FIG. 5 is a timing chart at the time of reading data from a memory cell array in accordance with the sixth modification of the first embodiment (the fifth modification of the second embodiment, the ninth modification of the third embodiment, the eighth modification of the fourth embodiment) of the present invention.

FIG. 23 is a schematic showing the flow of electric current in a read mode of operation in an SRAM SICD according to the present invention.

FIG. 24 is a schematic of the potential of a source line of a cross-couple transistor in a write mode of operation in an SRAM SICD of the present invention.

FIG. 32 is a schematic depicting a current flow in a read mode of operation in a commonly-used SRAM device, FIG. 32(a) is a schematic of a first commonly-used SRAM device, FIG. 32(b) is a timing chart of the operation of the FIG. 32(a) SRAM device, FIG. 32(c) is a schematic of a second commonly-used SRAM device and FIG. 32(d) is a timing chart of the operation of the FIG. 32(c) SRAM device.

DETAILED DESCRIPTION OF THE INVENTION

The basic concept of read/write operation of an SICD (semiconductor integrated circuit device) of this invention is explained with reference to the accompanying drawing figures.

The basic concept of the read operation is first described.

FIG. 32 is a diagram schematically showing a flow of current in a read mode of operation in a commonly-used SRAM device. In a conventional SRAM device shown in FIG. 32(a), (A) electric charges are supplied to all bitlines of the memory cell array from a precharge power supply during the precharge period shown in the FIG. 32(b) timing chart, regardless of whether they are selected or selected, (B) all the bitlines are discharged during the read operation, and (C) only electric charges of a bitline selected by a selection switch according to a column address from outside the SRAM device, is amplified by an amplifier. In this SRAM device, power efficiency is very poor, since only a part of precharge current is used.

In another commonly-used SRAM device shown in FIG. 32(c), it is arranged such that only a bitline, selected from among all bitlines of the memory cell array by the first selection switch according to a column address, is fed an current in order that the amount of current is reduced for achieving high power efficiency.

Figure 23A:
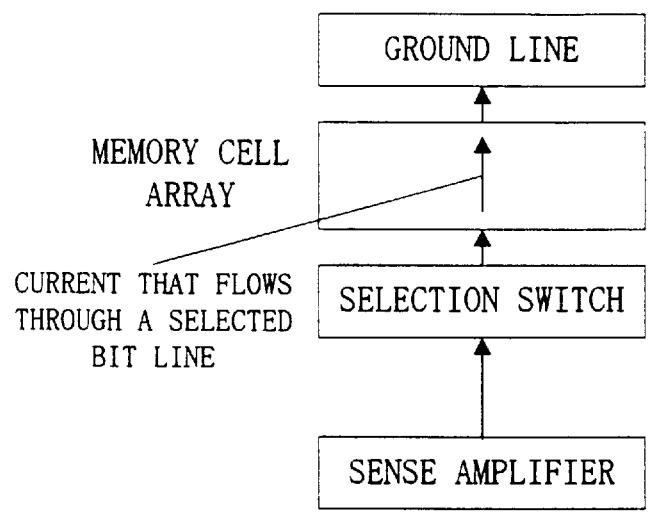
FIG. 23(a) is a schematic of an SRAM device and FIG. 23(b) is a timing chart.
Figure 23B:
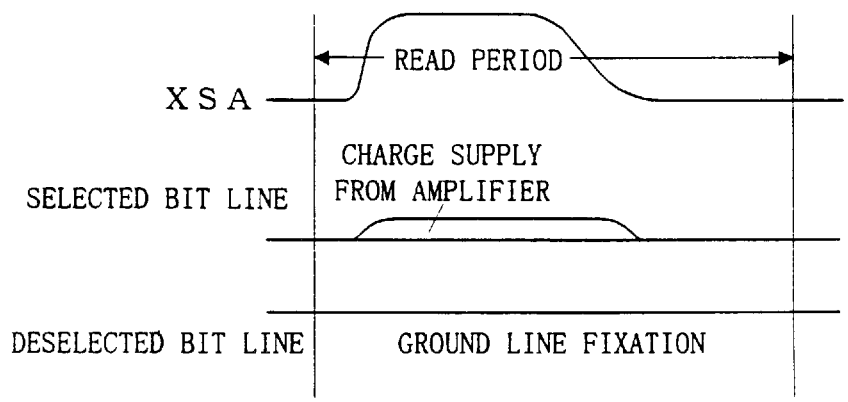

FIG. 23 is a diagram schematically showing a flow of current at the time of the read operation in an SRAM device in accordance with the present invention. As shown by a timing chart of FIG. 23(b), an activation signal XSA for a sense amplifier, which is described later, goes into the ON state during the read period. As shown in FIG. 23(a), an electric current is injected from the sense amplifier to a selected memory cell to such an extent that the difference in impedance between a bitline pair can be detected. When, according to the signal potential of the memory cell, one of the selected bitline pair is grounded and the other bitline (i.e., the complementary bitline) is not grounded, the potential of the complementary bitline increases thereby producing a very small potential difference between the bitline pair. Such a minuscule potential difference is read out by the sense amplifier and thereafter the activation signal XSA goes into the OFF state. As a result, a bitline pair, selected by an equalization signal EQ for the sense amplifier (i.e., a reverse signal of the activation signal XSA), is forcefully grounded and the injected electric charges are removed.

As a result of such arrangement, an electric current that enables the detection of an impedance difference between the bitline pair (i.e., a sufficient electric current with a potential difference approximately equal to the threshold voltage of the transistors forming the selected memory cell) is supplied from the sense amplifier to the selected memory cell. The signal potential is determined by the impedance difference, whereupon fast read operations can be achieved.

No power supply circuits for precharge processing are required and no precharge power is needed. The amount of power consumed can be reduced.

Although the deselected bitline is grounded, a signal potential held in the memory node is not destructed because of the structure of the present memory cell.

The basic concept of the write operation is explained.

Figure 33:
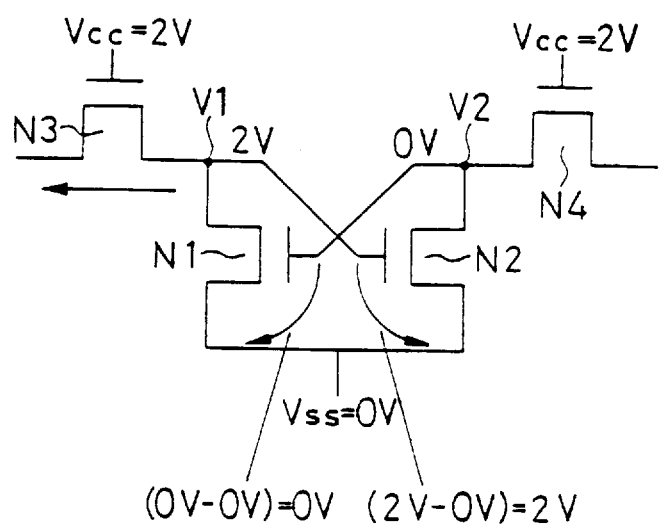
FIG. 33 is a schematic showing read operation in a commonly-used SRAM device.

FIG. 33 is a schematic diagram useful in understanding the write operation in a commonly-used SRAM. The first and second drive transistors N1 and N2 of a pair of inverters with source lines coupled to the ground potential Vss which becomes a hold power supply for low data, are transistors cross-coupled. The first and second memory nodes V1 and V2 each act as a node for holding data.

A situation, in which low data with a signal potential of 0 V is written into the first memory node V1, is described by making reference to FIG. 33. Suppose that the pre-write signal potential at the first memory node V1 is 2 V (high data). In this case, a method of breaking the balance in signal potential between the first and second memory nodes V1 and V2 may be to discharge the first memory node V1 through the first switch transistor N3. Whereas the pre-write gate-source voltage Vgs(N1) of the first drive transistor N1 is 0 V, the pre-write gate-source voltage Vgs(N2) of the second drive transistor N2 is 2 V. In other words, the first drive transistor N1 is in the off state and the second drive transistor N2 is in the on state. When the write operation begins, the potential at the first memory node V1 gradually decreases. As a result, the second drive transistor N2, whose gate is coupled to the first memory node V1, gradually goes into the off state.

Since there is a potential difference of 2 V between Vgs(N1) and Vgs(N2), there are requirements for the completion of such reverse write operation that Vgs(N1) is 2 V and Vgs(N2) is 0 V.

Figure 24A:
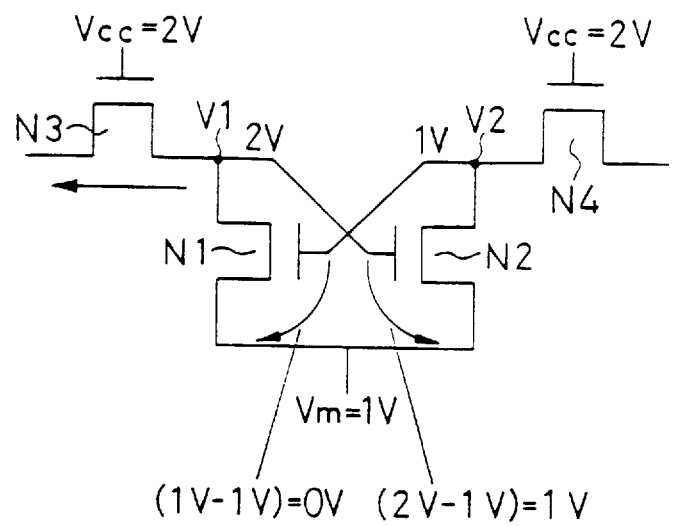
FIG. 24(a) is a circuit diagram of a part of a memory cell with a common source line and FIG. 24(b) is a circuit diagram of a part of a memory cell with independent source lines.

FIG. 24 is a diagram schematically showing the potential of a common source line of cross-coupled transistors in the SRAM SICD of this invention in a write mode of operation. With a memory cell having a structure similar to the one shown in FIG. 33, a situation, in which low data is written into the first memory node V1, is described by making reference to FIG. 24(a). Suppose here that the pre-write signal potential at the first memory node V1 is 2 V (high data). The potential of the common source line of the cross-coupled transistors, Vm, is set higher than the ground potential Vss, namely 1 V.

As a result of such arrangement, Vgs(N1), i.e., the gate-source voltage of the first drive transistor N1, becomes 0 V and Vgs(N2), i.e., the gate-source voltage of the second drive transistor N2, becomes 1 V.

For such reverse write operation to be completed, it is sufficient that there is produced a potential difference of 1 V, in other words Vgs(N1) is 1 V and Vgs(N2) is 0 V, since the potential difference between the gate-source voltage Vgs of the first drive transistor N1 and the gate-source voltage of the second drive transistor N2 is 1 V. The signal potential latch capability of the first drive transistor N1 is decreased, thereby allowing the balance in potential between the first memory node V1 and the second memory node V2 to break quickly. Accordingly the write operation of the present invention is completed quickly in relation to the prior art technique.

Figure 24B:
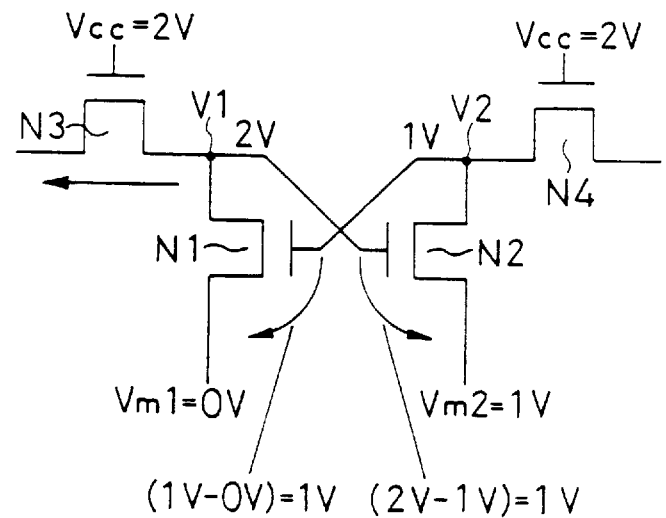

In cross-coupled transistors with a first and a second source line of a memory cell shown in FIG. 24(b), voltage is applied to each of the source lines in such a direction as to reduce the latch capability of the first and second memory nodes of the transistors, to quickly break the balance in potential difference between the first and second memory nodes.

For example, a situation, in which low data is written into the first memory node V1, is considered. If the pre-write signal potential at the first memory node V1 is 2 V (high data), the potential of the first source line, Vm1, is charged to the ground potential (0 V) and the potential of the second source line, Vm2, is charged to 1 V, at the time of the write operation of writing the low data into the first memory node V1.

Accordingly, the gate-source voltage Vgs(N1) of the first drive transistor N1 becomes 1 V and the gate-source voltage Vgs(N2) of the second drive transistor N2 also becomes 1 V.

For the case of the common source line shown in FIG. 24(a), the pre-write Vgs(N1) of the first drive transistor N1, which is required to change from the off state to the on state, is 0 V. On the other hand, for the case of the source line of the separate type, the pre-write Vgs(N1) of the first drive transistor N1 is 1 V and, as a result, the first drive transistor N1 enters the on state quickly when compared to the common source line case. This makes it possible to quickly break the balance in potential between the first and second memory nodes V1 and V2. The write operation can be performed at higher rate.

Preferred embodiments and their modifications of the present invention are now described by reference to the accompanying drawings. In the description, an SICD made in accordance with the present invention and its peripheral devices are first illustrated.

Figure 25:
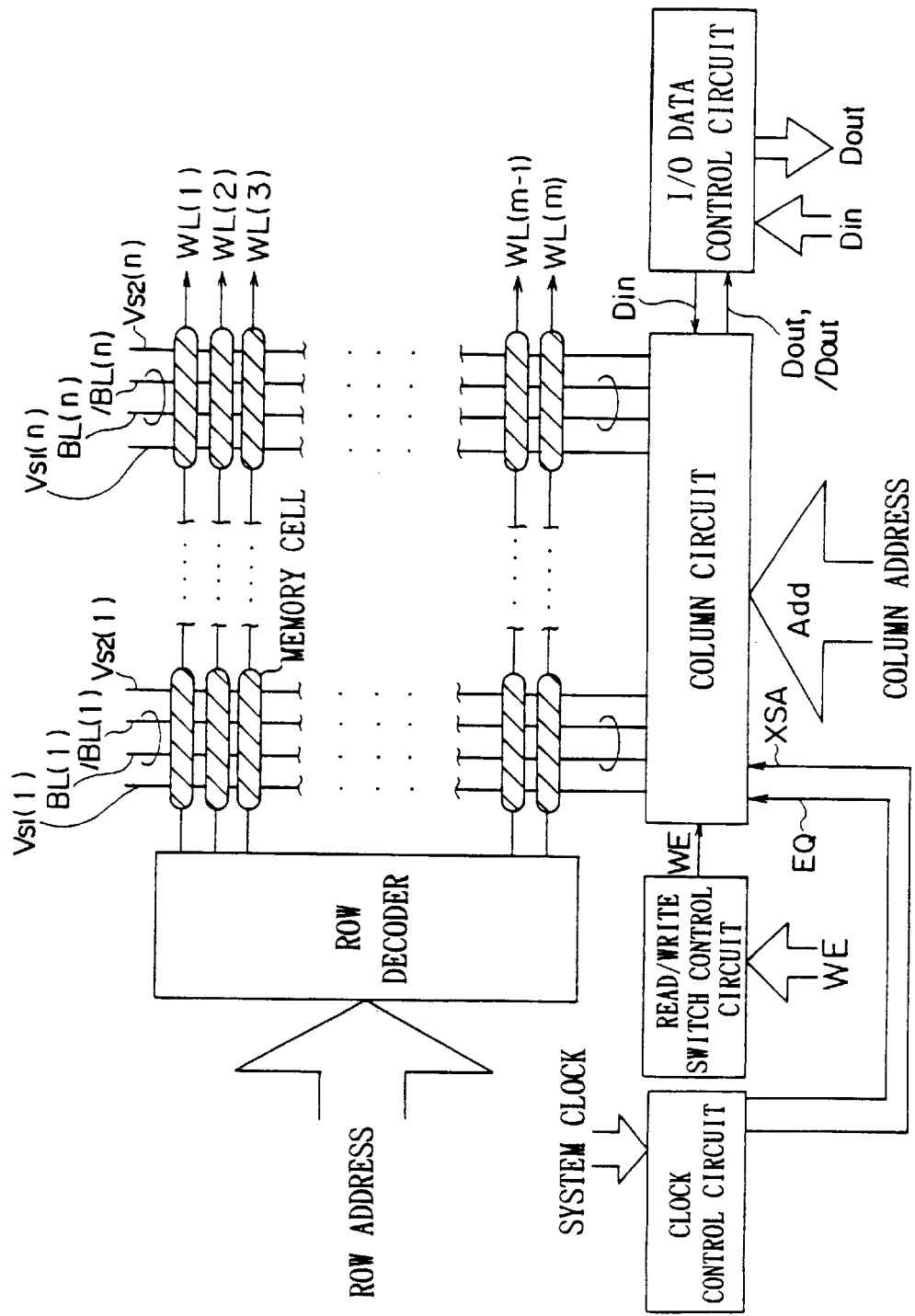
FIG. 25 shows the entirety of an SICD in accordance with an embodiment of the present invention.

FIG. 25 illustrates the entire structure of an SICD made in accordance with the present invention. In this SICD, an array of SRAM memory cells is provided in the form of a matrix with n rows and m columns (i.e., an array of n×m memory cells), where the number n is a positive integer and the number m is also a positive integer. The SICD has a row decoder, a column circuit, an input/output (I/O) data control circuit, a read/write switch control circuit and a clock control circuit. The row decoder selects a wordline WL(m) according to a row address. The column circuit selects a pair of bitlines BL(n) and /BL(n) according to a column address Add to perform read/write operations. In addition, the column circuit selects a third power supply Vs1(n) and a fourth power supply Vs2(n) to be applied to independent ground lines of the memory cell. The I/O data control circuit controls write data Din, read data Dout and read reference data /Dout with respect to the column circuit. The read/write switch control circuit issues a read request /WE or a write request WE to the column circuit. The clock control circuit provides a sense amplifier activation signal XSA and an equalization signal EQ to the column circuit for the control of the read period.

In the memory cell array, the row direction is the direction in which the row address is constant and the column address changes, and the column direction is the direction in which the column address is constant and the row address changes.

Figure 26:
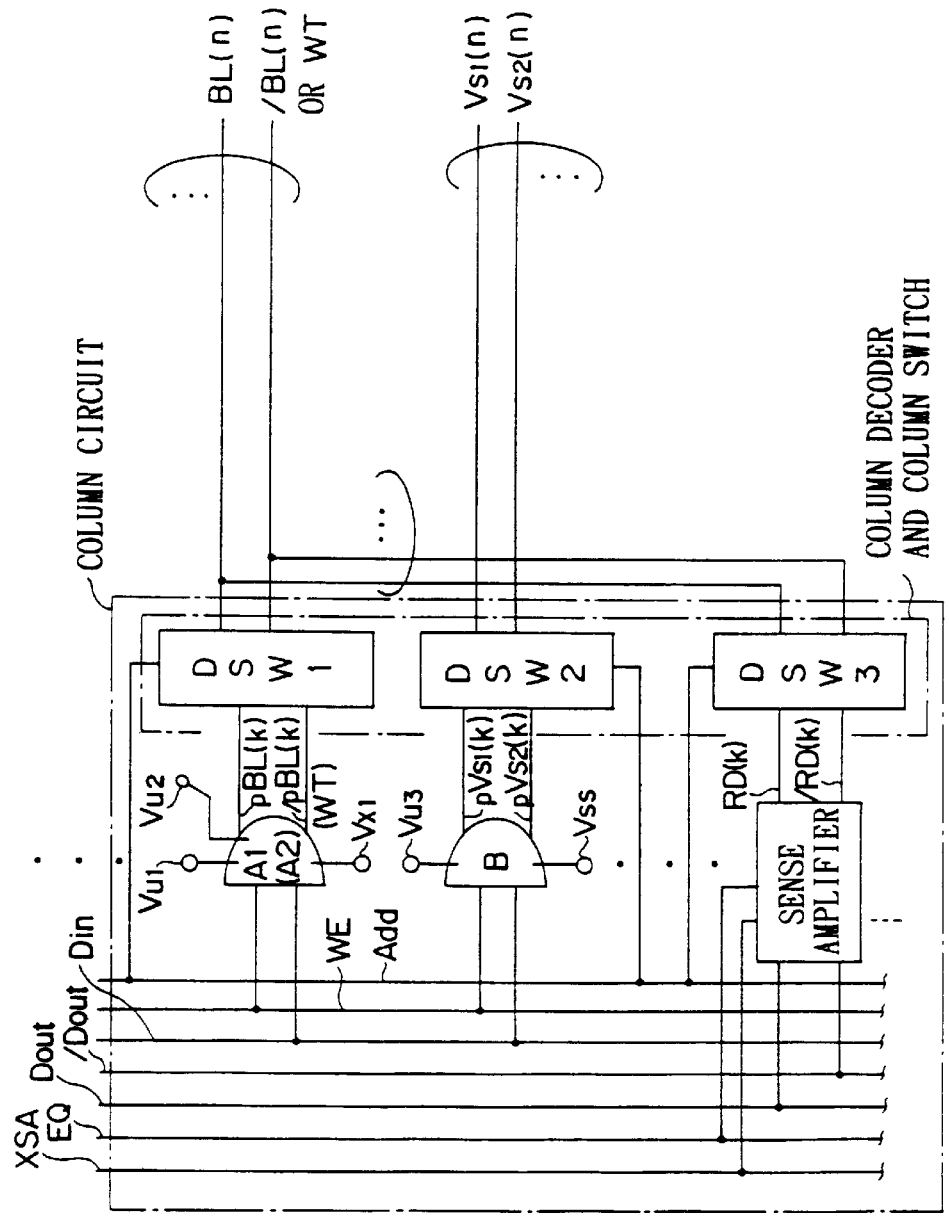
FIG. 26 is a block diagram of a column circuit in accordance with an embodiment of the present invention.

FIG. 26 illustrates in block form a column circuit in accordance with an embodiment of the present invention. This column circuit comprises a bitline selection circuit DSW1, a ground line selection circuit DSW2, a selection circuit DSW3, a bitline control circuit A1 (A2), a ground line control circuit B, and a sense amplifier. The circuit DSW1 decodes a bitline pair BL(n) and /BL(n) by a column address Add for the writing of data. The circuit DSW2 decodes and selects a third power supply Vs1(n) and a fourth power supply Vs2(n) by a column address Add. The circuit DSW3, located at the stage before the sense amplifier, decodes bitline pair BL(n) and /BL(n) by column address Add in a read mode of operation, and the decoding results are forwarded to the sense amplifier through a common data line RD(k) and common data reference line /RD(k), where the number k is a positive integer. For the circuit DSW1, the circuit A1 (A2) controls the potential of pre-bitline pair pBL(k) and /pBL(k) resulting from multiplexing of bitline pair BL(n) and /BL(n), in a write mode of operation. For the circuit DSW2, the circuit B controls the potential of first and second pre-ground lines pVs1(k) and /pVs2(k) resulting from multiplexing of Vs1(n) and Vs2(n). The sense amplifier detects the difference in current between common data line pair RD(k) and /RD(k) selected by the circuit DSW3, converts such a detected current difference into a potential difference and amplifies the potential difference.

Figure 27A:
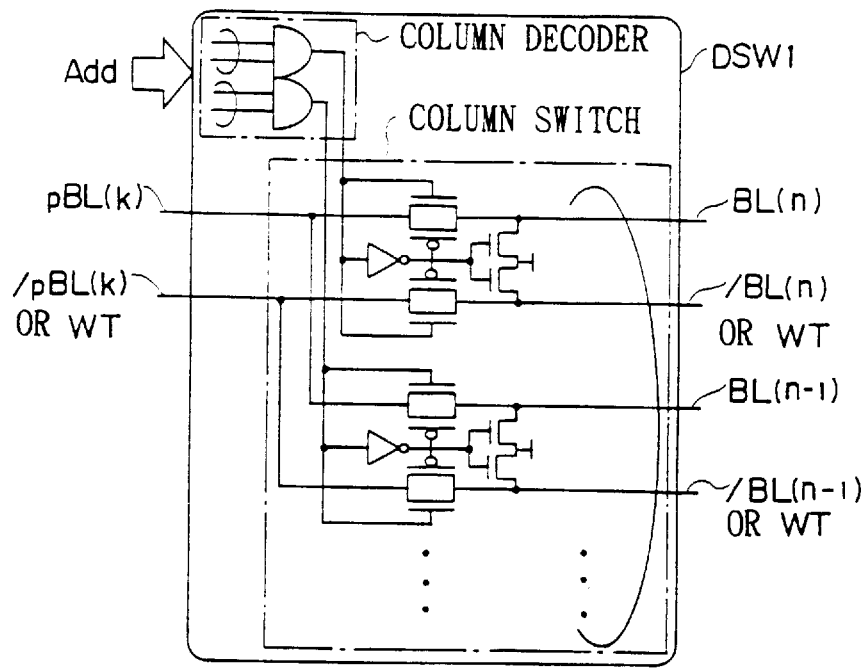
FIG. 27(a) is a circuit diagram of a bitline selection circuit in accordance with an embodiment of the present invention and FIG. 27(b) is a circuit diagram of a ground line selection circuit in accordance with an embodiment of the present invention.

FIG. 27(a) illustrates a bitline selection circuit in accordance with an embodiment of this invention. The circuit DSW1, shown in FIG. 27(*a*), comprises a column decoder for receiving and decoding a column address Add, and a column switch for selecting, based on pBL(k) and /pBL(k) received from the circuit A1 and on the output from the column decoder, BL(n) and /BL(n).

Figure 27B:
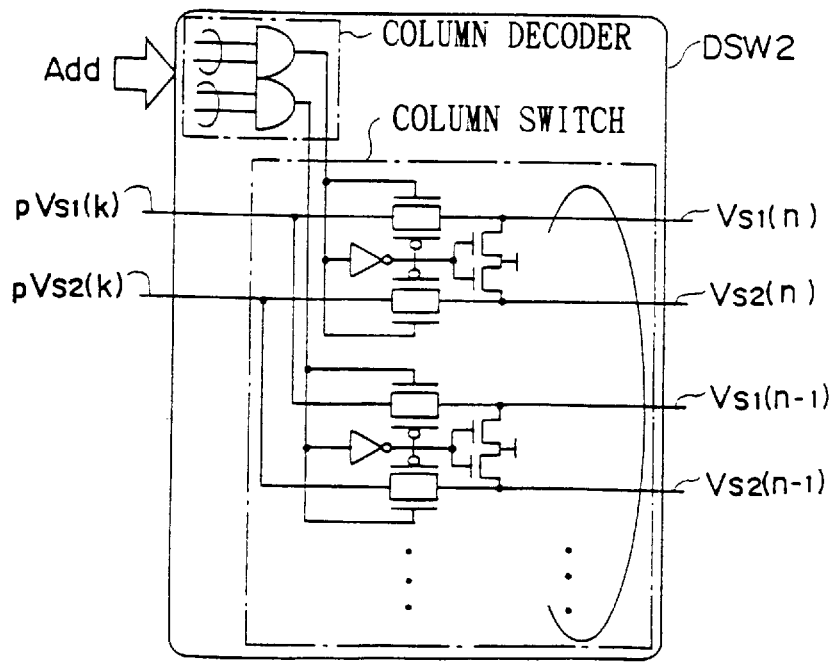

FIG. 27(*b*) illustrates a ground line selection circuit in accordance with an embodiment of this invention. The ground line selection circuit DSW2, shown in FIG. 27(*b*), comprises a column decoder for receiving and decoding Add, and for selecting, based on pVs1(k) and /pVs2(k) and on the output of the column decoder, either Vs1(n) or Vs2(n).

Figure 28A:
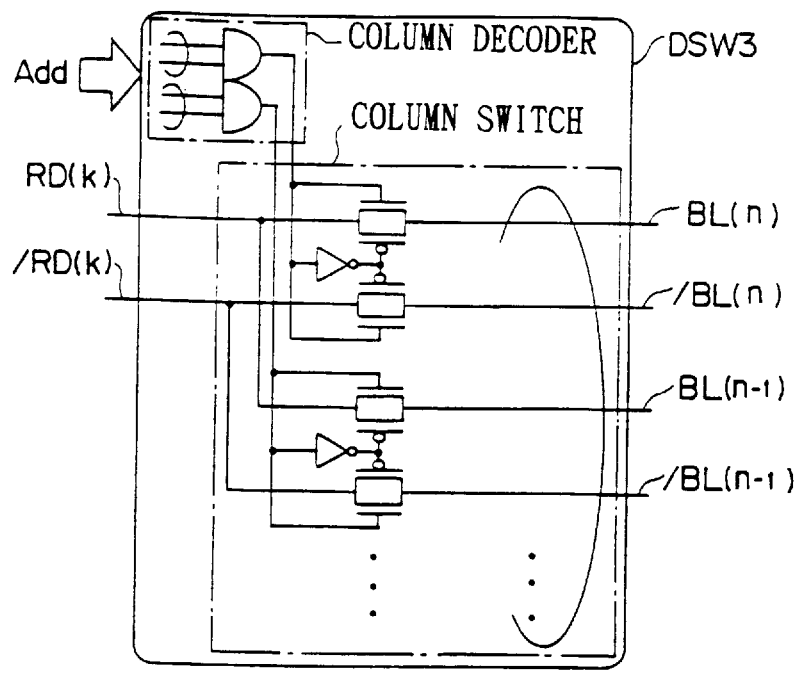
FIGS. 28(a) and (b) are circuit diagrams of the selection circuit located at the stage before the sense amplifier in accordance with an embodiment of the present invention.

FIG. 28(*a*) illustrates a selection circuit located at the stage before the sense amplifier. The circuit DSW3, shown in FIG. 28(*a*), comprises a column decoder for receiving and decoding Add, and a third column switch for selecting from among a plurality of bitline pairs a bitline pair BL and /BL identified by the output of the column decoder for forwarding to RD(k) and /RD(k).

The sense amplifier of the present invention is of the input/output separation type. Both of the circuit DSW1 of FIG. 27(*a*) and the circuit DSW3 of FIG. 28(*a*) are not always required, so that in a case where the sense amplifier is of the input/output through type, sharing may be possible.

FIRST EMBODIMENT

A first embodiment of the present invention is illustrated by making reference to the drawings.

FIG. 1(*a*) is a circuit diagram of a memory cell in accordance with the first embodiment. P1 is a first load transistor of a first inverter and is coupled to a first power supply Vcc. P2 is a second load transistor of a second inverter, is coupled to first power supply Vcc and forms a pair with first load transistor P1. N1 is a first drive transistor for driving the first inverter. N2 is a second drive transistor for driving the second inverter and forms a pair with first drive transistor N1. V1 is a first memory node for holding a memory cell signal potential. V2 is a second memory node for holding an opposite potential to that of first memory node V1. BL is a bitline acting as a first control line. Bitline BL is charged to a first high data potential Vu1 (the second potential) in a write mode of operation while on the other hand in a read mode of operation bitline BL is charged to a ground potential Vx1 (the first potential) for memory cells in a designated column of the memory cell array. /BL is a complementary bitline acting as a second control line. Complementary bitline /BL, as a write control line, is charged to a second high data potential Vu2 (the third potential) in a write mode of operation while on the other hand in a read mode of operation complementary bitline /BL is referred to by bitline BL and is charged to ground potential Vx1. WL is a wordline for activating memory cells in a selected row of the memory cell array, acting as a third control line. Vcc is a first power supply for driving a memory cell. Vss is a second power supply which is at the ground potential (i.e., the reference potential for driving memory cells). N3 is a first switch that allows bitline BL to read or write first memory node V1 only when wordline WL is activated. N14 is a second switch that enables the writing of information into first memory node V1 only when complementary bitline /BL is activated in write mode. V3 is a first contact point of first drive transistor N1 and first switch N3.

First and second drive transistors N1 and N2 form a pair. First and second load transistors P1 and P2 form a pair. A group of these transistors a Pre flip-flop connected.

First memory node V1 is coupled to first load transistor P1. First memory node V1 is coupled, via second switch N14 and first drive transistor N1, to second power supply Vss.

Second memory node V2 is coupled to second load transistor P2. Second memory node V2 is coupled to second power supply Vss via second drive transistor N2.

The operation of the memory cell is described with reference to the drawings.

Figure 29:
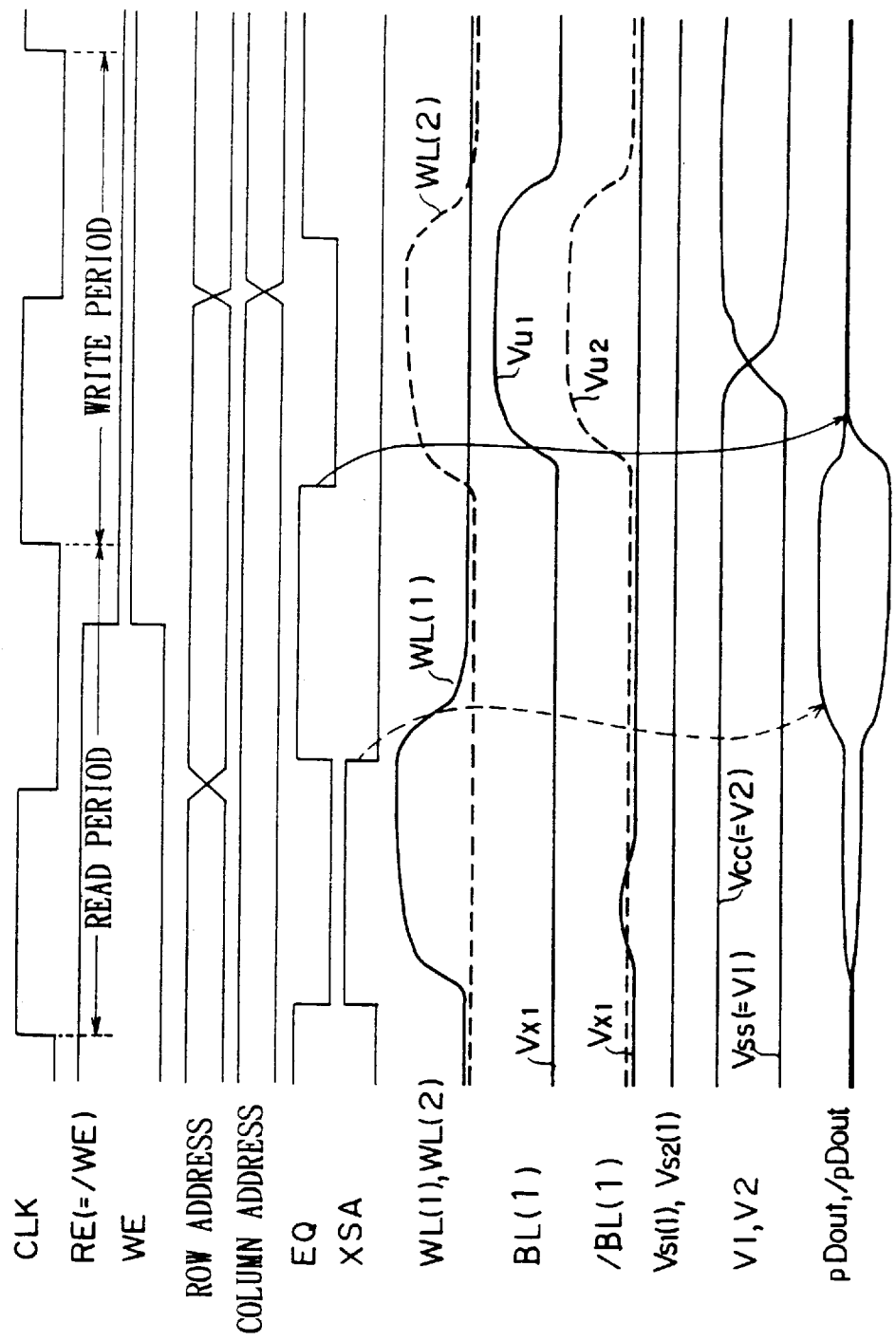
FIG. 29 is a timing chart of the operation of a memory cell in accordance with the first (second) embodiment of the present invention.

FIG. 29 is a timing chart of the operation of the memory cell of the first embodiment. CLK is a system clock for controlling the entire SICD. RE is a read request. WE is a write request. RE is an inverted signal of WE (RE= /WE). pDout is the output from the sense amplifier. /pDout is the reference output of the sense amplifier. The description of the other signals already mentioned are omitted.

A case, in which read or write operation is executed in synchronization with system clock CLK, is described. Read request /WE is a signal that determines a read period. Write request WE is a signal that determines a write period. If /WE is "1" on the rising edge of system clock CLK, then the clock cycle is in a read period. If WE is "1", then the clock cycle is in a write period. The first half of the clock cycle of FIG. 29 is the read period and the second half is the write period.

The operation of the memory cell during the read period is explained.

Suppose that a "0" (i.e., second power supply potential Vss) is held at first memory node V1 and that a "1" (first power supply potential Vcc) is held at second memory node V2. The clock cycle is identified by the rising edge of system clock CLK to be in a read period and a column and a row address are latched.

Sense amplifier activation signal XSA and bitline equalization signal EQ are reset. Wordline WL(1), selected by the latched address, rises. Bitline pair BL(1), /BL(1) is precharged to ground potential Vx1. As can be seen from FIG. 21(*a*), the bitline control circuit A1 (i.e., the precharge control circuit) is controlled by write request WE, and Vx1 is generated because WE is "0" during the write period. However, Vx1 is not necessarily at the ground potential. For instance, it is sufficient for Vx1 to be a voltage just low enough not to prevent second switch N14 from entering the full functional state.

Wordline WL(1), shown in FIG. 29, rises and first switch N3, shown in FIG. 1(*a*), turns on. This establishes connection between first contact point V3 of first drive transistor N1 and first switch N3, and bitline BL.

First drive transistor N1 is in the full functional state, since the potential at the second memory node V2 is first power supply Vcc. Bitline BL is coupled to second power supply Vss at low impedance. On the other hand, complementary bitline /BL is coupled only to the gate electrode of second switch N14, so that /BL is connected to second power supply Vss at higher impedance in relation to bitline BL. Since the difference in electric characteristic between BL and /BL depends only on the data held at node V1, the difference appears as an impedance characteristic difference. This enables high-speed, reliable read operations.

Such an impedance characteristic difference between BL and /BL is fed through the selection circuit DSW3, shown in FIG. 28(*a*), to the sense amplifier of FIG. 22(*a*). In the sense amplifier, the impedance characteristic difference is detected as an electric current difference, is converted into a potential difference and is amplified for forwarding, as read data Dout, /Dout, to the I/O data control circuit of FIG. 25. Then the read operation is completed.

Unlike the prior art technique, the signal potential of data held is not read out as a direct potential difference between BL and /BL in the present embodiment. Further, in accordance with the present embodiment, both BL and /BL are charged to Vss (the ground potential). This eliminates the need for the supply of precharge power.

In accordance with the present embodiment, it is sufficient that the lowest voltage to be secured as a read current for impedance detection falls in a range that can be detected as the BL-/BL impedance characteristic difference. In other words, such a lowest voltage is a voltage at which first and second drive transistors N1 and N2 function (i.e., the threshold voltage of the transistors). This achieves low-voltage operations. The structure and operation of the sense amplifier according to the present invention is illustrated later.

First memory node V1 and the bit line are disconnected by switch N14, resulting in preventing the potential at the first memory node V1 from going up at the time of the read operation. No through current flows from first power supply Vcc to second power supply Vss through second drive transistor N2. This not only enables stable read operations but also eliminates unnecessary power consumption.

The operation of the memory cell during the write period is illustrated. Suppose that a "1" is written into first memory node V1 and that a "0" is written into second memory node V2. At the second half of the clock cycle, the operation of the memory cell is identified by the rising edge of system clock CLK to be in a write period. A row and a column address are latched.

Thereafter, wordline WL(2), which is selected by the latched address, rises. In the bitline control circuit A1 of FIG. 21(a), write request WE is "1" and, as a result, Vu1 (the first high data potential) is generated in pre-bitline pBL(k) and Vu2 (the second high data potential) is generated in complementary pre-bitline /pBL(k).

As a result of the above, the potential of complementary bitline /BL(1) is charged to second high data potential Vu2. Vu2 is the potential necessary for sufficiently driving second switch N14. Higher Vu2 is preferable. For example, Vu2 may be either at the potential of Vcc or at its increased potential, Vpp.

Voltage is applied to wordline WL(2) as well as to complementary bitline /BL(1), resulting in turning both first switch N3 and second switch N14 on.

Bitline BL(1) and first memory node V1 are connected together through first and second switches N3 and N4, so that the potential at first memory node V1 gradually approaches first high data potential Vu1. Since the gate electrode of first load transistor P1 is coupled to second memory node V2, first load transistor P1 is made active when the gate electrode potential exceeds the threshold voltage. This brings first memory node V1 into connection with first power supply Vcc.

Additionally, since the gate electrode of second drive transistor N2 is coupled to first memory node V1, this makes N2 active when its gate electrode potential exceeds the threshold voltage. This makes connection between second memory node V2 and second power supply Vss. Since the gate electrode of second load transistor P2 is coupled to first memory node V1, P2 stops functioning at the time when its gate electrode exceeds the threshold voltage. As a result, second memory node V2 is disconnected from first power supply Vcc and the potential at second memory node V2 approaches second power supply Vss. The write operation is completed. Further, to reduce the write time, higher Vu1 (the first high data potential) is preferable as in the case of Vu2 (the second high data potential). For example, Vu1 may be either at the potential of first power supply Vcc or at its increased potential, Vpp.

FIRST MODIFICATION OF FIRST EMBODIMENT

A first modification of the first embodiment is now illustrated below.

The present modification is constructed such that the threshold voltage of second switch N14 is lower than the threshold voltages of first drive transistor N1, second drive transistor N2 and first switch N3.

One of features of the present modification is that a memory cell capable of functioning at low voltage is realized by the following arrangement. The threshold voltage of a MOS transistor acting as second switch N14 is held lower than that of the other transistors so as to eliminate the need for increasing the potential of complementary bitline /BL up to Vpp that is a potential higher than first power supply Vcc.

The reason why the threshold voltage of second switch N14 can be set low is explained. Even when a through current flows through second switch N14 due to reducing its threshold voltage, such a through current is cut off by first drive transistor N1 serially coupled thereto.

SECOND MODIFICATION OF FIRST EMBODIMENT

A second modification of the first embodiment is described.

The present modification is constructed such that second load transistor P2 is smaller in size than first load transistors P1 and second drive transistor N2.

Increasing noise margins in read mode conflicts with increasing the rate of the write operation in the design of memory cells. Accordingly, the current drive performance ratio of access transistor equivalent to first switch N3 and second drive transistor N2, and the current drive performance ratio of access transistor and second load transistor P2 must be considered, in order to secure the noise margin.

One of features of the present modification is that, since first memory node V1 and second memory node V2 are separated from bitline BL and complementary bitline /BL, respectively, this not only ensures that a considerably wide noise margin is secured in a read mode of operation, but also makes it possible to reduce the size of second load transistor P2 by breaking the balance of the flip-flop circuit because the noise margin is not easily reduced. As a result, the rate of the write operation can be increased.

THIRD MODIFICATION OF FIRST EMBODIMENT

A third modification of the first embodiment is described with reference to the drawing figures.

Figure 1A:
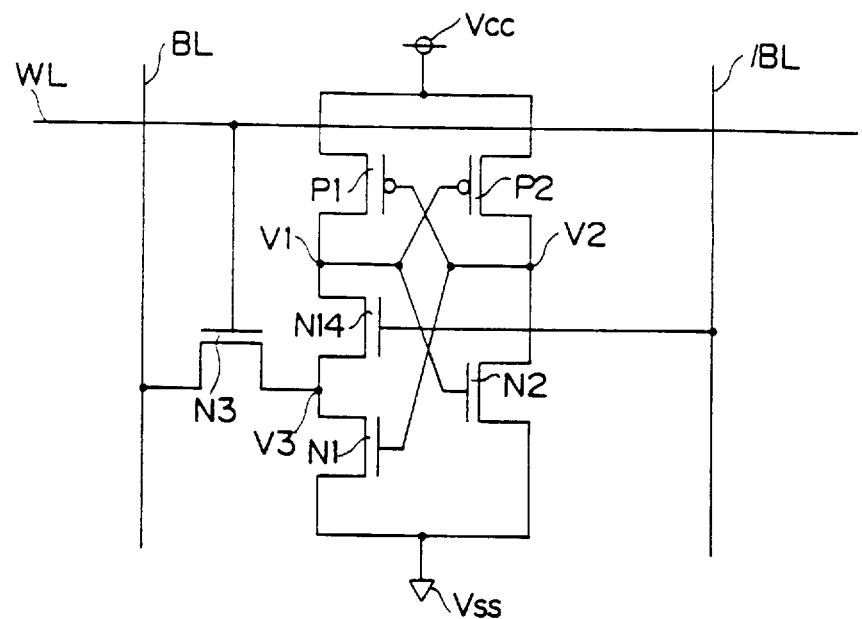
FIG. 1(a) is a circuit diagram of a memory cell in accordance with the first embodiment of the present invention and FIG. 1(b) is a circuit diagram of a memory cell in accordance with the third modification of the first embodiment.
Figure 1B:
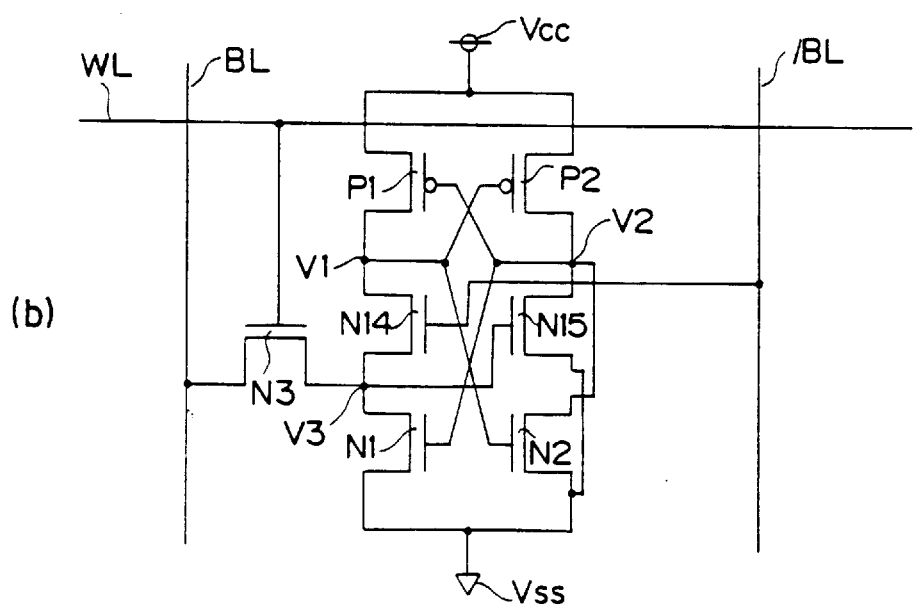

FIG. 1(b) is a circuit diagram depicting a memory cell of the present modification. Only additional elements to the FIG. 1(a) memory cell are described. N15 is a third switch. N15 is connected, in parallel with second drive transistor N2, between second memory node V2 and second power supply Vcc for the purpose of increasing the write operation rate. Third switch N15 is controlled by bitline BL through first switch N3.

The operation of the memory cell of the present modification is described. Generally, the rewriting of data held in a memory node from "0" to "1" takes more time than is the case with the rewriting of data held in a memory node from "1" to "0". The reason is that, even if a voltage is applied to the memory node, the drive transistor will not function until the applied voltage exceeds the threshold voltage of the drive transistor.

Only different features of the present modification from the first embodiment are described. A case, in which a "1" is written into first memory node V1 and a "0" is written into second memory node V2, is described. A voltage, which is at about the potential of first power supply Vcc, is applied to wordline WL and second high data potential Vu2 is applied to complementary bitline /BL. This brings both first switch N3 and second switch N14 into the on state.

Bitline /BL and first memory node V1 are interconnected through first and second switches N3 and N14 and, as a result, the potential at first memory node V1 gradually approaches first high data potential Vu1. Since the potential at first contact point V3 is higher than the potential at first memory node V1, third switch N15 starts functioning earlier than second drive transistor N2, resulting in having the potential at second memory node V2 abruptly approach second power supply Vss. First drive transistor N1 abruptly stops functioning and first load transistor P1 abruptly becomes low in impedance. The write operation rate is improved in relation to the first embodiment.

Although the number of transistors per memory cell is increased by one, this will produce no disadvantages for the layout design of elements on the semiconductor substrate because the objective property is improved.

FOURTH MODIFICATION OF FIRST EMBODIMENT

A fourth modification of the first embodiment is described with reference to the drawing figures.

Figure 2A:
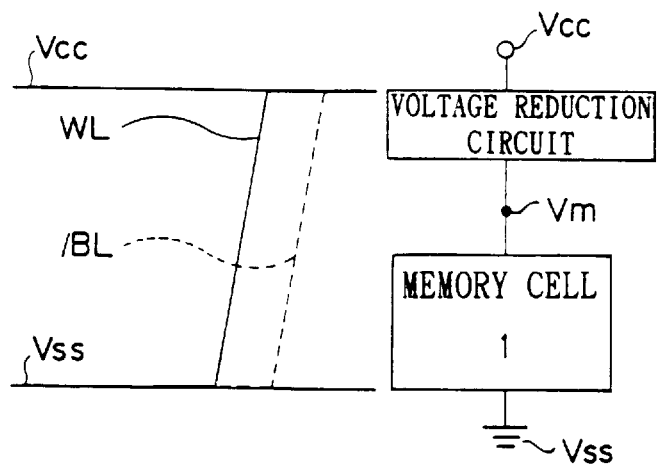
FIG. 2(a) is a diagram showing the power supply potential of a memory cell in accordance with the fourth modification of the first embodiment (the third modification of the second embodiment, the seventh modification of the third embodiment, the sixth modification of the fourth embodiment) of the present invention.

FIG. 2(a) shows the power supply potential of a memory cell in accordance with the present modification. Vm is the potential of a sixth power supply Vm resulting from reducing the potential of first power supply Vcc by means of a voltage reduction circuit. Vm is higher than second power supply Vss. Wordline WL, and complementary bitline /BL in write mode are charged to first power supply potential Vcc, and six power supply potential Vm is applied to the memory cell.

One of features of the present modification is described. Even if a group of transistors which are flip-flop connected is at Vm which is lower than Vcc, stable operations can be performed because (A) in read mode BL and /BL are charged to Vss and (B) in write mode /BL is charged to about the potential of Vcc, as in the first embodiment.

Additionally, since Vm, which is an intermediate potential between Vcc and Vss, is applied to the common source line, this decreases the signal potential latch capability. As a result, the write operation rate is improved.

FIFTH MODIFICATION OF FIRST EMBODIMENT

A fifth modification of the first embodiment is described by making reference to the drawing figures.

Figure 2B:
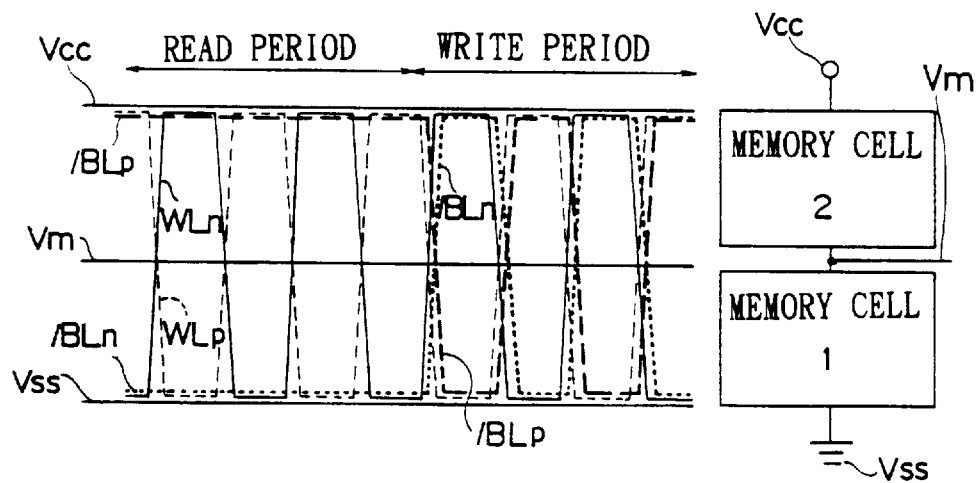
FIG. 2(b) is a diagram showing the power supply potential of a memory cell in accordance with the fifth modification of the first embodiment (the fourth modification of the second embodiment, the eighth modification of the third embodiment, the seventh modification of the fourth embodiment) of the present invention.

FIG. 2(b) shows the power supply potential of a memory cell in accordance with the fifth modification. As can be seen from FIG. 2(b), a memory cell of the first embodiment is connected instead of the voltage reduction circuit of FIG. 2(a).

Figure 3A:
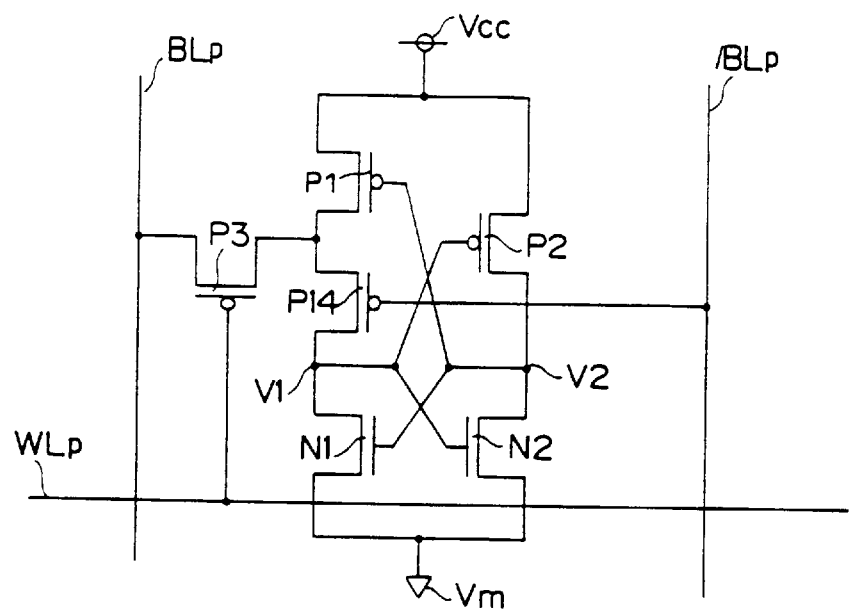
FIGS. 3(a) and 3(b) show circuit diagrams of the memory cell in accordance with the fifth modification of the first embodiment of the present invention.
Figure 3B:
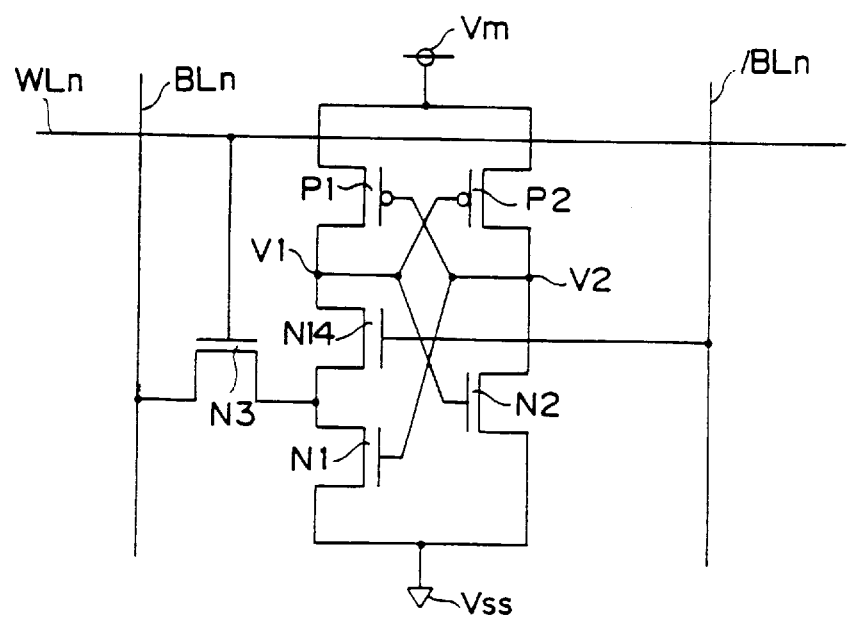

FIG. 3 is a circuit diagram showing a memory cell in accordance with the present modification. The FIG. 3(a) memory cell corresponds to the memory cell 2 of FIG. 2(b). The FIG. 3(a) memory cell is formed of transistors in conductivity-type opposition to corresponding transistors of the FIG. 1(a) memory cell of the first embodiment. The FIG. 3(b) memory cell corresponds to the memory cell 1 shown in FIG. 2(b) and has the same structure as the memory cell of the first embodiment.

One of features of the present modification is described. Even if the drive potential of a group of transistors which are flip-flop connected (N1, N2, P1, P2) is Vm (the sixth power supply potential) that is approximately ½ of first power supply potential Vcc, the memory cell 1 can function with stability because (A) in read mode wordline WLn is charged to first power supply potential Vcc and bitline pair BLn, /BLn is charged to second power supply potential Vss and (B) in write mode wordline WLn and complementary bitline /BLn are charged to about the potential of first power supply potential Vcc as in the first embodiment.

Additionally, even if the drive potential of the transistor group is Vm that is approximately ½ of Vcc, the memory cell 2 can function with stability because (A) in read mode wordline WLp is charged to Vss and bitline pair BLp, /BLp is charged to about the potential of Vcc and (B) wordline WLp and complementary bitline /BLp are charged to Vss, conversely to the first embodiment.

Additionally, Vm is applied to the common source line, thereby lowering the signal potential latch capability. Fast write operations to the memory cells 1 and 2 are achieved.

SIXTH MODIFICATION OF FIRST EMBODIMENT

A sixth modification of the first embodiment is explained with reference to the accompanying drawings.

FIG. 4 is a schematic diagram showing an array of memory cells of the present modification.

FIG. 5 is a timing chart in reading data from a memory cell array in accordance with the present modification. In the timing chart, dT1 indicates the rising time difference between wordlines WL(m) of the present embodiment and conventional technique. dT2 indicates the read data output time difference between the present embodiment and conventional technique.

FIG. 4(a) shows an array of memory cells in a matrix with four rows and sixteen columns (4×16) of the first embodiment (see FIG. 1(a)). WL(m) is a wordline. BL(n) is a bitline. /BL(n) is a complementary bitline which becomes a write control line at the time of the write operation. Referring now to FIG. 4(b), "ROW" indicates an array of gates for decoding a commonly-used wordline WL(m) and "COLUMN" indicates an array of gates for decoding a commonly-used bitline pair BL(n), /BL(n), in an 8×8 memory cell array. Referring now to FIG. 4(c), "ROW" indicates an array of gates for decoding a wordline WL(m) of the present modification and "COLUMN" indicates an array of gates for decoding a bitline pair BL(n), /BL(n) of the present modification, in a 4×16 memory cell array.

Conventionally, in an array of SRAM cells, address non-multiplex, in which there is no distinction between row address and column address, is employed. In the address non-multiplex, it is possible for the pre-address to be assigned to any one of the decoding of wordline WL(m) and the decoding of bitline BL(n). When wordline WL(m) is activated, a through current flows through every memory cell associated with the activated WL(m) and a potential difference occurs between bitline BL(n) and complementary bitline /BL(n). This produces the problem that power is wasted at the time of equalizing bitline BL(n). To cope with this problem, the number of wordlines WL(m) is increased to cut down the number of memory cells that is coupled to a single wordline as low as possible. This solution, however, produces another problem that the access time, from the time an address is inputted to the time the addressed data is outputted, is increased due to the fact that the decoding time of row address increases with the number of wordlines WL(m).

As shown in FIGS. 4(b) and (c), the present modification and the conventional technique employ different decoding methods. As can be seen from FIGS. 4(b) and (c), a row group ("ROW" in the figure) of the present modification for decoding row addresses is composed of a less number of gate array stages in relation to the conventional technique thereby reducing the decoding time while a column group ("COLUMN") of the present modification is composed of a larger number of gate array stages in relation to the conventional technique thereby increasing the decoding time.

However, the present modification is able to provide a shorter access time (from address input to data output) in comparison with the prior art technique (see FIG. 5). This is explained as follows. Decoded wordline WL(m) rises fast thereby expediting the occurrence of a data signal potential in bitline BL(n). Additionally, even if it takes a long time to decode bitline BL(n) when compared to the conventional technique, such extra time can be offset if the decoding of bitline BL(n) is completed between when the decoding of wordline WL(m) is finished and when data signal potential appears at bitline BL(n).

A feature of the present modification is as follows. No through current flows through a memory cell coupled to a wordline WL(m) in the active state, since the memory node and bitline BL(n) are disconnected. Additionally, the power used per memory cell is reduced, since memory cells, which consume no precharge power, are used. This increases the number of memory cells capable of being coupled to a single wordline thereby cutting down the number of wordlines WL(m). The decoding time of row address is shortened and the access time is likewise shortened.

SECOND EMBODIMENT

A second embodiment of the present invention is described with reference to the drawing figures.

Figure 6A:
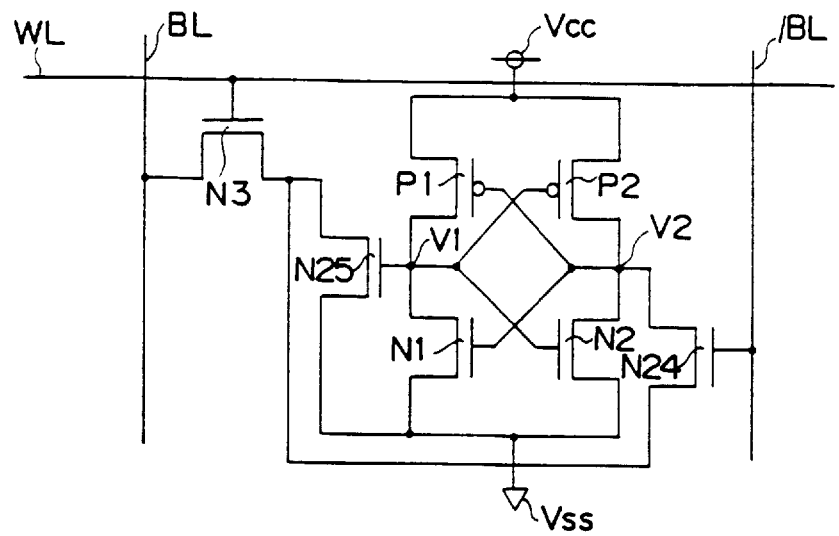
FIG. 6(a) is a circuit diagram of a memory cell in accordance with the second embodiment and FIG. 6(b) is a circuit diagram of a memory cell in accordance with the second modification of the second embodiment.

FIG. 6(a) is a circuit diagram of a memory cell according to the second embodiment. Only differences between the FIG. 6(a) memory cell of the second embodiment and the FIG. 1(a) memory cell of the first embodiment are described. N24 is a second switch which is made active by complementary bitline /BL in write mode and which is serially coupled between first switch N3 and second memory node V2. N25 is a third switch which is serially coupled between first switch N3 and Vss (common ground line) and which is made active by first memory node V1 in read mode to control the impedance of bitline pair BL, /BL.

Only differences in operation between the FIG. 6(a) memory cell of the second embodiment and the FIG. 1(a) memory cell of the first embodiment are described here.

The operation of the memory cell during the read period is first described. Suppose here that first memory node V1 holds a "0" (second power supply potential Vss) and that second memory node V2 holds a "1" (the first power supply potential Vcc).

Wordline WL rises. First switch N3 turns on.

Third switch N25 turns off, since first memory node V1 is at second power supply potential Vss (the ground potential).

There is produced no difference in impedance characteristic between bitline BL and its reference, complementary bitline /BL.

Conversely, in a case where first memory node V1 holds a "1" (Vcc) and second memory node V2 holds a "0" (Vss, the ground potential), third switch N25 turns on. There is produced a difference in impedance characteristic between bitline BL and complementary bitline /BL.

Accordingly, as in the first embodiment, the electric characteristic difference between BL and /BL depends only upon the data held in first memory node V1 and appears as an impedance characteristic difference. The read operation can be carried out with stability.

The operation of the memory cell during the write period is described. Suppose that a "1" is written into first memory node V1 and a "0" is written into second memory node V2.

A voltage, which is at about the potential of first power supply Vcc is applied to wordline WL while on the other hand second high data potential Vu2 is applied to complementary bitline /BL. This brings both first switch N3 and second switch N24 into the on state.

Because bitline BL and second memory node V2 are connected through first switch N3, the potential at second memory node V2 gradually approaches Vx1 (the ground potential) applied to bitline BL. Additionally, because the gate electrode of first drive transistor N1 is coupled to second memory node V2, N1 stops functioning when the potential at second memory node V2 is reduced to the threshold voltage of first drive transistor N1. Because the gate electrode of first load transistor P1 is coupled to second memory node V2, P1 starts functioning when the potential at second memory node V2 exceeds the threshold voltage of P1. As a result, the potential at first memory node V1 gradually approaches Vcc and the write operation is completed. Whereas the memory node subjected to write processing is first memory node V1 in the first embodiment, it is second memory node V2 in the second embodiment.

The second embodiment is characterized in that both the number of transistors between first memory node V1 and second power supply Vss and the number of transistors between second memory node V2 and second power supply Vss are one and good objective properties are obtained. Additionally, the noise margin becomes greater than in the first embodiment, since second switch N24, which is activated by complementary bitline /BL, is not connected in series in the inverter.

The memory cell of the second embodiment, in which second switch N24 is not connected in series in the inverter, is useful when the noise margin is the first consideration. On the other hand, the memory cell of the first embodiment, which is formed of six transistors, is useful when the scale of integration is the first consideration.

FIRST MODIFICATION OF SECOND EMBODIMENT

A first modification of the second embodiment is illustrated.

In accordance with the first modification, first load transistor P1 is smaller in size than second load transistor P2.

In the write operation, the rewriting of data held in first memory node V1 from "0" to "1" takes the longest time. The reason is that, since first memory node V1 is disconnected from bitline BL and is indirectly written by the logical state of second memory node V2 being changed to the state of "0", it takes a long time that first drive transistor N1 turns off sufficiently and first load transistor P1 enters the fully functional state. Since a MOS transistor just starts functioning when the applied voltage exceeds the threshold voltage of the MOS transistor, it is possible to reduce the operating time by reducing the size of first load transistor P1 for the reduction of capacitance.

In accordance with the present modification, first and second memory nodes V1 and V2 are separated from bitline pair BL and /BL. This arrangement secures a considerably great noise margin in read mode. Noise margin is not reduced easily and, therefore, it is possible to reduce the size of first load transistor P1 by breaking the balance of the flip-flop circuit thereby increasing the write operation rate.

SECOND MODIFICATION OF SECOND EMBODIMENT

Referring now to the drawings, a second modification of the second embodiment is described.

Figure 6B:
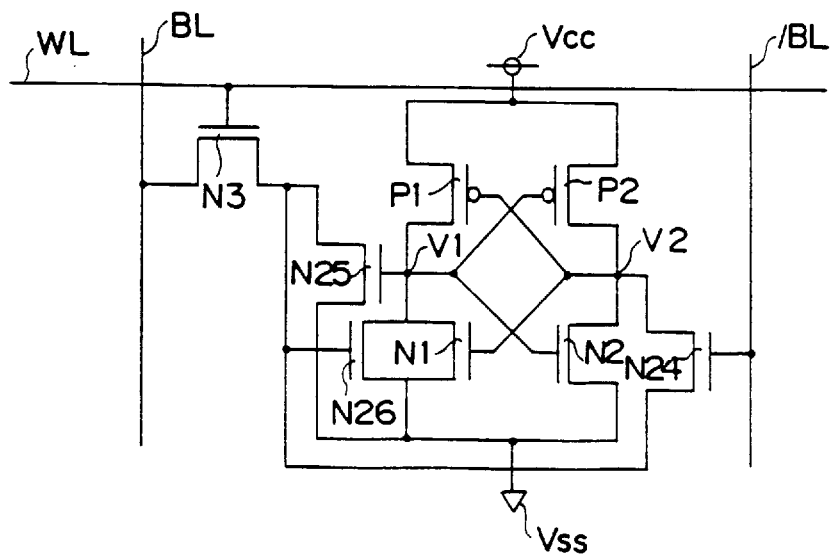

FIG. 6(b) is a circuit diagram of a memory cell in accordance with the present modification. Only additional elements to the FIG. 6(a) memory cell are described. In FIG. 6(b), N26 is a fourth switch for increasing the write operation rate to second memory node V2 in write mode. This fourth switch N26 is connected, in parallel with first drive transistor N1, between first memory node V1 and second power supply Vss and is controlled by bitline BL.

The write operation of the memory cell of the present modification is described. A case, in which a "0" and a "1" are written into first memory node V1 and into second memory node V2, respectively, is illustrated. Only distinctive features of the sixth modification over the second embodiment are explained. A voltage, which is at about the potential of first power supply Vcc, is applied to wordline WL and second high data potential Vu2 is applied to complementary bitline /BL. This brings both first switch N3 and second switch N14 into the on state.

The potential at second memory node V2 gradually approaches first high data potential Vu1, since bitline BL and second memory node V2 are interconnected through first and second switches N3 and N24. Fourth switch N26 starts functioning earlier than first drive transistor N1, since the potential at the gate electrode of fourth switch N26 is higher than second memory node V2. As a result, the potential at first memory node V1 abruptly approaches second power supply potential Vss. Second drive transistor N2 abruptly stops functioning while at the same time second load transistor P2 abruptly enters the low-impedance state. As compared with the second embodiment, a faster write operation rate can be achieved by the present modification.

THIRD MODIFICATION OF SECOND EMBODIMENT

A third modification of the second embodiment is now described by reference to the drawings.

FIG. 2(a) shows the power supply potential of a memory cell in accordance with the present modification. This modification has a structure with a memory cell of the second embodiment instead of a memory cell of the fourth modification of the first embodiment.

The present modification is characterized as follows. Even if a group of transistors which are flip-flop connected is at sixth power supply potential Vm lower than first power supply potential Vcc, stable operations can be executed, since bitline pair BL, /BL is charged to second power supply potential Vss in a read mode of operation and complementary bitline /BL is charged to about the potential of first power supply Vcc potential in a write mode of operation as in the second embodiment.

Additionally, because sixth power supply voltage Vm, which is an intermediate potential between first power supply potential Vcc and second power supply potential Vss, is applied to the common source line of the memory cell, the signal potential latch capability is decreased thereby increasing the write operation rate.

FOURTH MODIFICATION OF SECOND EMBODIMENT

Referring now to the drawings, a fourth modification of the second embodiment is described.

FIG. 2(b) shows the power supply potential of a memory cell in accordance with the present modification. In FIG. 2(b), a memory cell of the second embodiment is connected instead of the voltage reduction circuit shown in FIG. 2(a).

Figure 7A:
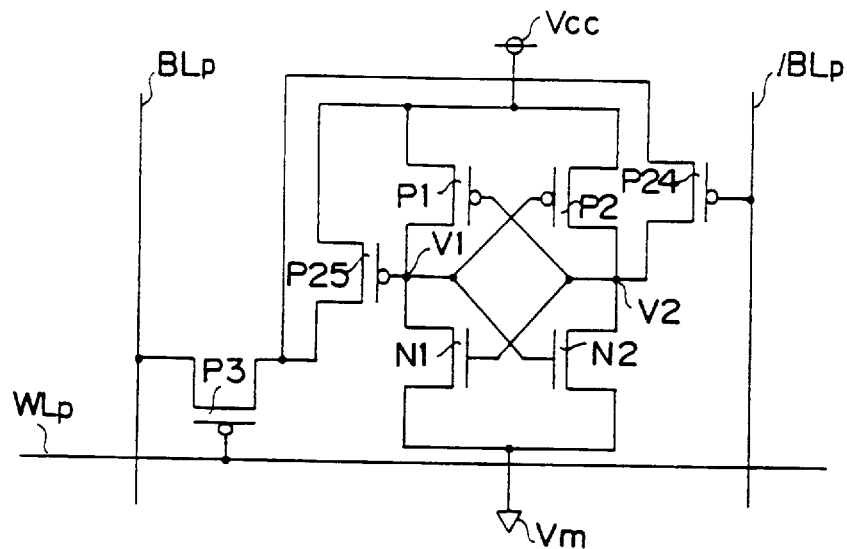
FIGS. 7(a) and (b) show circuit diagrams of the memory cell in accordance with the fourth modification of the second embodiment of the present invention.
Figure 7B:
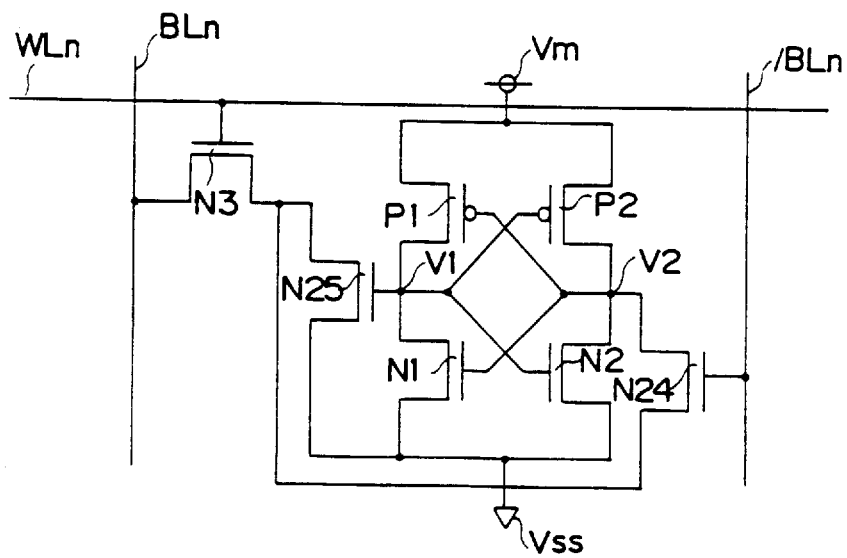

FIG. 7 is a circuit diagram of a memory cell in accordance with the present modification. FIG. 7(a) shows a memory cell which corresponds to the memory cell 2 shown in FIG. 2(b) and which is composed of transistors in conductivity-type opposition to corresponding transistors of a memory cell of the second embodiment shown in FIG. 6(a). FIG. 7(b) shows a memory cell which corresponds to the memory cell 1 shown in FIG. 2(b) and which has the same structure as the memory cell of the first embodiment shown in FIG. 6(a).

One of features of the present modification is described. The memory cell 1 is able to function with stability, since first and second load transistors P1 and P2, and first and second drive transistors N1 and N2, which are flip-flop connected, function at low voltage and since wordline WLn and bitline pair BLn, /BLn are controlled by non-reduced potential as in the second embodiment.

Likewise, the memory cell 2 is able to function with stability, since flip-flop connected transistors N1, N2 and transistors P1, P2 function at low voltage and wordline WLp and bitline pair BLp, /BLp are controlled by non-reduced potential as in the second embodiment.

Sixth power supply potential Vm is applied to the common source line and, as a result, the signal potential latch capability is decreased. Write operations with respect to the memory cells 1 and 2 can be executed at higher speed.

FIFTH MODIFICATION OF SECOND EMBODIMENT

A fifth modification of the second embodiment is described with reference to the drawings.

FIG. 4 is a schematic showing a memory cell array of the present modification.

FIG. 5 is a timing chart at the time of reading data out of a memory cell array of the fifth modification of the second embodiment.

FIG. 4(a) shows an array of memory cells shown in FIG. 6(a) arranged in a matrix with four rows and sixteen columns (4×16). WL is a wordline. BL is a bitline. /BL is a complementary bitline that becomes a control line at the time of the write operation. FIG. 4(b), FIG. 4(c) and FIG. 5 are not described (see the sixth modification of the first embodiment).

A feature of the fifth modification of the second embodiment is described. Like the sixth modification of the first embodiment, no through current flows through a memory cell coupled to a wordline in the active state, since the memory node and the bitline are disconnected. Additionally, the power used per memory cell is reduced, since memory cells, which consume no precharge power, are used. The number of wordlines can be reduced thereby reducing the access time.

THIRD EMBODIMENT

Referring now to the drawing figures, a third embodiment of the present invention is illustrated.

Figure 8A:
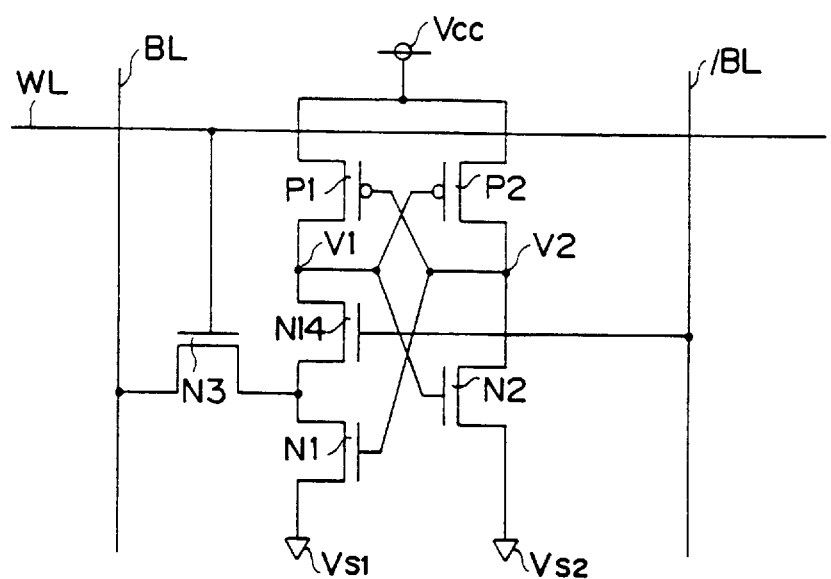
FIG. 8(a) is a circuit diagram of a memory cell in accordance with the third embodiment of the present invention and FIG. 8(b) depicts a part of a memory cell array in accordance with the first modification of the third embodiment of the present invention.
Figure 8B:
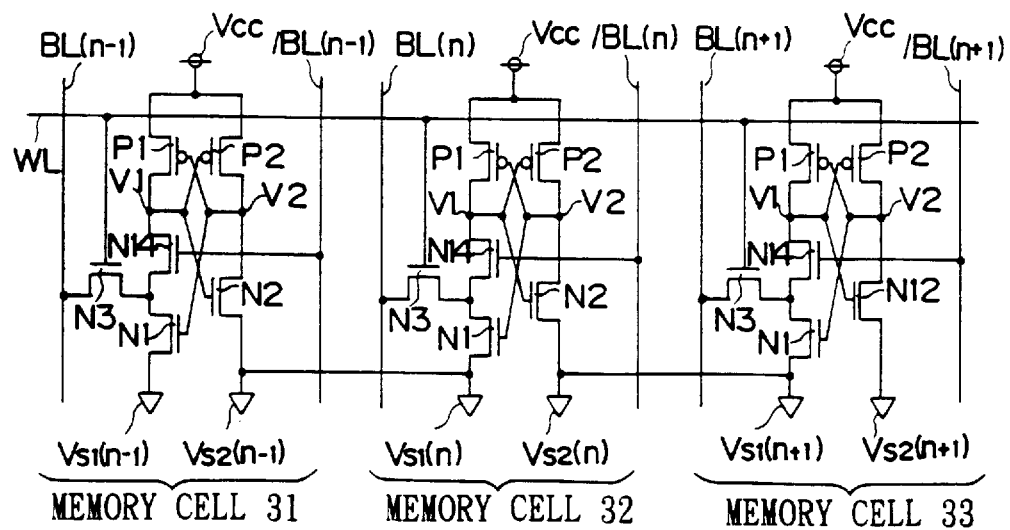

FIG. 8(a) is a circuit diagram of a memory cell in accordance with the third embodiment.

Only different points in structure from the FIG. 1(a) memory cell of the first embodiment are described. Vs1 is a third power supply to which the ground line of first drive transistor N1 is coupled. Vs2 is a fourth power supply to which the ground line of second drive transistor N2 is coupled.

Figure 9:
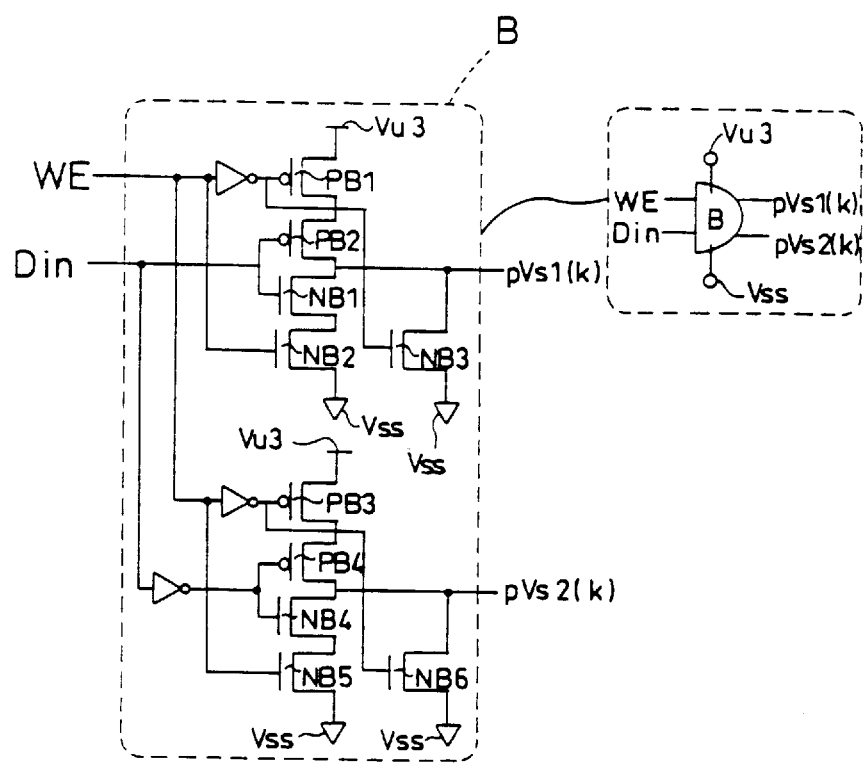
FIG. 9 is a circuit diagram of a ground line control circuit in accordance with the third embodiment (the fourth embodiment, the first modification of the fifth embodiment) of the present invention.

FIG. 9 is a circuit diagram of a ground line control circuit B in accordance with the third embodiment. WE is a write request issued by a read/write switch control circuit shown in FIG. 25. Din is write data from an input/output data control circuit shown in FIG. 25. pVs1(k) is a first multiplex pre-ground line which is coupled to the ground line selection circuit DSW2 and which is charged to third power supply potential Vs1. pVs2(k) is a second multiplex pre-ground line which is coupled to the ground line selection circuit DSW2 and which is charged to fourth power supply potential Vs2. Vu3 is a ground line control potential that is applied to first pre-ground line pVs1(k) and to second pre-ground line pVs2(k). Vss is a ground potential (i.e., a second power supply potential) that is applied to first pre-ground line pVs1(k) and to second pre-ground line pVs2(k). PB1 is a first switch of the p-type capable of the switching of application of ground line control potential Vu3 to first pre-ground line pVs1(k) according to the complementary value of write request WE. PB2 is a second switch of the p-type capable of the switching of application of ground line control potential Vu3 to first pre-ground line pVs1(k) according to write data Din. NB1 is a first switch of the n-type capable of the switching of application of second power supply potential Vss to first pre-ground line pVs1(k) according to write data Din. NB2 is a second switch of the n-type capable of the switching of application of second power supply potential Vss to first pre-ground line pVs1(k) according to write request WE. NB3 is a third switch of the n-type capable of the switching of application of second power supply potential Vss to first pre-ground line pVs1(k) according to the complementary value of write request WE. PB3 is a third switch of the p-type capable of the switching of application of ground line control potential Vu3 to second pre-ground line pVs2(k) according to the complementary value of write request WE. PB4 is a fourth switch of the p-type capable of the switching of application of ground line control potential Vu3 to second pre-ground line pVs2(k) according to the complementary value of write data Din. NB4 is a fourth switch of the n-type capable of the switching of application of second power supply potential Vss to second pre-ground line pVs2(k) according to the complementary value of write data Din. NB5 is a fifth switch of the n-type capable of the switching of application of second power supply potential Vss to second pre-ground line pVs2(k) according to write request WE. NB6 is a sixth switch of the n-type capable of the switching of application of second power supply potential Vss to second pre-ground line pVs2(k) according to the complementary value of write request WE.

The operation of the above-described ground line control circuit B is explained.

In the present embodiment, write request WE is positive logic.

The operation of the ground line control circuit B, when write request WE is at "1" (i.e., in a write mode of operation), is illustrated.

If write data Din="1", then switch PB1, switch NB1 and switch NB2 of first pre-ground line pVs1(k) close and the other switches open. As a result, first pre-ground line pVs1(k) is charged to second power supply potential Vss. Switch PB3, switch PB4 and switch NB4 of second pre-ground line pVs2(k) close and the other switches open. Second pre-ground line pVs2(k) is charged to ground line control potential Vu3.

If write data Din is "0", then switch PB1, switch PB2 and switch NB2 of first pre-ground line pVs1(k) close and the other switches open. As a result, pVs1(k) is charged to ground line control potential Vu3. On the other hand, switch PB3, switch NB4 and switch NB5 of second pre-ground line pVs2(k) close and the other switches open. As a result, pVs2(k) is charged to second power supply potential Vss.

The operation of the ground line control circuit B, when write request WE is at "0" (i.e., in a read mode of operation), is described.

If write data Din="1", then switch NB1 and switch NB3 of first pre-ground line pVs1(k) close and the other switches open. pVs1(k) is charged to second power supply potential Vss. Switch PB4 and switch NB6 of second pre-ground line pVs2(k) close and the other switches open. As a result, /pBL(k) is charged to second power supply power Vss.

If write data Din="0", then switch PB2 and switch NB3 of first pre-ground line pVs1(k) close and the other switches open. pVs1(k) is charged to second power supply potential Vss. Switch NB4 and switch NB6 of second pre-ground line pVs2(k) close and the other switches open. As a result, pvs2(k) is charged to second power supply potential Vss.

A feature of the present embodiment is described. During the write period, either Vss or Vu3, which is charged to Vs1 or to Vs2 according to Din, is generated. On the other hand, during the read period, Vss, which is charged to Vs1 or to Vs2, is generated.

The operation of a memory cell with the above-described organization is illustrated with reference to the drawing figures.

Figure 30:
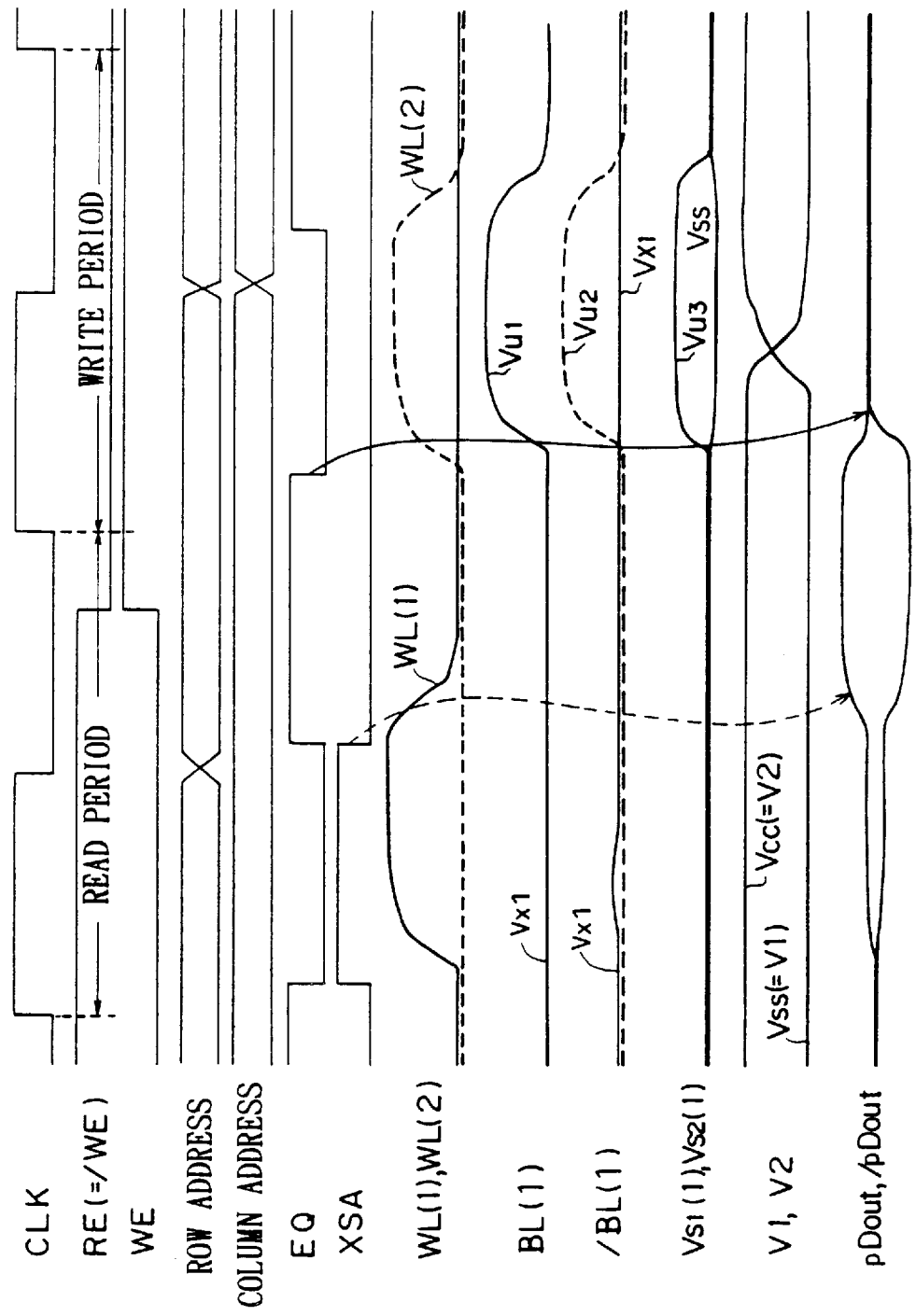
FIG. 30 is a timing chart of the operation of a memory cell in accordance with the third (fourth) embodiment of the present invention.
Figure 31:
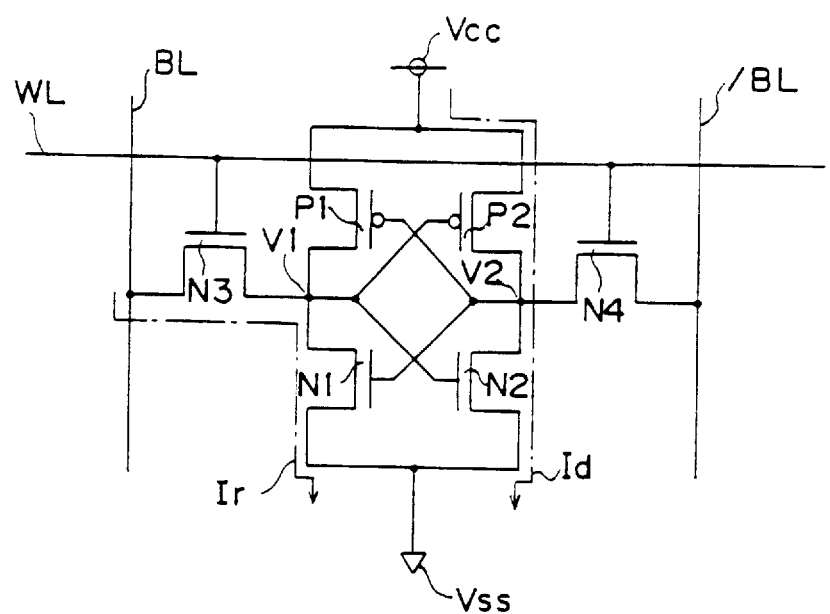
FIG. 31 is a circuit diagram of a commonly-used memory cell.

FIG. 30 is a timing chart of the operation of a memory cell of the third embodiment. Each signal is not described since they are the same as ones shown in FIG. 29.

The read operation is not described here since the FIG. 30 timing chart and the FIG. 29 timing chart show the same read operation.

Only points in the write operation differing from the first embodiment are described. Suppose that a "1" is written into first memory node V1 and a "0" is written into second memory node V2.

Wordline WL(2), which is selected by a latched address, rises. If, in the ground line control circuit B of FIG. 9, WE="1" and Din="0", then ground line control potential Vu3 and second power supply Vss occur in first pre-ground line pVs1(k) and in second pre-ground line pVs2(k), respectively.

Complementary bitline /BL(1) is charged to second high data potential Vu2. Third power supply Vs1(1) is charged to ground line control potential Vu3. Fourth power supply Vs2(1) is charged to the potential of second power supply Vss.

A voltage, which is at about the potential of first power supply Vcc, is applied to wordline WL(2) and second high data potential Vu2 is applied to complementary bitline /BL(1). First switch N3 and second switch N14, shown in FIG. 8(a), turn on.

Bitline BL and first memory node V1 are interconnected through first and second switches N3 and N14. Whereas the potential at first memory node V1 gradually approaches first high data potential Vu1, the potential at second memory node V2 gradually approaches the potential of second power supply Vss.

During the write period, second switch N14 is always in the on state and first load transistor P1 and first drive transistor N1 are in the operating state in a transient period that the potential at first memory node V1 becomes "1". As a result, a through current flows from first power supply Vcc towards third power supply Vs1. However, by setting the potential of third power supply Vs1 coupled to first memory node V1 higher than the potential of second power supply Vss, the on resistance of first drive transistor N1 is increased. This controls the through current flowing through first drive transistor N1 and the write operation can be completed quickly.

Third power supply Vs1 is charged to a potential level higher than second power supply Vss, as a result of which the signal potential latch capability of second memory node V2 is decreased. This causes first drive transistor N1 to turn off earlier than is the case with second power supply Vss and, as a result, the signal potential balance is broken fast. The rate of the write operation is further increased.

Ground line control potential Vu3 is set above several hundreds of mV and is set at a potential level below a difference between the potential of first power supply Vcc and the threshold voltage, Vt, of first drive transistor N1.

FIRST MODIFICATION OF THIRD EMBODIMENT

A first modification of the third embodiment is now described with reference to the drawing figures.

FIG. 8(a) is a circuit diagram depicting a part of a memory cell array in accordance with the first modification of the third embodiment of the present invention. In FIG. 8(a), the memory cells 31, 32, 33 in accordance with the third embodiment are coupled to the same wordline WL. Fourth power supply Vs2(n−1) of the memory cell 31 and third power supply Vs1(n) of the memory cell 32 are connected together. Fourth power supply Vs2(n) of the memory cell 32 and third power supply Vs1(n+1) of the memory cell 33 are connected together.

At the time of writing information into the memory cell 32, second switches N14 of the memory cells 31 and 33, located on both sides of the memory cell 32, are in the off state because neither complementary bitline /BL(n−1) nor complementary bitline /BL(n+1) which becomes a write control line is selected. The difference in potential between third power supply Vs1 and fourth power supply Vs2, i.e., ground line control potential Vu3, can be set above several hundreds of mV and can be set at a potential level below a difference between first power supply Vcc and the threshold voltage of first drive transistor N1 or second drive transistor N2.

The present modification is characterized in that third power supply Vs1 and fourth power supply Vs2 are shared between adjacent memory cells. This prevents increase in the number of divided ground lines and therefore no region where circuit elements are formed is sacrificed.

SECOND MODIFICATION OF THIRD EMBODIMENT

A second modification of the third embodiment is illustrated.

Like the first modification of the first embodiment, in the second modification of the third embodiment, the threshold voltage of second switch N14 is below the threshold voltage of first drive transistor N1, below the threshold voltage of second drive transistor N2, and below the threshold voltage of first switch N3.

A feature of the present modification is described. As in the first modification of the first embodiment, the threshold voltage of a MOS transistor which becomes second switch N14 is set lower than that of the other transistors so as to eliminate the need for increasing the potential of complementary bitline /BL up to Vpp that is a potential higher than that of first power supply Vcc. This provides a memory cell capable of functioning at low voltage.

THIRD MODIFICATION OF THIRD EMBODIMENT

In the third modification of the third embodiment, as in the second modification of the first embodiment, second load transistor P2 is smaller in size than first load transistor P1 and second drive transistor N2.

A feature of the present modification is described. As in the second modification of the first embodiment, first and second memory nodes V1 and V2 are separated from bitline pair BL and /BL. This arrangement secures a considerably great noise margin in a read mode of operation. Noise margin is not reduced easily and, therefore, it is possible to reduce the size of first load transistor P1 by breaking the balance of the flip-flop circuit thereby increasing the rate of the write operation.

FOURTH MODIFICATION OF THIRD EMBODIMENT

A fourth modification of the third embodiment is illustrated with reference to the drawing figures.

Figure 10:
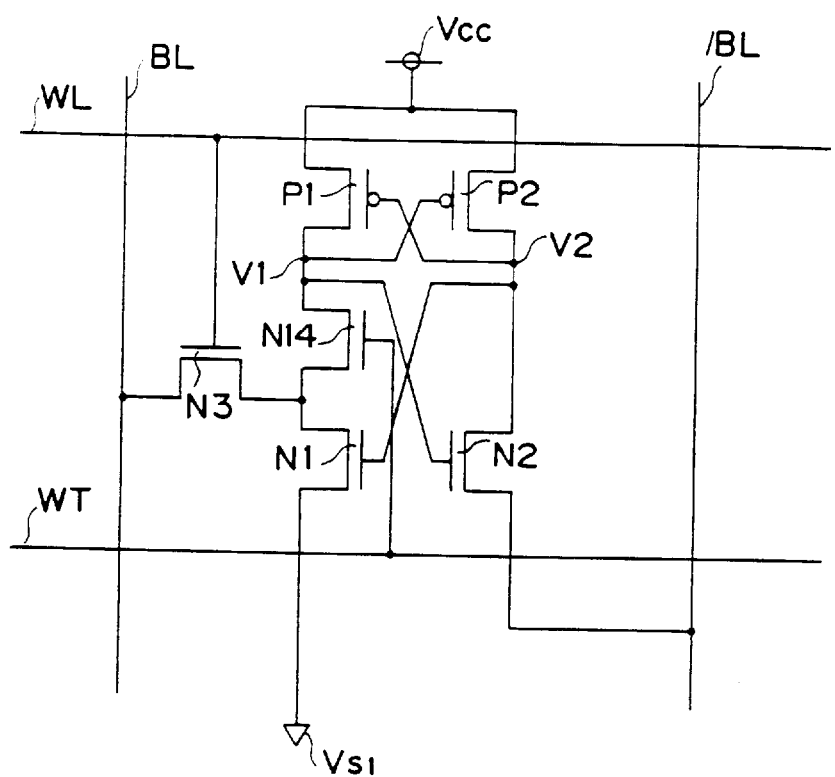
FIG. 10 is a circuit diagram of a memory cell in accordance with the fourth modification of the third embodiment of the present invention.

FIG. 10 is a circuit diagram of a memory cell according to the fourth modification of the third embodiment. Only differences from a memory cell, shown in FIG. 8(a), of the third embodiment are explained. /BL is a complementary bitline of bitline BL that is charged to the potential of fourth power supply Vs2 at the time of the write operation. WT is a write control line that becomes a write control line to be charged to second high data potential Vu2 at the time of the write operation.

The potential of second power supply Vss that is applied to fourth power supply Vs2 and ground line control circuit potential Vu3 are generated by the ground line control circuit B shown in FIG. 9. Second high data potential Vu2 is generated by a bitline control circuit A2 shown in FIG. 21(b).

The read operation and the write operation executed in accordance with the fourth modification are not described because they are the same as the read operation and the write operation executed in accordance with the third embodiment.

A feature of the present modification is described. In a write mode of operation in a case where more memory cells are connected in the column direction than in the row direction, an interconnection line of write control line WT, the potential of which undergoes a great change from the potential of second power supply Vss to second high data potential Vu2, is arranged in parallel with wordline WL. As a result of such arrangement, the number of memory cells that are coupled to write control line WT is reduced, leading to reduction of the load capacitance of write control line WT. The power consumed by memory cell is reduced and the write operation rate is increased.

When the potential of third power supply Vs1 which becomes the potential of the ground line of first drive transistor N1 is controlled by the ground line control circuit B of FIG. 9 to perform write operations, write control line WT is selected from the direction of row. As a result, bitline BL, to which a write data signal is applied, is arranged in the column direction and write control line WT, to which a write control voltage is applied, is arranged in the row direction. This makes it possible to select a target memory cell subjected to write processing. More specifically, a memory cell, located at a point where bitline BL and write control line WT intersect, is a target memory cell. Write errors of writing data into a deselected memory cell can be prevented.

FIFTH MODIFICATION OF THIRD EMBODIMENT

A fifth modification of the third embodiment is illustrated below with reference to the drawings.

Figure 11:
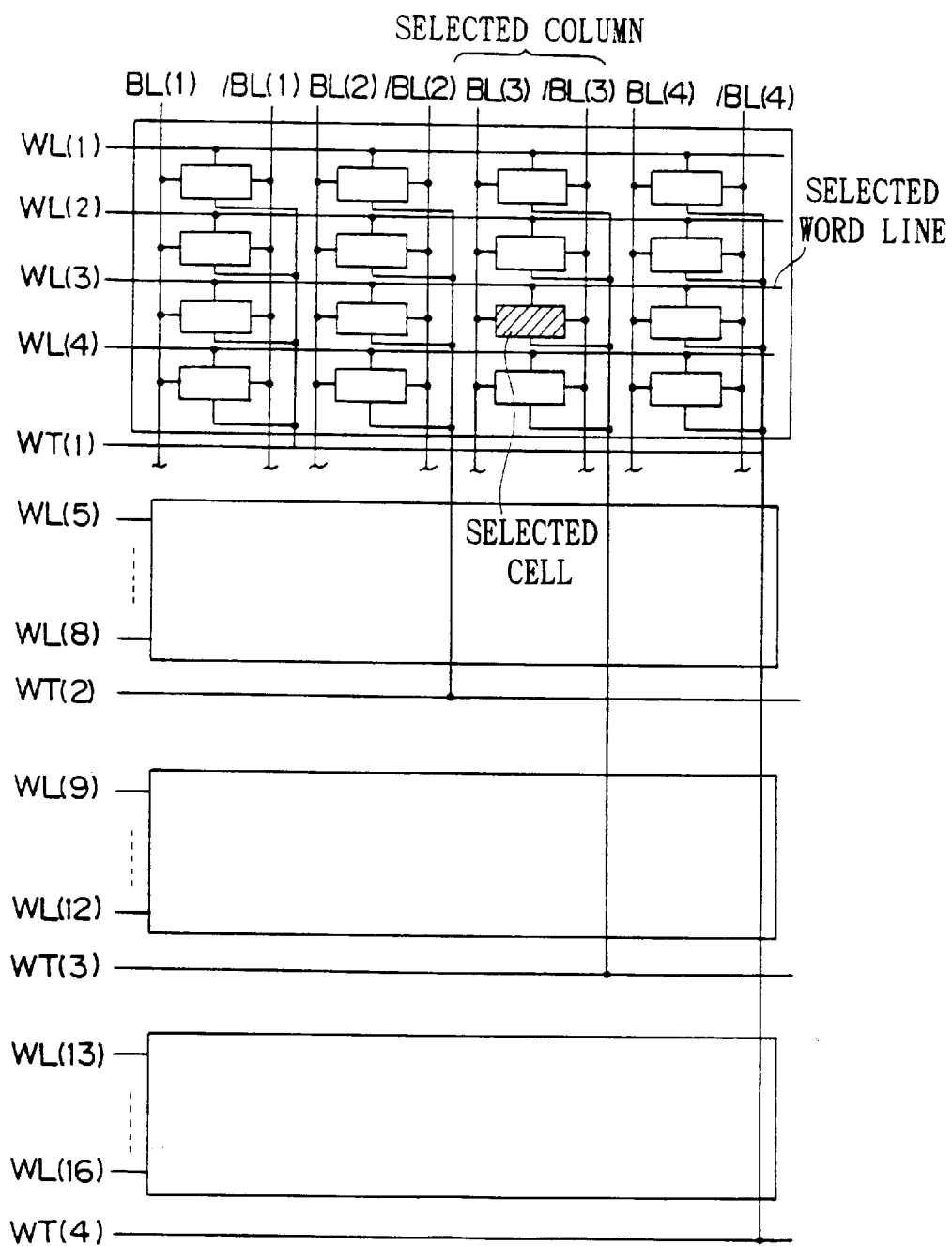
FIG. 11 is a schematic depicting a memory cell array in accordance with the fifth modification of the third embodiment (the fourth modification of the fourth embodiment) of the present invention.

FIG. 11 is a schematic depicting a memory cell array of the fifth modification of the third embodiment. FIG. 11 shows a structure in which memory cells of the fourth modification of the third embodiment (FIG. 10) are arranged in the form of an array in which one write control line WT is arranged for every four wordlines WL. The potential of write control line WT is generated by the bitline control circuit A2 of FIG. 21(b), as in the fourth modification of the third embodiment.

Suppose one selected column exists for every four columns, as shown in FIG. 11. If, in such a case, four write control lines WT are arranged against sixteen wordlines, this arrangement allows each of the four wordlines WL to be connected to four memory cells with different column addresses. As a result, only a selected memory cell becomes a unique memory cell that is simultaneously selected by both of wordline WL which becomes a wordline and write control line WT which becomes a write control line. Even if the potential of third and fourth power supplies Vs1 and Vs2 changes at the time of the write operation, write errors to deselected memory cells can be prevented.

A feature of the present modification is described. In the modification, write control line WT is not arranged at every row address where wordline WL is arranged. More specifically, the modification employs a structure that only one write control line WT is arranged for every four wordlines WL. This contributes to reducing the number of write control lines WT. Area of a semiconductor substrate where circuit elements are formed is not sacrificed due to write control line WT.

SIXTH MODIFICATION OF THIRD EMBODIMENT

A sixth modification of the third embodiment is now illustrated by means of reference to the drawing figures.

Figure 12:
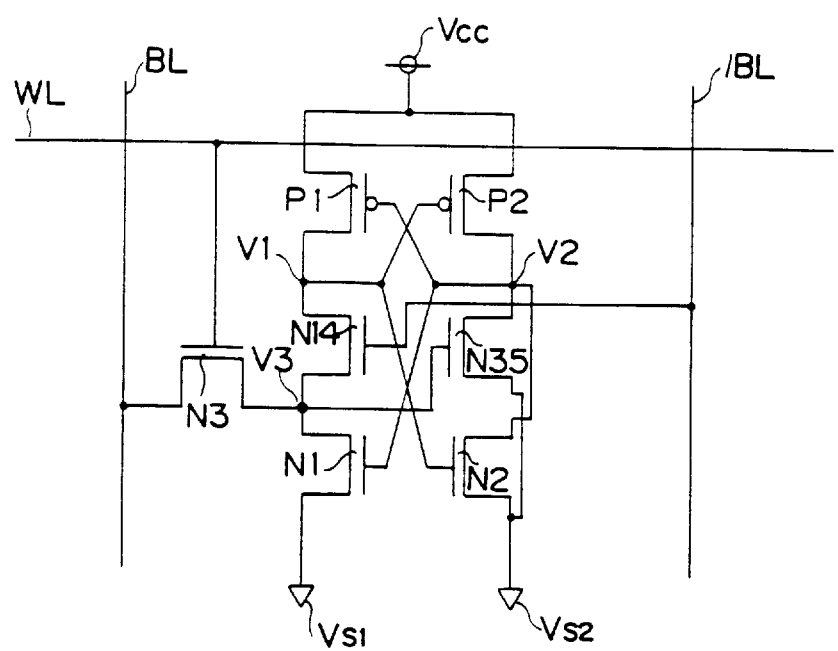
FIG. 12 is a circuit diagram of a memory cell in accordance with the sixth modification of the third embodiment of the present invention.

FIG. 12 is a circuit diagram of a memory cell of the sixth modification of the third embodiment. Only additional elements of the present memory cell (FIG. 12) to the FIG. 8(a) memory cell are described. In FIG. 12, N35 is a third switch for the purpose of increasing the rate of writing information into first memory node V1. This third switch N35 is coupled, in parallel with second drive transistor N2, between second memory node V2 and fourth power supply Vs2. Third switch N35 is controlled by bitline BL through first switch N3.

The write operation of a memory cell with the above-described structure is illustrated.

Only features of the present modification differing from the third embodiment are described. A case, in which a "1" is written into first memory node V1 and a "0" is written into second memory node V2, is explained. A voltage, which is at about the potential of first power supply Vcc, is applied to wordline WL, and second high data potential Vu2 is applied to complementary bitline /BL, whereupon both first and second switches N3 and N14 turn on.

Bitline BL and first memory node V1 are connected together through first and second switches N3 and N14. As a result, the potential at first memory node V1 gradually approaches first high data potential Vu1 generated by the bitline control circuit A1 shown in FIG. 21(a). Additionally, since the potential at first contact point V3 becomes higher than that of first memory node V1, this causes third switch N35 to start functioning earlier than second drive transistor N2. As a result, the potential at second memory node V2 abruptly approaches the potential of second power supply Vss. First drive transistor N1 abruptly stops functioning while at the same time first load transistor P1 abruptly enters the state of low impedance. The present modification achieves a faster write operation rate in relation to the third embodiment.

In the present modification, the number of transistors per memory cell increases by one. However, owing to good objective properties obtained by the present modification, there are produced no drawbacks in the layout design of components on a semiconductor substrate.

SEVENTH MODIFICATION OF THIRD EMBODIMENT

A seventh modification of the third embodiment is now illustrated below by making reference to the accompanying drawing figures.

FIG. 2(a) shows the power supply potential of a memory cell in accordance with the present modification. The present modification employs a memory cell of the third embodiment instead of using the memory cell 1 of the fourth modification of the first embodiment.

A feature of the present modification is described. Even if the transistor group, flip-flop connected, is at the potential of sixth power supply Vm that is lower than first power supply Vcc, reliable operations can be executed because in read mode bitline pair BL, /BL is charged to the potential of second power supply Vss and in write mode complementary bitline /BL is charged to about the potential of first power supply Vcc, as in the third embodiment.

Additionally, sixth power supply Vm, which is an intermediate potential between first power supply Vcc and second power supply Vss, is applied to the common source line thereby decreasing the signal potential latch capability. This increases the write operation rate.

EIGHTH MODIFICATION OF THIRD EMBODIMENT

An eighth modification of the third embodiment is illustrated.

FIG. 2(b) shows the power supply potential of a memory cell in accordance with the present modification. In FIG. 2(b), a memory cell of the third embodiment is connected instead of the voltage reduction circuit shown in FIG. 2(a).

Figure 13A:
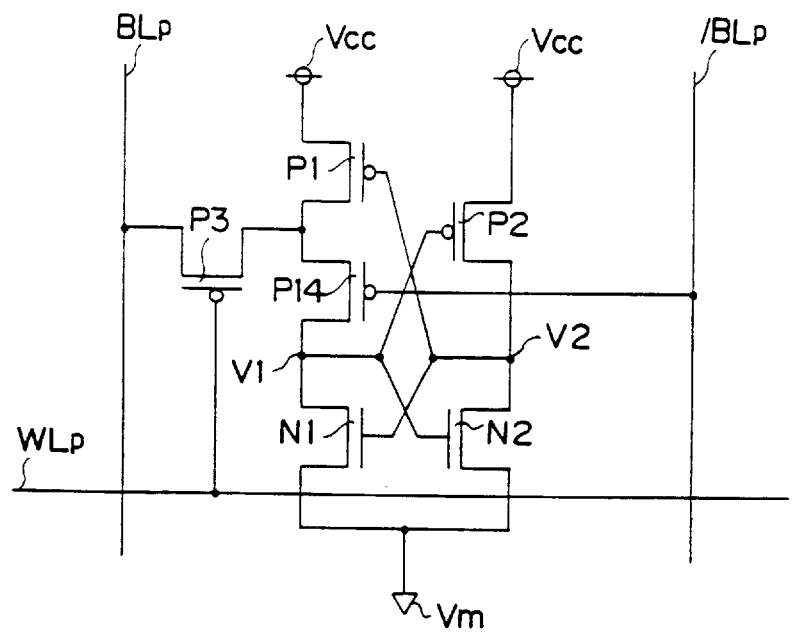
FIGS. 13(a) and (b) show circuit diagrams of the memory cell in accordance with the eighth modification of the third embodiment of the present invention.
Figure 13B:
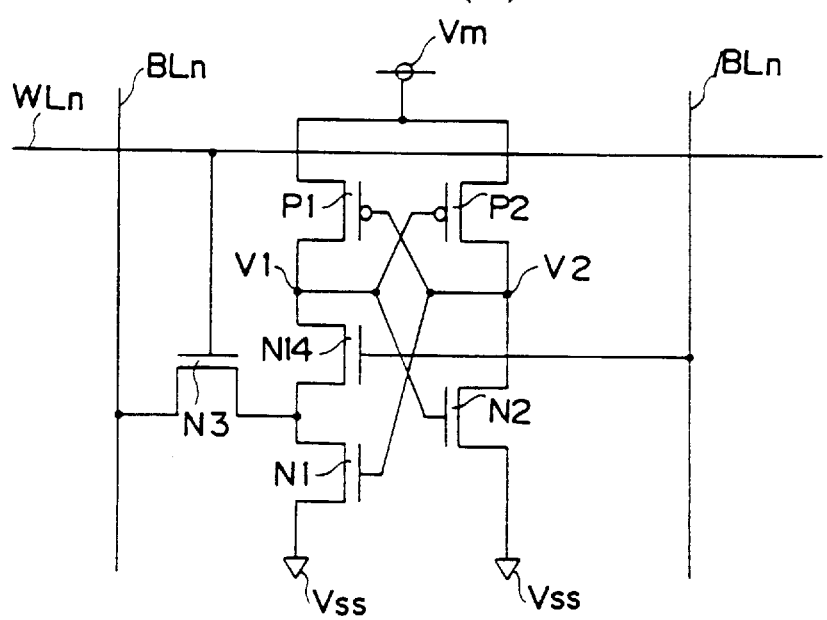

FIG. 13 is a circuit diagram of a memory cell in accordance with the present modification. FIG. 13(a) shows a memory cell which corresponds to the memory cell 2 shown in FIG. 2(b) and which is composed of transistors in conductivity-type opposition to corresponding transistors of the memory cell of the third embodiment shown in FIG. 8(a). FIG. 13(b) shows a memory cell which corresponds to the memory cell 1 shown in FIG. 2(b) and which has the same structure as the memory cell of the first embodiment shown in FIG. 8(a).

A feature of the present modification is described. As in the fifth modification of the first embodiment, the memory cell 1 is able to function with stability, since first and second load transistors P1 and P2, and first and second drive transistors N1 and N2, which are flip-flop connected, function at low voltage and since wordline WLn and bitline pair BLn, /BLn are controlled by non-reduced potential as in the third embodiment.

Likewise, the memory cell 2 is able to function with stability, since transistors N1, N2 and transistors P1, P2 function at low voltage and wordline WLp and bitline pair BLp, /BLp are controlled by non-reduced potential, as in the third embodiment.

Sixth power supply Vm is applied to the common source line and, as a result, the signal potential latch capability is decreased. This increases the rate of write operation to the memory cells 1 and 2.

NINTH MODIFICATION OF THIRD EMBODIMENT

A ninth modification of the third embodiment is illustrated.

FIG. 4 is a schematic showing a memory cell array of the present modification.

FIG. 5 is a timing chart at the time of reading data out of a memory cell array of the present modification.

FIG. 4(a) shows an array of memory cells of the third embodiment shown in FIG. 8(a) arranged in a matrix with four rows and sixteen columns. WL is a wordline. BL is a bitline. /BL is a complementary bitline that becomes a control line in write mode. FIG. 4(b), FIG. 4(c) and FIG. 5 are not described (see the sixth modification of the first embodiment).

A feature of the present modification is described. Like the sixth modification of the first embodiment, no through current flows through a memory cell coupled to a wordline in the active state, since the memory node and the bitline are disconnected. Additionally, the power used per memory cell is reduced, since memory cells, which consume no pre-charge power, are used. The number of wordlines WL can be reduced thereby reducing the access time.

FOURTH EMBODIMENT

A fourth embodiment of the present invention is now described with reference to the drawing figures.

Figure 14A:
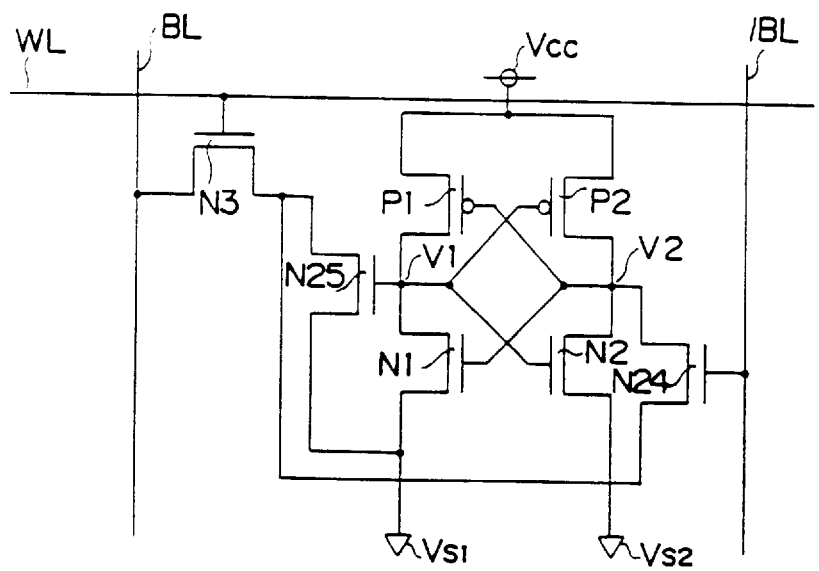
FIG. 14(a) is a circuit diagram of a memory cell in accordance with the fourth embodiment of the present invention and FIG. 14(b) is a circuit diagram showing a part of a memory cell array in accordance with the first modification of the fourth embodiment of the present invention.

FIG. 14(a) is a circuit diagram of a memory cell in accordance with the fourth embodiment. Only points of the FIG. 14(a) memory cell differing from the FIG. 6(a) memory cell of the second embodiment are described here. In FIG. 14(a), Vs1 is a third power supply to which the ground line of first drive transistor N1 is connected and Vs2 is a fourth power supply to which the ground line of second drive transistor N2 is connected.

FIG. 9 is a circuit diagram of a ground line control circuit in accordance with the fourth embodiment. The ground line control circuit of the fourth embodiment is not described since it is identical in structure with the ground line control circuit B of the third embodiment.

The operation of the present memory cell, together with the operation of the present ground line control circuit, is described.

FIG. 30 is a timing chart of the operation of a memory cell in accordance with the fourth embodiment.

The read operation is not described here since the FIG. 30 timing chart and the FIG. 29 timing chart show the same read operation.

Only differences in write operation between the present embodiment and the second embodiment are described. Suppose that a "0" is written into first memory node V1 and a "1" is written into second memory node V2.

If wordline WL(2), which is selected by a latched address, rises and If, in the ground line control circuit B of FIG. 9, write request WE="1" and write data Din="0", first pre-ground line pVs1(k) is charged to ground line control potential Vu3 while on the other hand second pre-ground line pVs2(k) is charged to second power supply potential Vss.

Complementary bitline /BL(1) is charged to second high data potential Vu2. Third power supply Vs1(1) is charged to ground line control potential Vu3. Fourth power supply Vs2(1) is charged to second power supply potential Vss.

A voltage, which is at about the potential of first power supply Vcc, is applied to wordline WL(2) and complementary bitline /BL(1) is charged to second high data potential Vu2. First switch N3 and second switch N24 each enter the on state.

Bitline BL and second memory node V2 are connected together through first switch N3. The potential at second memory node V2 gradually approaches ground potential Vx1. Additionally, because the gate electrode of first drive transistor N1 is coupled to second memory node V2, N1 stops functioning when the potential at V2 is reduced down to the threshold voltage of N1. Additionally, because the gate electrode of first load transistor P1 is coupled to second memory node V2, P1 starts functioning when the potential at V2 exceeds the threshold voltage of P1. As a result, the potential at first memory node V1 gradually approaches first power supply Vcc and the write operation is completed. Whereas the memory node subjected to write processing is first memory node V1 in the third embodiment, it is second memory node V2 in the present embodiment.

A feature of the present embodiment is described. When writing low data into first memory node V1, ground line control potential Vu3 is applied to third power supply Vs1 so as to decrease the signal potential latch capability of first memory node V1. This enables first drive transistor N1 to quickly write a data of "0" into first memory node V1.

Ground line control potential Vu3 is set above several hundreds of mV and is set at a potential level below a difference between the potential of Vcc and the threshold voltage, Vt, of first drive transistor N1.

The memory cell of the present embodiment, in which second switch N24 is not serially connected with first drive transistor N1, is useful when the noise margin is the first consideration. On the other hand, the memory cell of the third embodiment, which is formed of six transistors, is useful when the scale of integration is the first consideration.

FIRST MODIFICATION OF FOURTH EMBODIMENT

A first modification of the fourth embodiment is illustrated.

Figure 14B:
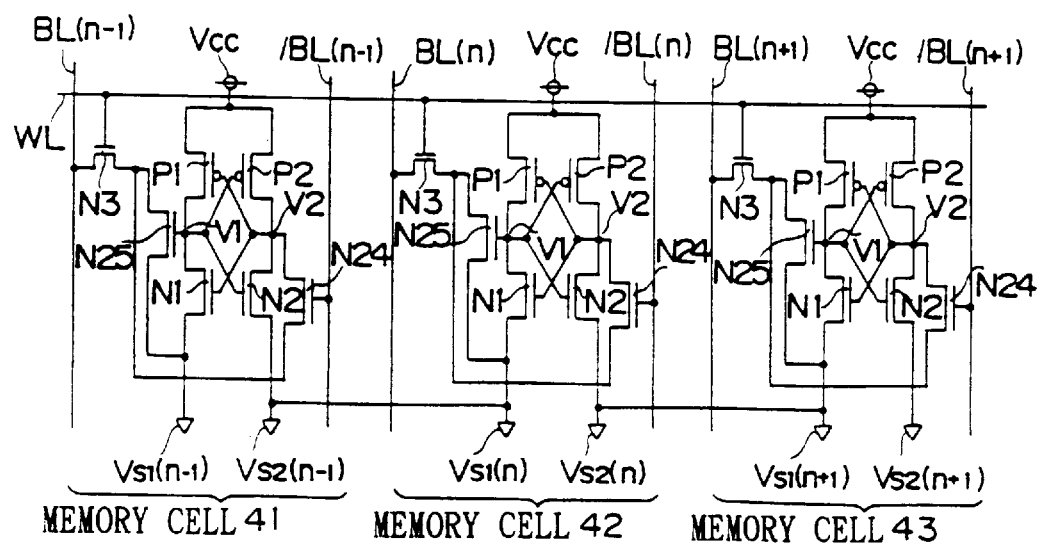

FIG. 14(b) is a circuit diagram depicting a part of a memory cell array in accordance with the first modification of the fourth embodiment. In FIG. 14(b), memory cells 41, 42, 43 in accordance with the fourth embodiment are coupled to the same wordline WL. Fourth power supply Vs2(n−1) of the memory cell 41 and third power supply Vs1(n) of the memory cell 42 are connected together. Fourth power supply Vs2(n) of the memory cell 42 and third power supply Vs1(n+1) of the memory cell 43 are connected together.

Like the first modification of the third embodiment, second switches N24 of the memory cells 41 and 43 which are located on both sides of the memory cell 42, are in the off state because neither complementary bitline /BL(n−1) nor complementary bitline /BL(n+1) which becomes a write control line is selected. The difference in potential between third power supply Vs1 and fourth power supply Vs2, i.e., ground line control potential Vu3, can be set above several hundreds of mV and can be set at a potential level below a difference between Vcc, and the threshold voltage of N1 or the threshold voltage of N2.

The present modification is characterized in that third power supply Vs1 and fourth power supply Vs2 are shared. This prevents increase in the number of divided ground lines and therefore no area of the semiconductor substrate where circuit elements are formed is sacrificed.

SECOND MODIFICATION OF FOURTH EMBODIMENT

A second modification of the fourth embodiment is described.

Like the first modification of the second embodiment, in the present modification it is arranged such that first load transistor P1 is smaller in size than second load transistor P2.

In accordance with the present modification, first and second memory nodes V1 and V2 are separated from bitline pair BL and /BL. This arrangement secures a considerably great noise margin in read mode. Noise margin is not reduced easily and, therefore, it is possible to reduce the size of first load transistor P1 by breaking the balance of the flip-flop circuit thereby increasing the rate of the write operation.

THIRD MODIFICATION OF FOURTH EMBODIMENT

Referring now to the drawings, a third modification of the fourth embodiment is described.

Figure 15A:
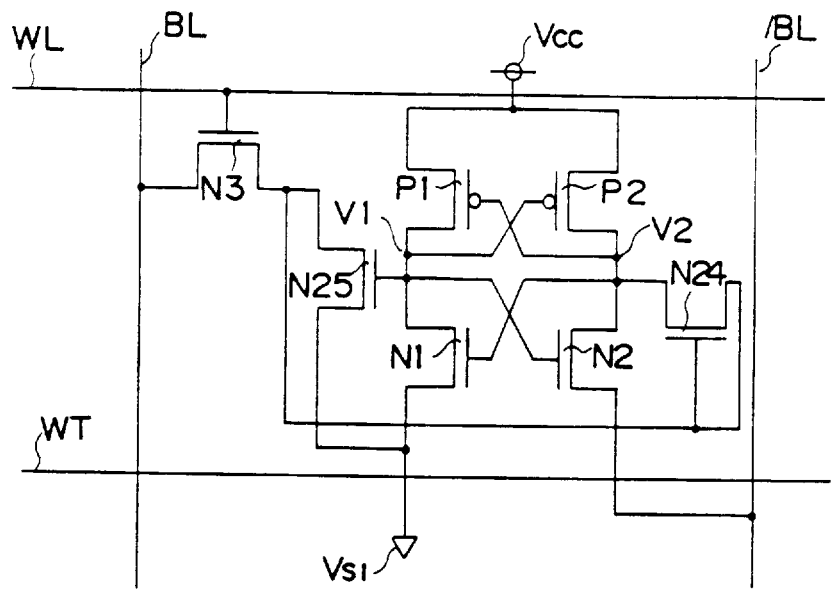
FIG. 15(a) is a circuit diagram of a memory cell in accordance with the third modification of the fourth embodiment of the present invention and FIG. 15(b) is a circuit diagram of a memory cell in accordance with the fifth modification of the fourth embodiment.

FIG. 15(a) is a circuit diagram of a memory cell in accordance with the present modification. Only points of the present modification differing from the FIG. 14(a) memory cell of the fourth embodiment are described. Complementary bitline /BL is charged to fourth power supply Vs2. WT is a write control line that is charged to second high data potential Vu2 at the write operation time.

The potential of second power supply Vss that is applied to fourth power supply Vs2 and ground line control circuit potential Vu3 are generated by the ground line control circuit B shown in FIG. 9. Second high data potential Vu2 is generated by the bitline control circuit A2 shown in FIG. 21(b).

The read operation and the write operation executed in accordance with the present modification are not described because they are the same as the read operation and the write operation executed in accordance with the fourth embodiment.

A feature of the present modification is described. As in the fourth modification of the third embodiment, in a write mode of operation in a case where more memory cells are connected in the column direction than in the row direction, the number of memory cells that are coupled to write control line WT is reduced, leading to reduction of the load capacitance of write control line WT. The power consumed by the memory cell is reduced and the write operation rate is increased. The potential of third power supply Vs1, which becomes the potential of the ground line of first drive transistor N1, is controlled by the ground line control circuit B. This makes it possible to select a target memory cell subjected to write processing. More specifically, a memory cell, located at a point where bitline BL and write control line WT intersect, is the target memory cell. Write errors of writing data into a deselected memory cell can be prevented.

FOURTH MODIFICATION OF FOURTH EMBODIMENT

A fourth modification of the fourth embodiment is now illustrated referring to the drawings.

FIG. 11 is a schematic depicting a memory cell array of the present modification. FIG. 11 shows a structure in which memory cells of the third modification of the fourth embodiment are arranged in the form of an array in which one write control line WT is arranged for every four wordlines WL. The potential of write control line WT is generated by the bitline control circuit A2 of FIG. 21(b).

As can be seen from FIG. 11, each of the four wordlines WL is connected to four memory cells with different column addresses, as in the fifth modification of the third embodiment. As a result, only a selected memory cell becomes a unique memory cell that is simultaneously selected by both of wordline WL and write control line WT. Even if the potentials of third and fourth power supplies Vs1 and Vs2 change at the time of the write operation, write errors of writing information into a deselected memory cell can be prevented.

A feature of the present modification is described. In the modification, write control line WT is not arranged at every row address where wordline WL is arranged. More specifically, the modification employs a structure that only one write control line WT is arranged for every four wordlines WL. This contributes to reducing the number of write control lines WT. Area of a semiconductor substrate where circuit elements are formed is not sacrificed due to write control line WT.

FIFTH MODIFICATION OF FOURTH EMBODIMENT

A fifth modification of the fourth embodiment is illustrated.

Figure 15B:
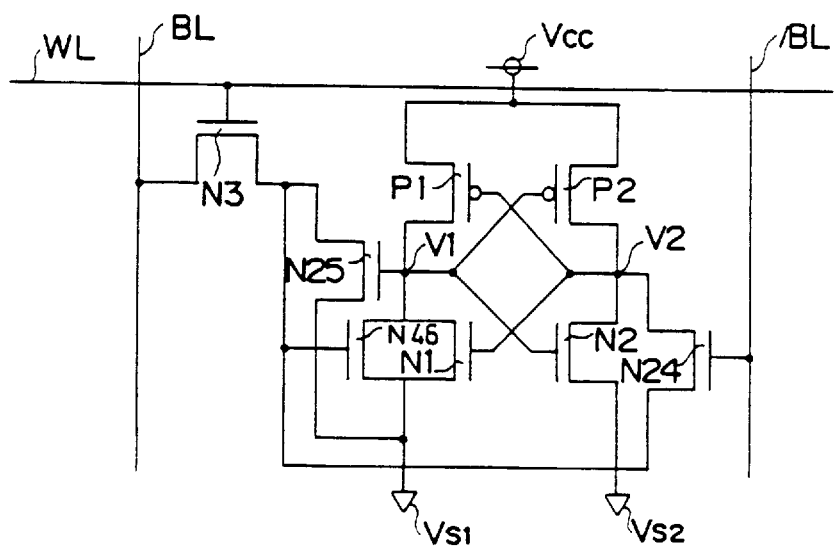

FIG. 15(b) is a circuit diagram of a memory cell in accordance with the present modification. Only additional elements of the present memory cell to the FIG. 14(a) memory cell are described. In FIG. 15(b), N46 is a fourth switch for the purpose of increasing the rate of writing information into second memory node V2. This fourth switch N46 is connected, in parallel with first drive transistor N1, between first memory node V1 and third power supply Vs1. Fourth switch N46 is controlled by bitline BL through first switch N3.

The write operation of a memory cell with the above-described structure is illustrated.

Only features of the present modification differing from the fourth embodiment are described. A case, in which a "0" is written into first memory node V1 and a "1" is written into second memory node V2, is explained. A voltage, which is at about the potential of first power supply Vcc, is applied to wordline WL, and second high data potential Vu2 is applied to complementary bitline /BL, whereupon both first and second switches N3 and N24 turn on.

Bitline BL and second memory node V2 are connected together through first and second switches N3 and N24. As a result, the potential at second memory node V2 gradually approaches first high data potential Vu1 generated by the bitline control circuit A1 shown in FIG. 21(a). Additionally, since the potential at the gate electrode of fourth switch N46 is higher than the potential at second memory node V2, this causes fourth switch N46 to start functioning earlier than first drive transistor N1. As a result, the potential at first memory node V1 abruptly approaches the potential of second power supply Vss. Second drive transistor N2 abruptly stops functioning while at the same time second load transistor P2 abruptly enters the state of low impedance. Therefore, the present modification provides a faster write operation rate in relation to the fourth embodiment.

SIXTH MODIFICATION OF FOURTH EMBODIMENT

A sixth modification of the fourth embodiment is described with reference to the drawing figures.

FIG. 2(a) shows the power supply potential of a memory cell in accordance with the sixth modification of the fourth embodiment. This modification has a structure with a memory cell of the fourth embodiment instead of the memory cell 1 of the fourth modification of the first embodiment.

The present modification is characterized as follows. Even if the transistor group, flip-flop connected, is at sixth power supply potential Vm lower than first power supply Vcc, reliable operations can be executed since bitline pair BL and /BL is charged to second power supply potential Vss in read mode and complementary bitline /BL is charged to about the potential of first power supply Vcc in write mode, as in the fourth embodiment.

Additionally, because sixth power supply potential Vm, which is an intermediate potential between first power supply potential Vcc and second power supply Vss, is applied to the common source line of the memory cell, the signal potential latch capability is decreased thereby increasing the write operation rate.

SEVENTH MODIFICATION OF FOURTH EMBODIMENT

Referring now to the drawings, a seventh modification of the fourth embodiment is described.

FIG. 2(b) shows the power supply potential of a memory cell in accordance with the seventh modification of the fourth embodiment. In FIG. 2(b), a memory cell of the fourth embodiment is connected instead of the voltage reduction circuit shown in FIG. 2(a).

Figure 16A:
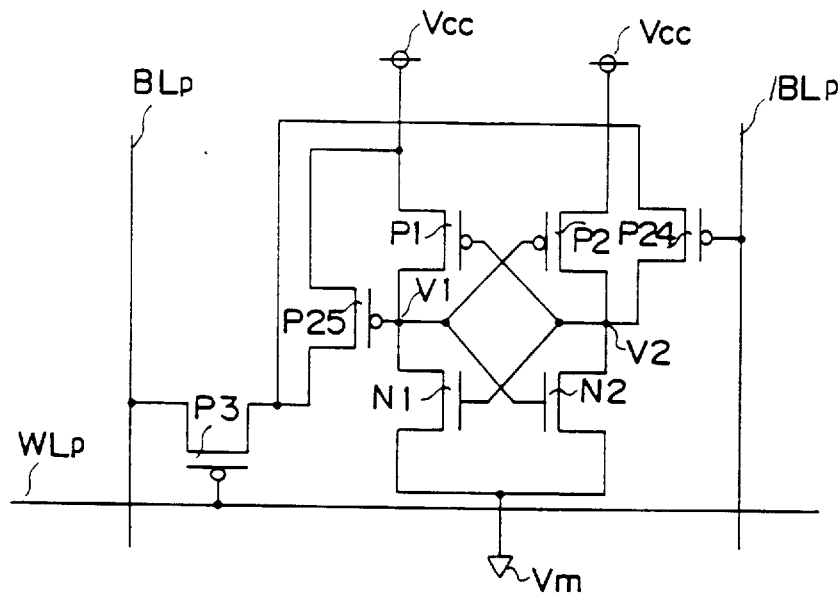
FIGS. 16(a) and (b) show circuit diagrams of the memory cell in accordance with the seventh modification of the fourth embodiment of the present invention.
Figure 16B:
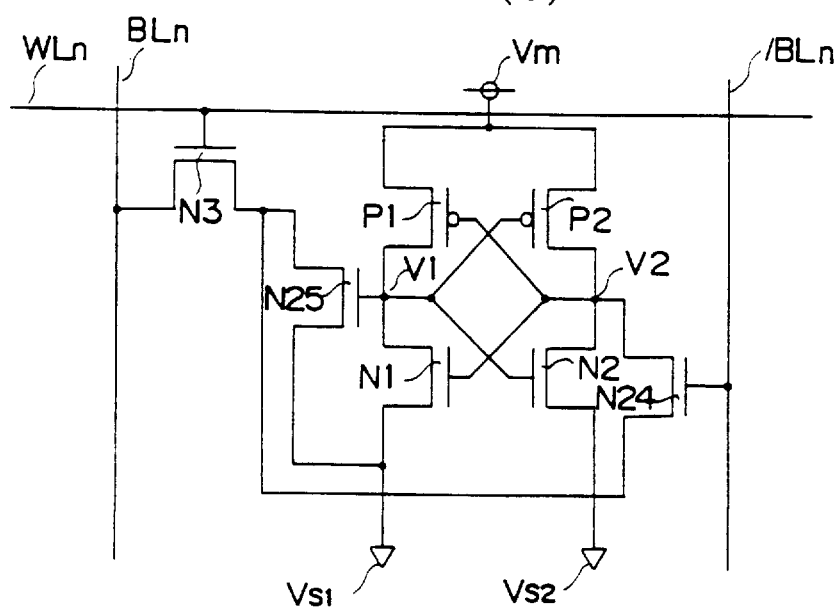

FIG. 16 is a circuit diagram of a memory cell in accordance with the seventh modification of the fourth embodiment. FIG. 16(a) shows a memory cell. which corresponds to the memory cell 2 shown in FIG. 2(b) and which is composed of transistors in conductivity-type opposition to corresponding transistors of the memory cell of the fourth embodiment shown in FIG. 14(a). FIG. 16(b) shows a memory cell which corresponds to the memory cell 1 shown in FIG. 2(b) and which has the same structure as the memory cell of the fourth embodiment shown in FIG. 14(a).

One of features of the present modification is described. As in the eighth modification of third embodiment, the memory cell 1 is able to function with stability, since load transistors P1 and P2, and drive transistors N1 and N2, which are flip-flop connected, function at low voltage and since wordline WLn and bitline pair BLn, /BLn are controlled by non-reduced potential as in the fourth embodiment.

Likewise, the memory cell 2 is able to function with stability, since transistors N1, N2 and transistors P1, P2 function at low voltage and wordline WLp and bitline pair BLp, /BLp are controlled by non-reduced potential as in the fourth embodiment.

Sixth power supply potential Vm is applied to the common source line and, as a result, the signal potential latch capability is decreased. This increases the rate of writing information into the memory cells 1 and 2.

EIGHTH MODIFICATION OF FOURTH EMBODIMENT

An eighth modification of the fourth embodiment is described with reference to the drawings.

FIG. 4 is a schematic showing a memory cell array of the eighth modification of the fourth embodiment.

FIG. 5 is a timing chart at the time of reading data out of a memory cell array of the eighth modification of the fourth embodiment.

FIG. 4(a) shows an array of memory cells shown in FIG. 14(a) arranged in a matrix with four rows and sixteen columns. WL is a wordline. BL is a bitline. /BL is a complementary bitline that becomes a control line at the time of the write operation. FIG. 4(b), FIG. 4(c) and FIG. 5 are not described (see the sixth modification of the first embodiment).

A feature of the present modification is described. Like the sixth modification of the first embodiment, no through current flows through a memory cell coupled to a wordline in the active state, since the memory node and the bitline are disconnected. Additionally, the power used per memory cell is reduced, since memory cells, which consume no precharge power, are used. The number of wordlines can be reduced thereby reducing the access time.

FIFTH EMBODIMENT

A fifth embodiment of the present invention is described with reference to the drawing figures.

Figure 17A:
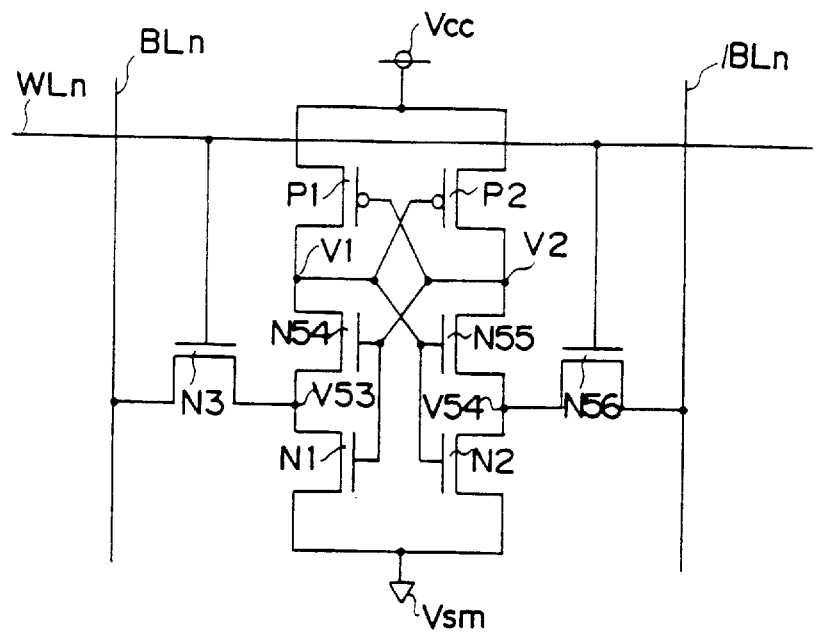
FIG. 17(a) is a circuit diagram of a memory cell in accordance with the fifth embodiment (the second modification of the fifth embodiment) of the present invention and FIG. 17(b) is a circuit diagram of a memory cell in accordance with the second modification of the fifth embodiment of the present invention.

FIG. 17(a) is a circuit diagram of a memory cell in accordance with the fifth embodiment. Only differences in structure between the FIG. 17(a) memory cell and the FIG. 28 memory cell are described. N54 is a second switch which is controlled by the potential at second memory node V2 and which disconnects first memory node V1 and bitline BL. N55 is a third switch which is controlled by the potential at first memory node V1 and which disconnects second memory node V2 and complementary bitline /BL. N56 is a fourth switch which enables, when wordline WL is made active, the writing of information by complementary bitline /BL into second memory node V2. Vsm is a fifth power supply which becomes a reference potential for driving memory cells. V53 is a first contact point of first drive transistor N1 and first switch N3. V54 is a second contact point of second drive transistor N2 and third switch N55.

Second switch N54 is serially coupled between first load transistor P1 and first drive transistor N1. Third switch N55 is serially coupled between second load transistor P2 and second drive transistor N2.

First and second drive transistors N1 and N2 form a pair. Second and third switches N54 and N55 form a pair. First and second load transistors P1 and P2 form a pair. These transistors are flip-flop connected.

First memory node V1 is coupled to first load transistor P1 and is also coupled, through second switch N54 and first drive transistor N1, to fifth power supply Vsm.

Second memory node V2 is coupled to second load transistor P2 and is also coupled, through third switch N55 and second drive transistor N2, to fifth power supply Vsm.

Figure 19A:
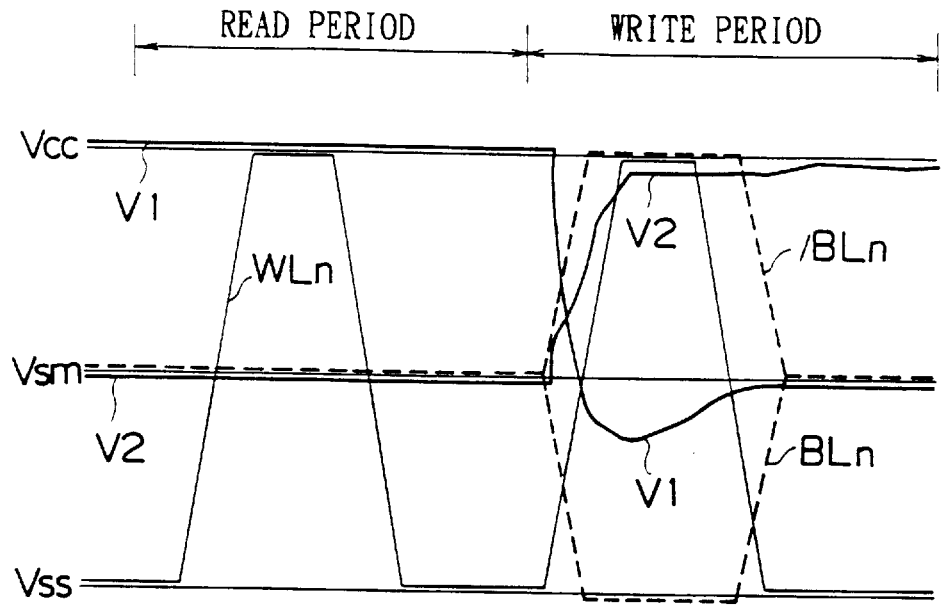
FIG. 19(a) is a timing chart of the operation of a memory cell in accordance with the fifth embodiment of the present invention and FIG. 19(b) is a timing chart of the operation of a memory cell in accordance with the second modification of the fifth embodiment of the present invention.

The operation of a memory cell with the above-described structure is illustrated. FIG. 19(a) is a timing chart of the operation of the memory cell. Vcc is a first power supply potential for controlling memory cell read/write operations. Vss is a second power supply potential which becomes a ground potential for controlling memory cell read/write operations. Vsm is a fifth power supply potential which becomes a reference potential which is approximately ½ of Vcc for controlling memory cell read/write operations. V1 is a first memory node potential. V2 is a second memory node potential. WLn is a wordline potential. BLn is a bitline potential. /BLn is a complementary bitline potential.

The write period operation of a memory cell of the present embodiment is illustrated.

Suppose a situation in which a "1", i.e., the potential of first power supply Vcc, is held at first memory node V1 and a "0", i.e., the potential of fifth power supply Vsm, is held at second memory node V2. The description is made focusing attention on the memory cell, for the operation of each control circuit of the memory cell is the same as described in the first embodiment.

The potential of wordline WLn rises and both first and fourth switches N3 and N56 turn on. This establishes connection between first contact point V53 and bitline BLn and connection between second contact point V54 and complementary bitline /BLn.

Because second memory node V2 is at the potential of fifth power supply Vsm, first drive transistor N1 is not in the full functional state and bitline BLn is coupled to fifth power supply Vsm at high impedance. On the other hand, because complementary bitline /BLn is coupled to second contact point V54 and second drive transistor N2 is in the full functional state, complementary bitline /BLn is coupled to fifth power supply Vsm, at lower impedance in relation to bitline BLn. Therefore, the difference in electric characteristic between BLn and /BLn depends only upon the data held in first memory node V1 and appears as an impedance characteristic difference. Therefore, stable read operations can be executed.

A feature of the present embodiment is described. First memory node V1 and bitline BLn are disconnected by second switch N54, resulting in preventing the potential at first memory node V1 from going up in read mode. No through current flows from first power supply Vcc to fifth power supply Vsm by way of second drive transistor N2. This not only achieves stable read operations but also avoids unnecessary power consumption.

Unlike the conventional technique, the signal potential of data held is not read out as a potential difference between BLn and /BLn in the present embodiment. Additionally, both bitline BLn and bit complementary line /BLn are charged to ground potential. This eliminates the need for supplying precharge power.

In accordance with the present embodiment, it is sufficient that the lowest voltage to be secured as a read current used for impedance detection falls in a range that can be detected as the BL–/BL impedance characteristic difference. In other words, such a lowest voltage is a voltage at which first and second drive transistors N1 and N2 function (i.e., the threshold voltage of the transistors). This achieves low-voltage operations.

The write-period operation of the present memory cell is described.

Suppose a case in which a "0" is written into first memory node V1 and a "1" is written into second memory node V2.

Wordline WLn, selected by a latched address, rises (see the write period of FIG. 19(a)). Complementary bitline /BLn is charged to the potential of first power supply Vcc and bitline BLn is charged to the potential of second power supply Vss.

A voltage, which is at about the potential of first power supply Vcc, is applied to wordline WLn and both first switch N3 and fourth switch N56 turn on.

Complementary bitline /BLn, shown in FIG. 17(a), and second memory node V2 are connected together through third switch N55 that is made active because first memory node V1 which holds first power supply potential Vcc and the gate electrode of N55 are connected. As a result, the potential at second memory node V2 gradually approached the potential of first power supply Vcc.

Second switch N54, the gate of which is associated with second memory node V2, commences functioning when the potential at the gate electrode exceeds the threshold voltage of N54. Bitline BLn, which is charged to a potential level lower than the potential of fifth power supply Vsm referred to as a reference potential of "0", is brought into connection with first memory node V1 through first and second switches N3 and N54, and, as shown in FIG. 19(a), the potential at first memory node V1 gradually exceeds fifth power supply potential Vsm to approach second power supply potential Vss. At the same time, because the gate electrode of first drive transistor N1 is connected to second memory node V2, transistor N1 starts functioning when the potential at the gate electrode exceeds its threshold voltage. First memory node V1 is brought into connection with fifth power supply Vsm. Additionally, because the gate electrode of first load transistor P1 is connected to second memory node V2, transistor P1 stops functioning when the potential at the gate electrode exceeds the threshold voltage. As a result, first memory node V1 is cut off from first power supply Vcc.

Further, because the gate electrodes of second drive transistor N2 and third switch N55 are coupled to first memory node V1, transistor N2 and switch N55 stop functioning when the potential at the gate electrodes drops down to a potential level lower than the threshold voltage. As a result, second memory node V2 is disconnected from fifth power supply Vsm. Additionally, because the gate electrode of second load transistor P2 is coupled to first memory node V1, transistor P2 starts functioning when the potential at the gate electrode drops down to a potential level lower than the threshold voltage. As a result, second memory node V2 is connected to first power supply Vcc, and the write operation is completed.

The present embodiment is characterized in that the operation of writing a "0" can be carried out at high speed since bitline BL is charged to the potential of second power supply Vss which is lower than that of fifth power supply Vsm (the reference potential of "0") and, therefore, the operation of writing a complementary value, i.e., "1", can likewise be carried out at high speed.

Because of the fact that fifth power supply Vsm, which is connected to the common ground line of first drive transistor N1 and second drive transistor N2 which are cross-coupled transistors, is approximately ½ of the first power supply potential Vcc, the signal potential latch capability of first and second drive transistors N1 and N2 drops. This further increases the write operation rate.

FIRST MODIFICATION OF FIFTH EMBODIMENT

A first modification of the fifth embodiment is illustrated with reference to the drawings.

Figure 18:
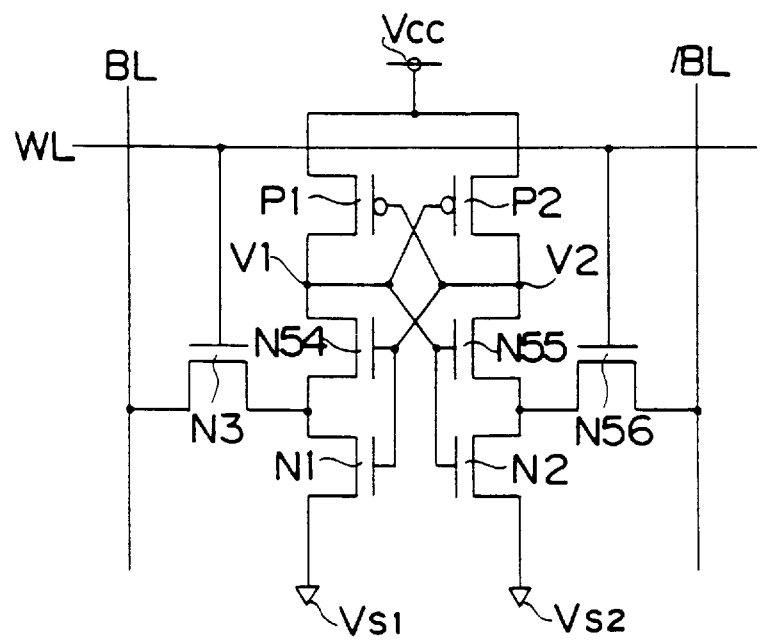
FIG. 18 is a circuit diagram of a memory cell in accordance with the first modification of the fifth embodiment of the present invention.

FIG. 18 is a circuit diagram of a memory cell in accordance with the first modification of the fifth embodiment. Only differences in structure between the FIG. 17(a) memory cell of the fifth embodiment and the FIG. 18 memory cell of the present modification are described. Vs1 is a third power supply to which the ground line of first drive transistor N1 is connected. Vs2 is a fourth power supply to which the ground line of second drive transistor N2 is connected.

FIG. 9 is a circuit diagram of a ground line control circuit of the first modification of the fifth embodiment. This ground line control circuit is not described since it is the same as the one employed in the third embodiment and as the one employed in the fourth embodiment.

A memory cell with the above-described structure is explained.

The read operation of the present modification is not described here since it is the same as the read operation of the fifth embodiment. With regard to the write operation, only differences between the fifth embodiment and the present modification are explained.

Suppose that a "0" and a "1" are written into first and second memory nodes V1 and V2, respectively.

Word line WL, selected by a latched address, rises. If, in the ground line control circuit B shown in FIG. 9, write request WE="1" and write data Din="1", second power supply potential Vss occurs in first pre-ground line pVs1(k) and ground line control potential Vu3 occurs in second pre-ground line pVs2(k).

As a result, complementary bitline /BL is charged to the potential of first power supply Vcc, third power supply Vs1 is charged to the potential of second power supply Vss and fourth power supply Vs2 is charged to ground line control potential Vu3.

A voltage, which is at about the potential of first power supply Vcc, is applied to wordline WL thereby turning both first switch N3 and fourth switch N56 on.

As in the fifth embodiment, complementary bitline /BLn and second memory node V2 are connected together through third switch N55 in the active state. As a result, the potential at second memory node V2 gradually approaches the potential of first power supply Vcc.

Additionally, bitline BL, which is charged to the potential of second power supply Vss which is the reference potential of "0", is connected to first memory node V1 through first switch N3 and third switch N55, and as a result, the potential at first memory node V1 gradually approaches second power supply Vss.

A feature of the present modification is described. Because second load transistor P2, third switch N55 and second drive transistor N2 are functioning in a transient period of the write period that the potential at second memory node V2 becomes "1", as in the fifth embodiment. As a result, a through current flows from Vcc towards Vs2. However, by setting the potential of Vs2 coupled to node V2 higher than the potential of Vss (the ground potential), the on resistance of transistor N2 increases. This controls through current flowing through transistor N2 and the write operation rate is improved.

Ground line control potential Vu3 is set above several hundreds of mV and is set at a potential level below a difference between the potential of Vcc and the threshold voltage of transistor N2, Vt.

SECOND MODIFICATION OF FIFTH EMBODIMENT

A second modification of the fifth embodiment is now illustrated by reference to the drawings.

Figure 17B:
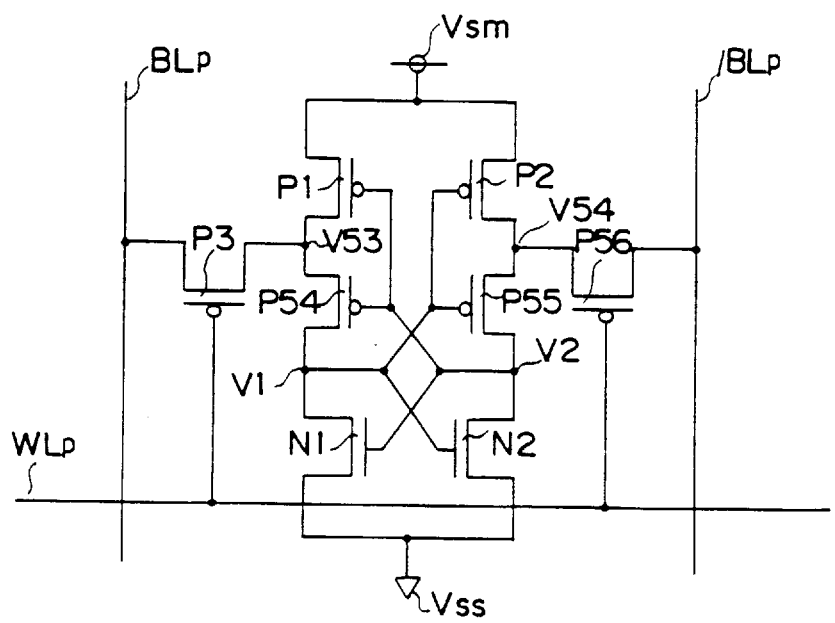

FIG. 17 is a circuit diagram of a memory cell in accordance with the second modification of the fifth embodiment. A memory cell, shown in FIG. 17(a), is not described since it is identical with the fifth embodiment's memory cell. In FIG. 17(b), Vsm is a fifth power supply acting as a reference potential. The potential of Vsm is approximately ½ the potential of first power supply Vcc for driving memory cells. Vss is a second power supply that becomes a ground potential for driving memory cells. The FIG. 17(b) memory cell is composed of transistors in conductivity-type opposition to corresponding transistors of the FIG. 17(a) memory cell.

The second modification of the fifth embodiment employs a 2-stage structure in which a memory cell of FIG. 17(a) and a memory cell of FIG. 17(b) are connected in series in 2-stage fashion.

The operation of the memory cell of the present modification is described by reference to the drawings.

Figure 19B:
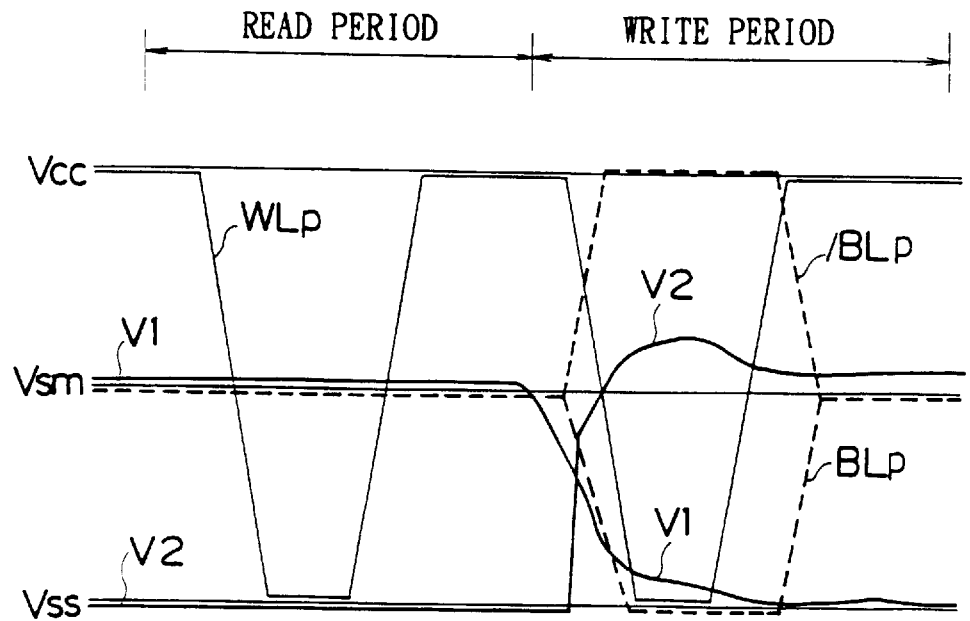

FIG. 19(a) is a timing chart of the operation of a memory cell of the present modification shown in FIG. 17(a). FIG. 19(b) is a timing chart of the operation of a memory cell of the present modification shown in FIG. 17(b).

The read/write operation of the memory cell of FIG. 17(a) is not described, for it is identical with that of the fifth embodiment.

The timing chart of the FIG. 19(b) memory cell is negative logic, so that it shows that, in read mode, a "0" is held in first memory node V1 and a "1" is held in second memory node V2. On the other hand, in write mode a "1" is written into first memory node V1 and a "0" is written into second memory node V2.

The read/write operation of the memory cell shown in FIG. 17(b) is identical with that of the fifth embodiment except that the drive transistors, since they are of the p-type, are driven by second power supply potential Vss (ground potential).

A feature of the present modification is described. Like the fifth modification of the first embodiment, in the FIG. 17(a) memory cell, even if the drive voltage of the transistor groups composed of N1, N2, N54, N55, P1 and P2 is Vsm that is about ½ of Vcc, wordline WL is charged to Vcc and bitline pair BLn, /BLn is charged to Vsm in a read mode of operation. On the other hand, because, in a write mode of operation, wordline WLn is charged to Vcc as in the first embodiment, voltages, which are applied to bitline BLn and to complementary bitline /BLn, are increased or decreased by ½ of Vcc with respect to the potential of Vsm that becomes a reference potential, and the difference in potential therebetween is in effect charged to Vcc as in the first embodiment. The memory cell of the present modification is able to function with stability.

The transistors of the FIG. 17(b) memory cell are in conductivity-type opposition with the transistors of the FIG. 17(a) memory cell and therefore the drive/control potential of each transistor is inverted. Like the FIG. 17(a) memory cell, the FIG. 17(b) memory cell is able to function with stability.

THIRD MODIFICATION OF FIFTH EMBODIMENT

A third modification of the fifth embodiment is described below with reference to the drawings.

FIG. 17(a) is a circuit diagram of a memory cell in accordance with the third modification of the fifth embodiment. The FIG. 17(a) memory cell has the same structure as the fifth embodiment's memory cell.

The present modification aims at increasing the operation rate by adjusting the setting values of the threshold voltage of individual transistors.

For instance, the threshold voltage of each transistor is represented by "Vt(transistor's name)" and each transistors's threshold voltage is set as follows.

$Vtp(P1)=Vtp(P2)=-0.5$ V $Vtn(N54)=Vtn(N55)=0.5$ V $Vtn(N1)=Vtn(N2)=0.1$ V $Vtn(N3)=Vtn(N56)=0.1$ V

As a result of such setting of the threshold voltage, first drive transistor N1 and first switch N3, which determine the read operation rate, can be activated quickly thereby increasing the read operation rate.

Further, stand-by current, which is dissipated even when neither read operation nor write operation is executed, can be held below microampere, even for the case of mass storage systems of the megabyte class, since the threshold voltage of second switch transistor N2 and third switch transistor N55 is set high, 0.5 volt.

For the case of the inverted-type memory cell shown in FIG. 17(b), each transistor threshold voltage may be set as follows.

$Vtn(N1)=Vtn(N2)=0.5$ V $Vtp(P54)=Vtp(P55)=-0.5$ V $Vtp(P1)=Vtp(P2)=-0.2$ V $Vtp(P3)=Vtp(P56)=-0.2$ V

FOURTH MODIFICATION OF FIFTH EMBODIMENT

A fourth modification of the fifth embodiment is illustrated with reference to the drawings.

Figure 20A:
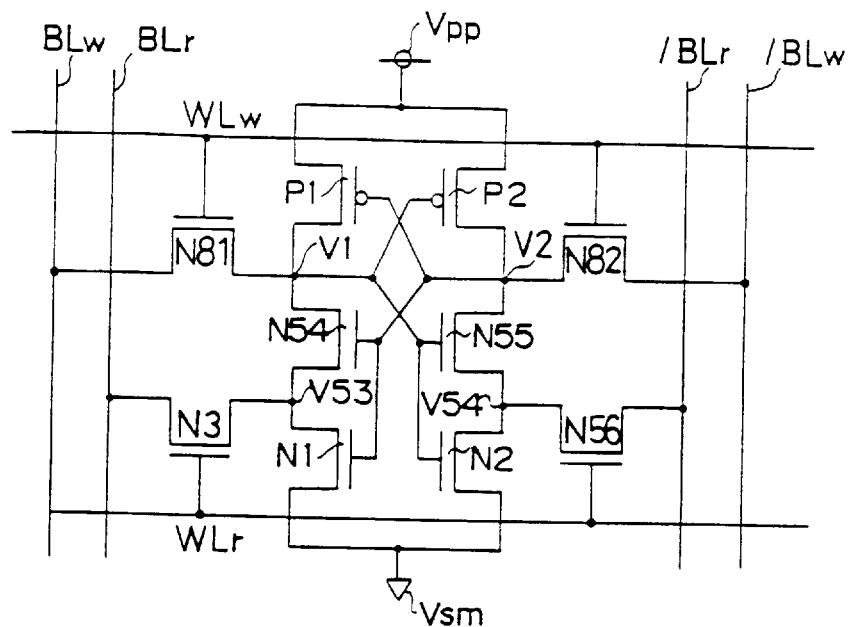
FIGS. 20(a) and (b) are circuit diagrams of the memory cell in accordance with the fourth modification of the fifth embodiment.

FIG. 20(a) is a circuit diagram of a memory cell in accordance with the fourth modification of the fifth embodiment. Only additional elements of the present modification to the FIG. 17(a) memory cell are described. BLr is a bitline that acts as a first control line dedicated to the read operation. /BLr is a complementary bitline that acts as a second control line dedicated to the read operation. WLr is a wordline that acts as a third control line dedicated to the read operation. BLw is a bitline that acts as a first control line dedicated to the write operation. /BLw is a complementary bitline that acts as a second control line dedicated to the write operation. WLw is a wordline that acts as a third control line dedicated to the write operation. N81 is a fifth switch which is dedicated to the write operation, which is made active by wordline WLw and which is serially coupled between bitline BLw and first memory node V1. N82 is a sixth switch which is dedicated to the write operation, which is made active by wordline WLw and which is serially coupled between complementary bitline /BLw and second memory node V2.

The memory cell of the present modification is a 2-port SRAM cell so that read operation and write operation can be executed simultaneously.

Also in the present modification, it is possible to increase the operation rate by adjusting the setting values of the threshold voltage of individual transistors. For instance, each transistor's threshold voltage may be set as follows.

$Vtp(P1)=Vtp(P2)=-0.5$ V $Vtn(N54)=Vtn(N55)=0.5$ V $Vtn(N1)=Vtn(N2)=0.1$ V $Vtn(N3)=Vtn(N56)=0.1$ V $Vtn(N81)=Vtn(N82)=0.1$ V

The memory cell of the present modification is characterized in that (i) first switch N3 and first drive transistor N1 are connected in series, (ii) fourth switch N56 and second drive transistor N2 are connected in series, (iii) fifth switch N81 and first memory node V1 are connected together and (iv) sixth switch N82 and second memory node V2 are connected together.

As a result of such structure arrangement and threshold voltage setting, (i) first memory node V1, and first contact point V53 that is brought in connection with bitline BLr at the time of the read operation are disconnected from each other and (ii) second memory node V2, and second contact point V54 that is brought into connection with complementary bitline /BLr at the time of the read operation are disconnected from each other. This makes it possible to aim at increasing the write operation rate while increasing static noise margins at the time of the read operation.

Figure 20B:
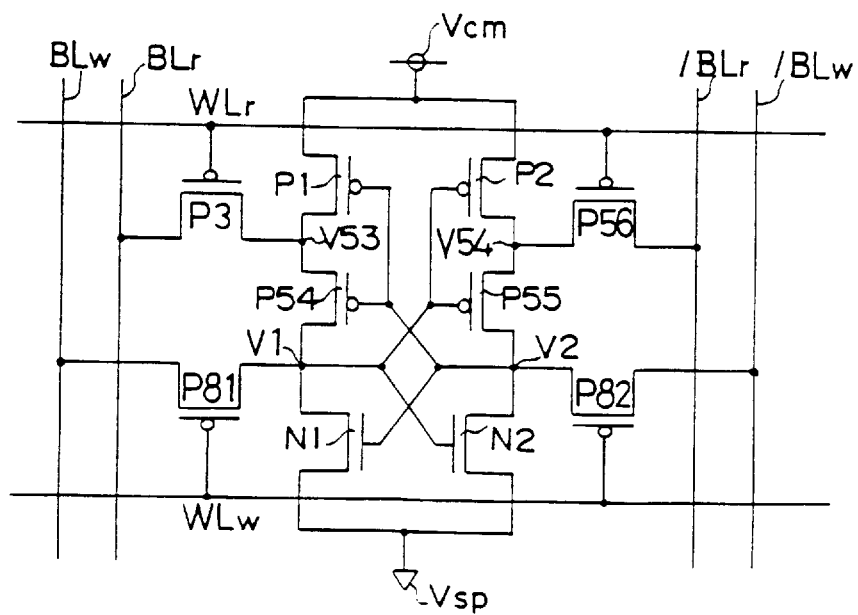

For the case of the inverted-type memory cell shown in FIG. 20(b), each transistor threshold voltage may be set as follows.

$Vtn(N1)=Vtn(N2)=0.5$ V $Vtp(P54)=Vtp(P55)=-0.5$ V $Vtp(P1)=Vtp(P2)=-0.2$ V $Vtp(P3)=Vtp(P56)=-0.2$ V $Vtp(P81)=Vtp(P82)=-0.2$ V

SIXTH EMBODIMENT

A sixth embodiment of the present invention is described with reference to the drawings.

Figure 21A:
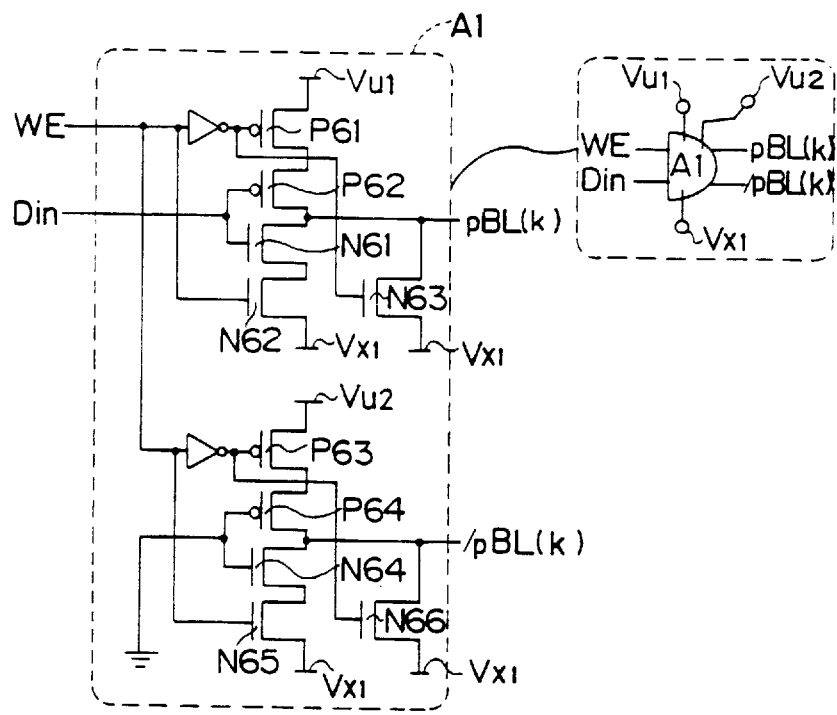
FIG. 21(a) is a circuit diagram of a bitline control circuit in accordance with the sixth embodiment of the present invention and FIG. 21(b) is a circuit diagram of a bitline control circuit in accordance with the first modification of the sixth embodiment of the present invention.

FIG. 21(a) is a circuit diagram of a bitline control circuit A1 in accordance with the sixth embodiment. WE is a write request from the read/write switch control circuit shown in FIG. 25. Din is write data from the input/output data control circuit shown in FIG. 25. pBL(k) is a multiplex pre-bitline for the application of voltage to bitline BL of the memory cell through the bitline selection circuit DSW1. /pBL(k) is a multiplex complementary pre-bitline for the application of voltage to complementary pre-bitline /BL through the bitline selection circuit DSW1. Vu1 is a first high data potential that is applied to pre-bitline pBL(k). Vu2 is a second high data potential that is applied to complementary pre-bitline /BL. Vx1 is a ground potential that is applied either to pre-bitline pBL(k) or to complementary pre-bitline /pBL(k). P61 is a first switch of the p-type capable of the switching of application of Vu1 according to the complementary value of WE. P62 is a second switch of the p-type capable of the switching of application of Vu1 according to Din. N61 is a first switch of the n-type capable of the switching of application of Vx1 according to Din. N62 is a second switch of the n-type capable of the switching of application of Vx1 according to WE. N63 is a third switch of the n-type capable of the switching of application of Vx1 according to the complementary value of WE. P63 is a third switch of the p-type capable of the switching of application of Vu2 according to the complementary value of WE. P64 is a fourth switch of the p-type that always opens since its gate electrode is grounded. N64 is a fourth switch of the n-type that always opens since its gate electrode is grounded. N65 is a fifth switch of the n-type capable of the switching of application of Vx1 according to WE. N66 is a sixth switch of the n-type capable of the switching of application of Vx1 according to the complementary value of WE.

The operation of the above-described bitline control circuit A1 is illustrated.

As shown either in FIG. 29 or in FIG. 30, write request WE is positive logic.

The operation of the bitline control circuit A1, when write request WE is "1" (i.e., in write mode), is illustrated.

If write data Din="1", then first p-type switch P61, first n-type switch N61 and second n-type switch N62 of pre-bitline pBL(k) close and the other switches open. As a result, pBL(k) is charged to ground potential Vx1. Third p-type switch P63 and fourth p-type switch P64 of complementary pre-bitline /pBL(k) close and the other switches open. As a result, /pBL(k) is charged to second high data potential Vu2. A "0" is written to a memory node of the memory cell subjected to write processing by Vx1 which is applied to pre-bitline pBL(k).

If write data Din is "0", then first p-type switch P61, second p-type switch P62 and second n-type switch N62 of pre-bitline pBL(k) close and the other switches open. pBL(k) is charged to first high data potential Vu1. On the other hand, third p-type switch P63 and fourth p-type switch P64 of complementary pre-bitline /pBL(k) close and the other switches open. As a result, /pBL(k) is charged to second high data potential Vu2. Vu1, which is applied to pre-bitline pBL(k), is charged to Vcc or to its increased potential, Vpp. As a result, a "1" is written into a target memory node.

The operation of the bitline control circuit A1, when write request WE is "0" (i.e., in read mode), is described.

If write data Din="1", then first n-type switch N61 and third n-type switch N63 of pre-bitline pBL(k) close and the other switches open. Pre-bitline pBL(k) is charged to ground potential Vx1. On the other hand, fourth p-type switch P64 and sixth n-type switch N66 of complementary pre-bitline /pBL(k) close and the other switches open. As a result, complementary pre-bitline /pBL(k) is charged to ground potential Vx1. Accordingly, both pBL(k) and /pBL(k) are at the ground potential by Vx1 during the read period.

If Din="0", then second p-type switch P62 and third n-type switch N63 of pre-bitline pBL(k) close and the other switches open. pBL(k) is charged to Vx1. On the other hand, fourth n-type switch N64 and sixth n-type switch N66 of complementary pre-bitline /pBL(k) close and the other switches open. As a result, complementary pre-bitline /pBL(k) is charged to Vx1.

Accordingly, pre-bitline pBL(k) and complementary pre-bitline /pBL(k) are at the ground potential by Vx1 during the read period.

A feature of the present embodiment is described. During the write period, Vx1 or Vu1, which is applied to bitline BL and becomes write data, is generated and Vu2, which is applied to complementary bitline /BL, is generated. On the other hand, during the read period, Vx1, which is applied to bitline pair BL, /BL, is generated.

The bitline control circuit A1 of the present embodiment may be applicable in the memory cells of from the first embodiment to the fourth embodiment of the present invention, except for the fourth and fifth modifications of the third embodiment and the third and fourth modifications of the fourth embodiment.

MODIFICATION OF SIXTH EMBODIMENT

A modification of the sixth embodiment is described by making reference to the drawings.

Figure 21B:
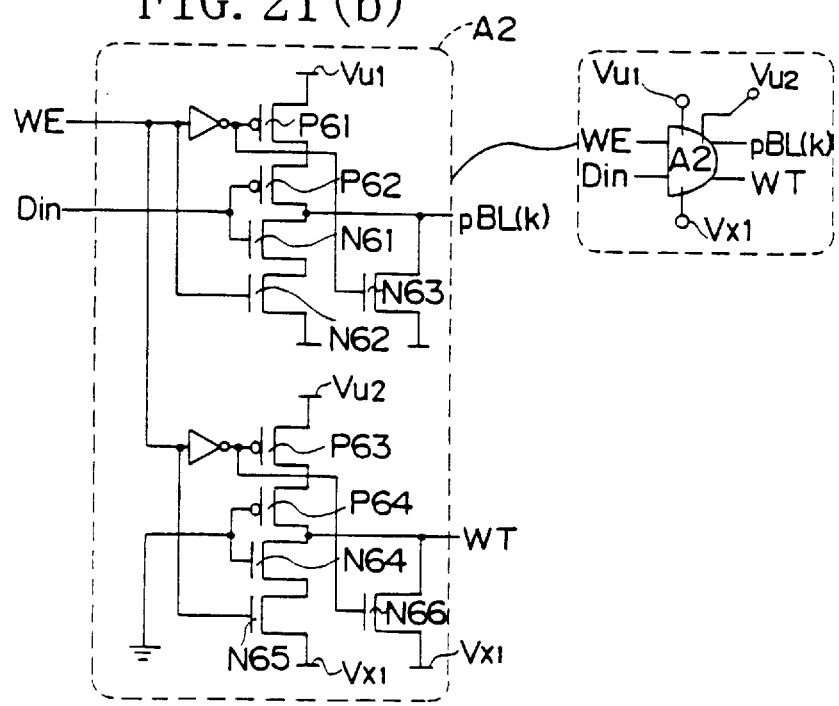

FIG. 21(b) is a bitline control circuit in accordance with the present modification. Only differences between the FIG. 21(b) circuit of the present modification and the FIG. 21(a) circuit are described. WT is a replacement for complementary pre-bitline /pBL(k) of FIG. 21(a) and becomes a write control line acting as a second control line in the memory cells of the fourth and fifth modifications of the third embodiment and the third and fourth modifications of the fourth embodiment.

The bitline control circuit A2 of the present modification is not described since its operation is identical with that of the bitline control circuit A1 of the sixth embodiment.

SEVENTH EMBODIMENT

A seventh embodiment of this invention is now described below.

Figure 22A:
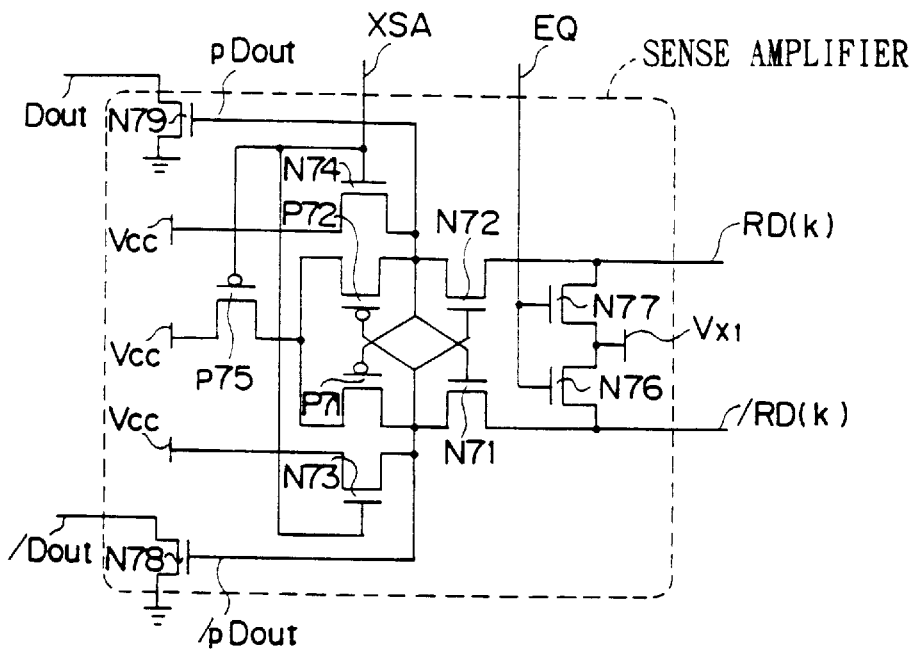
FIG. 22(a) is a circuit diagram of a sense amplifier in accordance with the seventh embodiment of the present invention.
Figure 22B:
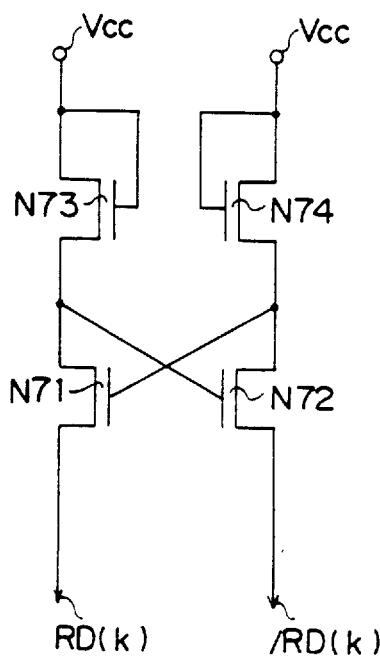
FIG. 22(b) is a circuit diagram of an equivalent circuit to the sense amplifier in the first half of the read period and FIG. 22(c) is a circuit diagram of an equivalent circuit to the sense amplifier in the second half of the read period.

FIG. 22(a) is a circuit diagram of a sense amplifier in accordance with the seventh embodiment. RD(k) is a common data line for receiving, in a read mode of operation, data on bitline BL(n) decoded by the column decoder, from the selection circuit DSW3 shown either in FIG. 28(a) or in FIG. 28(b). /RD(k) is a common data reference line for receiving data on complementary bitline /BL(n) decoded by the column decoder, from the selection circuit DSW3. XSA is a sense amplifier activation signal which is made active only during the first half of the read period and which becomes a trigger for the detection of the impedance of common data line RD(k) and common data reference line /RD(k). EQ is a bitline equalization signal which is made active only during the second half of the read period, which performs conversion of the impedance characteristic difference into a potential difference and which becomes a trigger for precharging bitline pair BL(n), /BL(n) to the ground potential. Vcc is a first power supply for the operation of the sense amplifier. Vx1 is a ground potential for the operation of the sense amplifier as well as for precharging bitline pair BL(n), /BL(n). P71 is a first load transistor of a first inverter. P72 is a second load transistor of a second inverter which makes a pair with first load transistor P71. N71 is a first drive transistor of the first inverter. N72 is a second drive transistor of the second inverter which makes a pair with first drive transistor N71. N73 is a third transistor which is made active by XSA to establish connection between Vcc and /RD(k). N74 is a fourth transistor which is made active by XSA to establish connection between Vcc and RD(k). P75 is a fifth transistor which is made active by a complementary signal of XSA to establish connection between Vcc and the common source electrode of first and second load transistors N71 and N72. N76 is a first switch which is made active by EQ to charge /RD(k) to Vx1. N77 is a second switch which is made active by EQ to charge RD(k) to Vx1. pDout is the output from the sense amplifier which performs conversion of an impedance characteristic difference of RD(k) into the potential difference. /pDout is the reference output from the sense amplifier which performs conversion of an impedance characteristic difference of /RD(k) into a potential difference. N78 is a sixth transistor which converts pDout into an adequate potential. N79 is a seventh transistor which converts /pDout into an adequate potential. Dout is read data which is transferred to the I/O data control circuit shown in FIG. 25. /Dout is read reference data which is transferred to the I/O data control circuit shown in FIG. 25.

Figure 28B:
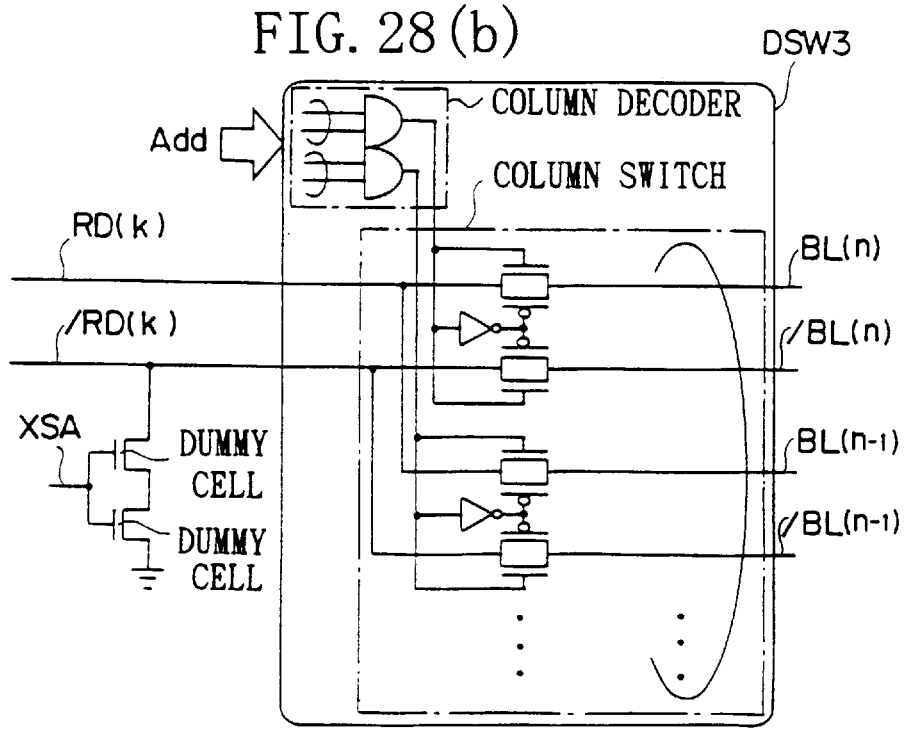

As shown in FIG. 28(b), dummy cells are coupled to RD(k) so that, during a period that XSA is activated, the potential of /RD(k) (the reference potential of RD(k)) is intermediate between Vcc and Vss.

The operation of the above-described sense amplifier is illustrated below. Whereas the direction in which each signal of FIG. 29 rises is called "HIGH", the direction in which each signal falls is called "LOW". In the first half of the read period, XSA becomes HIGH and EQ becomes LOW. Circuitry of such a situation is shown in the form of an equivalent circuit of FIG. 22(b).

In FIGS. 22(a) and (b), like elements are assigned like reference numerals. RD(k) is coupled to a bitline BL selected by selection circuit DSW3 shown in FIG. 28(a), and /RD(k) is coupled to a complementary bitline /BL selected by selection circuit DSW3.

In this way, electric current for the detection of impedance is supplied by the present sense amplifier, only to a selected bitline pair.

The potential of pDout and /pDout (the sense amplifier's output pair) is determined by the resistance ratio of N73 and N74, and N71 and N72. Accordingly, selected BL and RD(k) are connected at low impedance (ground level), and selected /BL and /RD(k) are not connected at low impedance, in other words selected /BL is in the state of floating. In such a case, even when both BL and /BL are charged to the ground potential, the amount of current flowing through RD(k) at low impedance is greater than the amount of current flowing through /RD(k) at high impedance. The potential of pDout becomes lower than that of /pDout because the drop in voltage increases. As can be seen from FIG. 29, the difference in potential between pDout and /pDout is very small.

In the second half of the read period (FIG. 29), XSA becomes LOW and EQ becomes HIGH. Circuitry of such a situation is shown in the form of an equivalent circuit of FIG. 22(c).

Figure 22C:
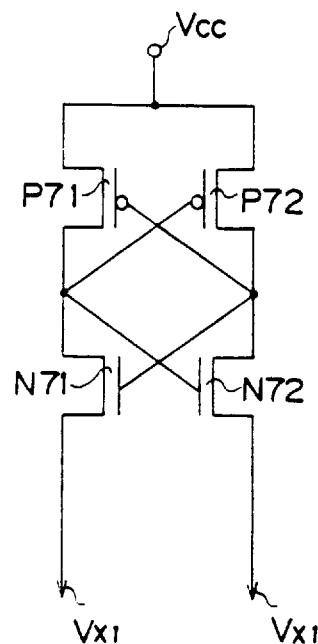

In FIGS. 22(c) and (a), like elements are assigned like reference numerals. Referring to FIG. 22(c), a flip-flop circuit, composed of first and second load transistors P71, P72 and first and second drive transistors N71 and N72, is activated and the potential of output pair pDout, /pDout is converted into a potential of complementary MOS level. As can be seen from FIG. 29, a potential difference of pDout and /pDout in the second half of the read period is amplified.

Additionally, by application of Vx1 to RD(k) and to /RD(k), electric charges, injected for the detection of impedance, are discharged.

Only in the fourth modification of the third embodiment and in the third modification of the fourth embodiment, /RD(k) is charged to Vs2 (the potential of fourth power supply Vs2).

A feature of the present embodiment is described. In the first half of the read operation, current for the detection of impedance is supplied from the sense amplifier, only to a bitline pair BL, /BL selected by the column decoder of the selection circuit DSW3. A current difference between BL and /BL caused by third and fourth transistors N73 and N74 is detected to produce a potential difference to pDout and to /pDout. In the second half of the read operation, the potential differences are amplified by the flip-flop circuit so as to generate a desirable read data pair Dout, /Dout and the injected charges are discharged wherein the selected bit line pair BL and /BL is at the ground level.

In accordance with the SICD of the present invention, the bitline precharge potential, which is an obstacle to achieving low power dissipation, is at the ground potential. As a result of such arrangement, a low-power SICD is achieved by the present invention. Additionally, in order to inhibit loss of potential at the memory node due to the fact that the bitline precharge potential is at the ground potential, the bitline and the memory node are disconnected by a switch transistor. Accordingly, it becomes possible to suppress through current flowing through the memory cell in read mode.

Additionally, because the reading of signal potential can be executed by supplying an electric current just capable of the detection of impedance, to a selected memory cell from the sense amplifier. This not only holds power dissipation low but also increases the read operation rate.

Since potential is applied to the source line of a memory cell in such a direction that the signal potential latch capability of memory node is decreased, this increases the write operation rate.

What is claimed is:

1. A semiconductor integrated circuit device comprising:
   (a) an array of memory cells arranged in a matrix with rows and columns;
      said memory cell including a transistor pair of a first and a second transistor with respective gate electrodes and respective drain electrodes cross-coupled;
   (b) source potential variation means for changing the source electrode potential of one of said transistor pair that is in a higher ON state in relation to the other of said transistor pair, to decrease the absolute value of the gate-source voltage difference of said transistor in said higher ON state.

2. A semiconductor integrated circuit device according to claim 1 wherein said transistor pair share a source electrode.

3. A semiconductor integrated circuit device according to claim 1 wherein said transistor pair have separate source electrodes.

4. A semiconductor integrated circuit device according to claim 3 wherein said source potential variation means changes the source electrode potential of one of said transistor pair that is in a higher OFF state in relation to the other of said transistor pair, to increase the absolute value of the gate-source voltage difference of said transistor in said higher OFF state.

5. A semiconductor integrated circuit device according to claim 4,
   wherein:
   (a) said first transistor of said memory cell is a first drive transistor with a drain electrode coupled to a first memory node and said second transistor of said memory cell is a second drive transistor with a drain electrode coupled to a second memory node in complementary relationship with said first memory node;
   (b) said memory cell comprises a first load transistor and a second load transistor in which gate electrodes and source electrodes of said first and second transistors are cross-coupled;
      one of source or drain electrodes of said first load transistor being coupled to a first power supply;
      the other of said source or drain electrodes of said first load transistor being coupled to said first memory node;
      one of source or drain electrodes of said second load transistor being couple to said first power supply;

the other of said source or drain electrodes of said second load transistor being coupled to said second memory node;
(c) said source potential variation means is a ground line control circuit;
said source potential variation means applying a ground line control potential to a third power supply and applying the potential of said second power supply to a fourth power supply when writing an opposite signal potential to that of said source or drain electrode of said first drive transistor into said first memory node;
said source potential variation means applying the potential of said second power supply to said third power supply and applying said ground line control potential to said fourth power supply when writing a signal potential identical with that of said source or drain electrode of said first drive transistor into said first memory node.

6. A semiconductor integrated circuit device according to claim 1,
wherein:
(a) said memory cell array has a first control line and a second control line for controlling memory cells in said columns of said memory cell array;
(b) a first potential is applied to said first control line and to said second control line in a read mode of operation of reading data from a selected memory cell of said matrix; and
(c) a bitline control circuit is provided which applies either said first potential or a second potential to said first control line, and applying a third potential to said second control line in a write mode of operation of writing data into a selected memory cell of said memory cell array.

7. A semiconductor integrated circuit device according to claim 6,
said memory cell comprising:
(a) a first switch transistor which is serially coupled between said second memory node and said first control line and which is controlled by a third control line wherein one of source or drain electrodes of said first switch transistor is coupled to said first control line; and
(b) a second switch transistor which is controlled by said second control line in which one of source or drain electrodes of said second switch transistor is coupled to said first memory node while the other of said source or drain electrodes of said second switch transistor is coupled to the other of said source or drain electrodes of said first switch transistor;
wherein:
said second switch transistor is serially coupled between said first memory node and said first drive transistor.

8. A semiconductor integrated circuit device according to claim 7 wherein two adjacent memory cells of said memory cell array are connected in common to said third and fourth power supplies.

9. A semiconductor integrated circuit device according to claim 7 wherein said second switch transistor is lower in threshold voltage than said first drive transistor, said second drive transistor and said first switch transistor.

10. A semiconductor integrated circuit device according to claim 7 wherein said second load transistor is smaller in size than said first load transistor and said second drive transistor.

11. A semiconductor integrated circuit device according to claim 7 wherein said second control line is parallel to said third control line and wherein a power supply line coupled to said fourth power supply and said first control line form a bitline pair of said memory cell for decoding a column address.

12. A semiconductor integrated circuit device according to claim 11 wherein said second control line is shared among a plurality of memory cells in the same column of said memory cell array.

13. A semiconductor integrated circuit device according to claim 7 wherein said memory cell is coupled, in parallel with said second drive transistor, between said second memory node and said fourth power supply and wherein said memory cell further includes a third switch transistor which is controlled by the potential at a contact point of said first switch transistor and said second switch transistor.

14. A semiconductor integrated circuit device according to claim 7 wherein said first power supply is voltage-reduced by means of a voltage reduction circuit.

15. A semiconductor integrated circuit device according to claim 14 wherein said voltage reduction circuit is a memory cell made up of transistors in conductivity-type opposition to corresponding transistors forming said memory cell of said memory cell array.

16. A semiconductor integrated circuit device according to claim 7 wherein the number of memory cells of said memory cell array coupled to said third control line is greater than the number of memory cells of said memory cell array coupled to said first and second control lines.

17. A semiconductor integrated circuit device according to claim 6,
said memory cell comprising:
(a) a first switch transistor which is serially coupled between said second memory node and said first control line and which is controlled by a third control line wherein one of source or drain electrodes of said first switch transistor is coupled to said first control line;
(b) a second switch transistor which is controlled by said second control line in which one of source or drain electrodes of said second switch transistor is coupled to said second memory node while the other of said source or drain electrodes of said second switch transistor is coupled to the other of said source or drain electrodes of said first switch transistor; and
(c) a third switch transistor which is serially coupled between said first switch transistor and said third power supply and which is controlled by said first memory node.

18. A semiconductor integrated circuit device according to claim 17 wherein two adjacent memory cells of said memory cell array are connected in common to said third and fourth power supplies.

19. A semiconductor integrated circuit device according to claim 17 wherein said first load transistor is smaller in size than said second load transistor.

20. A semiconductor integrated circuit device according to claim 17 wherein said second control line is parallel to said third control line and wherein a power supply line coupled to said fourth power supply and said first control line form a bitline pair of said memory cell for decoding a column address.

21. A semiconductor integrated circuit device according to claim 20 wherein said second control line is shared among a plurality of memory cells in the same column of said memory cell array.

22. A semiconductor integrated circuit device according to claim 17 wherein said memory cell is coupled, in parallel with said first drive transistor, between said first memory node and said third power supply and wherein said memory cell further includes a fourth switch transistor which is controlled by the potential at a contact point of said first switch transistor and said second switch transistor.

23. A semiconductor integrated circuit device according to claim 17 wherein said first power supply is voltage-reduced by means of a voltage reduction circuit.

24. A semiconductor integrated circuit device according to claim 23 wherein said voltage reduction circuit is a memory cell made up of transistors in conductivity-type opposition to corresponding transistors forming said memory cell of said memory cell array.

25. A semiconductor integrated circuit device according to claim 17 wherein the number of memory cells of said memory cell array coupled to said third control line is greater than the number of memory cells of said memory cell array coupled to said first and second control lines.

26. A semiconductor integrated circuit device according to claim 11,
wherein:
  (a) said memory cell array has a first and a second control line for the control of memory cells in said columns of said matrix, and a third control line for the control of memory cells in said rows of said matrix;
  (b) said first transistor of said memory cell is a first drive transistor with a drain electrode coupled to a first memory node and said second transistor of said memory call is a second drive transistor with a drain electrode coupled to a second memory node in complementary relationship with said first memory node;
  (c) said memory cell comprises:
    (i) a first load transistor and a second load transistor in which gate electrodes and source electrodes of said first and second transistors are cross-coupled;
      one of source or drain electrodes of said first load transistor being coupled to a first power supply;
      the other of said source or drain electrodes of said first load transistor being coupled to said first memory node;
      one of source or drain electrodes of said second load transistor being couple to said first power supply;
      the other of said source or drain electrodes of said second load transistor being coupled to said second memory node;
    (ii) a first switch transistor which is serially coupled between said first memory node and said first control line and which is controlled by a third control line wherein one of source or drain electrodes of said first switch transistor is coupled to said first control line;
    (iii) a second switch transistor which is controlled by said second control line in which one of source or drain electrodes of said second switch transistor is coupled to the other of said source or drain electrodes of said first switch transistor;
    (iv) a third switch transistor which is serially coupled between said second memory node and said second control line and which is controlled by said first memory node;
    (v) a fourth switch transistor which is controlled by said first control line;
      one of source or drain electrodes of said fourth switch transistor being coupled to one of source or drain electrodes of said third switch transistor;
      the other of said source or drain electrodes of said fourth switch transistor being coupled to said second control line;
  (d) said second switch transistor is serially coupled between said first memory node and said first drive transistor; and
  (e) said third switch transistor is serially coupled between said second memory node and said second drive transistor.

27. A semiconductor integrated circuit device according to claim 26,
said memory cell array having:
  first memory cells; and
  second memory cells;
  wherein:
    said first memory cell and said second memory cell are connected in series;
    said second memory cell is made up of transistors opposite in conductivity type to corresponding transistors forming said first memory cell;
    both said first memory cell and said second memory cell are charged to ½ of the potential of said first power supply.

28. A semiconductor integrated circuit device according to claim 26 wherein the absolute values of the threshold voltage of said first and fourth switch transistors and said first and second drive transistors are lower than the absolute values of the threshold voltage of said first and second load transistors and said second and third switch transistors.

29. A semiconductor integrated circuit device according to claim 26, wherein:
  (a) said first, second and third control lines of said memory cell are control lines dedicated to read operation;
  (b) said memory cell array has:
    (i) a fourth and a fifth control lines dedicated to write operation for memory cells in said columns of said memory call array, and a sixth control line dedicated to write operation for memory calls in said rows of said memory call array;
    (ii) a fifth switch transistor which is controlled by said sixth control line;
      one of source or drain electrodes of said fifth switch transistor being coupled to said first memory node;
      the other of said source or drain electrodes of said fifth switch transistor being coupled to said fourth control line;
    (iii) a sixth switch transistor which is controlled by said sixth control line;
      one of source or drain electrodes of said sixth switch transistor being coupled to said second memory node;
      the other of said source or drain electrodes of said sixth switch transistor being coupled to said fifth control line;
  (c) the absolute values of the threshold voltage of said first, and fourth to sixth switch transistors and said first and second drive transistors are lower than the absolute values of the-threshold voltage of said first and second load transistors and said second and third switch transistors.

* * * * *

UNITED STATES PATENT AND TRADEMARK OFFICE
CERTIFICATE OF CORRECTION

PATENT NO. : 5,812,445
DATED : September 22, 1998
INVENTOR(S) : Yamauchi

It is certified that error appears in the above-identified patent and that said Letters Patent is hereby corrected as shown below:

<u>Claim 26,</u>
Line 2, change "11" to -- 1 --.

Signed and Sealed this

Ninth Day of April, 2002

Attest:

JAMES E. ROGAN
Attesting Officer
Director of the United States Patent and Trademark Office